United States Patent
Yamaoka et al.

(10) Patent No.: US 11,283,234 B2
(45) Date of Patent: Mar. 22, 2022

(54) OPTICAL MODULE

(71) Applicant: FURUKAWA ELECTRIC CO., LTD., Tokyo (JP)

(72) Inventors: Kazuki Yamaoka, Tokyo (JP); Maiko Ariga, Tokyo (JP); Yusuke Inaba, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/986,391

(22) Filed: Aug. 6, 2020

(65) Prior Publication Data

US 2020/0366053 A1 Nov. 19, 2020

Related U.S. Application Data

(63) Continuation of application No. PCT/JP2019/005207, filed on Feb. 14, 2019.

(30) Foreign Application Priority Data

Feb. 14, 2018 (JP) .............................. JP2018-023939

(51) Int. Cl.
*H01S 5/022* (2021.01)
*H01S 5/02208* (2021.01)
*G02B 6/42* (2006.01)
*H01S 5/00* (2006.01)
(Continued)

(52) U.S. Cl.
CPC ........ *H01S 5/02208* (2013.01); *G02B 6/4204* (2013.01); *H01S 5/0064* (2013.01); *H01S 5/02234* (2021.01); *H01S 5/4012* (2013.01)

(58) Field of Classification Search
CPC ............. H01S 5/02208; H01S 5/02234; H01S 5/0064; H01S 5/4012; G02B 6/4204
See application file for complete search history.

(56) References Cited

U.S. PATENT DOCUMENTS

| 7,889,331 B2* | 2/2011 | Asami ................. H04B 10/071 356/73.1 |
| 2008/0055589 A1* | 3/2008 | Asami ................ G01M 11/3127 356/73.1 |

(Continued)

FOREIGN PATENT DOCUMENTS

| JP | 07-218778 A | 8/1995 |
| JP | 2004-279640 A | 10/2004 |

(Continued)

OTHER PUBLICATIONS

International Search Report dated May 7, 2019 in PCT/JP2019/005207 filed on Feb. 14, 2019, 2 pages.

*Primary Examiner* — Peter Radkowski
(74) *Attorney, Agent, or Firm* — Oblon, McClelland, Maier & Neustadt, L.L.P.

(57) ABSTRACT

An optical module includes: an optical component; a light receiving element receiving a laser beam through the optical component; a package housing the optical component and the light receiving unit; and a shielding portion that prevents stray light, which is generated by at least one of the laser beam and the laser beam emitted through the optical component is reflected or scattered in the package or at the optical component, from being incident on the light receiving element.

14 Claims, 46 Drawing Sheets

(51) Int. Cl.
    *H01S 5/40*       (2006.01)
    *H01S 5/02234*   (2021.01)

(56) References Cited

U.S. PATENT DOCUMENTS

| | | | |
|---|---|---|---|
| 2009/0097507 A1* | 4/2009 | Zhu | H01S 3/1312 |
| | | | 372/6 |
| 2009/0129427 A1* | 5/2009 | Ariga | H01S 5/02208 |
| | | | 372/108 |
| 2009/0232451 A1* | 9/2009 | Shibayama | H01S 5/02325 |
| | | | 385/31 |
| 2016/0277116 A1* | 9/2016 | Hasegawa | G02B 6/00 |
| 2016/0282174 A1* | 9/2016 | Hasegawa | G01J 1/0414 |

FOREIGN PATENT DOCUMENTS

| | | |
|---|---|---|
| JP | 2016-178218 A | 10/2004 |
| JP | 2005-019746 A | 1/2005 |
| JP | 2008-153639 A | 7/2008 |
| JP | 2011-209371 A | 10/2011 |
| JP | 2016-181645 A | 10/2016 |
| WO | WO 2007/135897 A1 | 11/2007 |
| WO | WO 2017/077638 A1 | 5/2017 |

\* cited by examiner

OPTICAL MODULE

CROSS-REFERENCE TO RELATED APPLICATION(S)

This application is a continuation of International Application No. PCT/JP2019/005207, filed on Feb. 14, 2019 which claims the benefit of priority of the prior Japanese Patent Application No. 2018-023939, filed in Japan on Feb. 14, 2018, the entire contents of which are incorporated herein by reference.

BACKGROUND

The present disclosure relates to an optical module.

In an optical module of a known technology in the related art, a light receiving element configured to receive a laser beam is covered by a metal component to prevent stray light generated in a package from being received by the light receiving element (refer to, for example, Japanese Laid-open Patent Publication No. 2005-19746).

In the related art, for example, in Japanese Laid-open Patent Publication No. 2005-19746, the light receiving element may need to be completely covered by the metal component to prevent stray light, and thus there has been a problem that the structure of the optical module may be complicated.

SUMMARY

There is a need for providing an optical module which can prevent stray light with a simple configuration.

According to an embodiment, an optical module includes: an optical component; a light receiving element receiving a laser beam through the optical component; a package housing the optical component and the light receiving unit; and a shielding portion that prevents stray light, which is generated by at least one of the laser beam and the laser beam emitted through the optical component is reflected or scattered in the package or at the optical component, from being incident on the light receiving element.

DETAILED DESCRIPTION OF THE PREFERRED EMBODIMENTS

Figure 1:
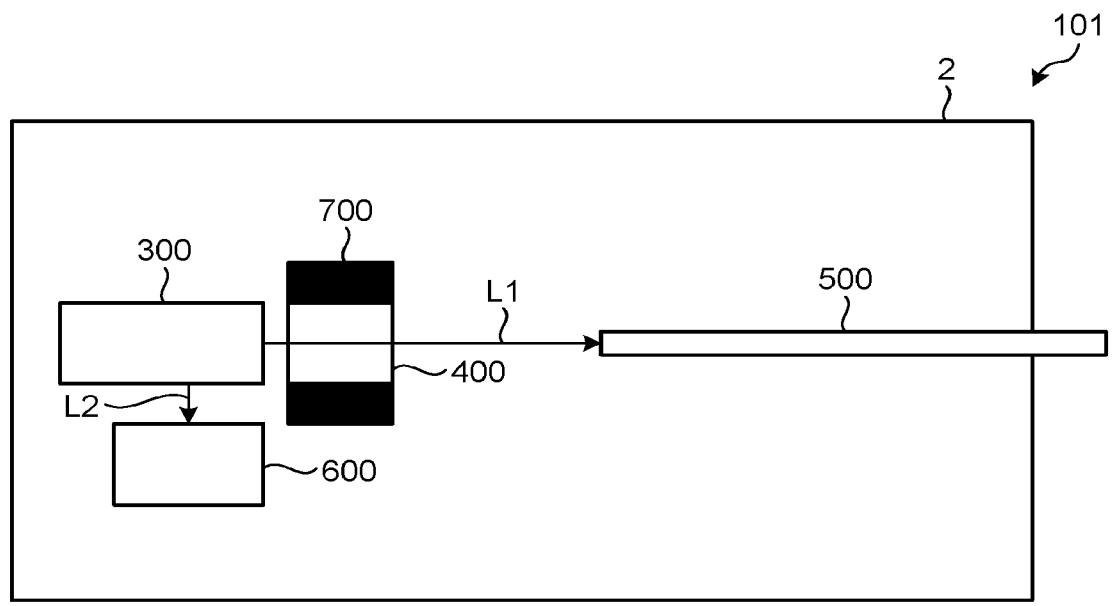
FIG. 1 is a plan view schematically illustrating the configuration of an optical module according to a first embodiment.

Embodiments will be described below with reference to the accompanying drawings. The present disclosure is not limited by the embodiments. In description of the drawings, elements identical or corresponding to each other are denoted by an identical reference sign as appropriate, and duplicate description thereof is omitted as appropriate. It should be noted that each drawing is schematically illustrated, and the dimensional relation among elements, the dimensional ratio of each element, and the like may be different from those in reality. In addition, the dimensional relation or the dimensional ratio may be different between parts included in the drawings.

First Embodiment

Configuration of Optical Module

FIG. 1 is a plan view schematically illustrating the configuration of an optical module according to a first embodiment. This optical module 101 illustrated in FIG. 1 includes a base unit 2 configured to function when mounted, a light emitting element 300, a lens 400, an optical fiber 500, a light receiving element 600, and a shielding portion 700. Each optical component of the optical module 101 is housed in a package (not illustrated) through a temperature adjuster such as a Peltier element (not illustrated). A controller (not illustrated) adjusts the temperature of the light emitting element 300 by supplying driving current to the temperature adjuster.

The base unit 2 has a rectangular shape. The light emitting element 300, the lens 400, the optical fiber 500, the light receiving element 600, and the shielding portion 700 are placed on the base unit 2. The base unit 2 is housed in the package (not illustrated) through a temperature adjuster such as a Peltier element (not illustrated). The controller (not illustrated) adjusts the temperature of the light emitting element 300 by supplying driving current to the temperature adjuster.

The light emitting element 300 emits a laser beam L1 and a laser beam L2. For example, the light emitting element 300 is formed of a semiconductor laser element. The light emitting element 300 may be a fixed-wavelength laser, a wavelength-tunable laser, may be an FP laser, a DFB laser, a DR laser, or the like, or may naturally be a monolithically integrated laser in which a plurality of lasers are connected with each other through couplers or SOA are integrated. The laser beam L1 and the laser beam L2 emitted by the light emitting element 300 each have a wavelength bandwidth of 900 to 1650 nm. The light emitting element 300 emits each of the laser beam L1 and the laser beam L2 in accordance with the driving current supplied from the controller (not illustrated). In the first embodiment, a front side is defined to be a side on which the light emitting element 300 emits the laser beam L1, and a back side is defined to be a side opposite to the front side.

The lens 400 collimates or connects the laser beam L1 emitted from the light emitting element 300 and then emits the laser beam L1 to the optical fiber 500. The lens 400 is formed of a collimate lens or a light condensation lens. In the first embodiment, the lens 400 functions as an optical component.

The laser beam L1 collimated or connected through the lens 400 propagates through the optical fiber 500.

The light receiving element 600 is formed of a photodiode. The light receiving element 600 receives the laser beam L2 emitted from the light emitting element 300 and emits a current signal in accordance with the power of the received laser beam to the controller (not illustrated). The controller (not illustrated) controls the driving current to be supplied to the light emitting element 300 based on the current signal received from the light receiving element 600. For example, the controller (not illustrated) controls the driving current to be supplied to the light emitting element 300 so that the current signal received from the light receiving element 600 has a constant value. Accordingly, the controller (not illustrated) can control the optical power to be constant.

The shielding portion 700 prevents stray light generated through reflection or scattering in the base unit 2 from being incident on the light receiving element 600. The shielding portion 700 is formed of any of a light reflecting body that reflects stray light, a light scattering body that scatters stray light, and a light absorbing body that absorbs light. Specifically, the shielding portion 700 has a shielding property and is made of resin used as a bonding agent for joining optical components in the base unit 2. This resin preferably contains filler particles. In this case, the size of each filler particle is 0.1 to 500 μm. The shielding portion 700 is disposed by applying the resin on a side surface of the lens 400 disposed at a position nearest to the light emitting element 300 on the optical path of the laser beam L1 emitted from the light receiving element 600. Specifically, the shielding portion 700 is disposed by applying the resin on a side surface and an upper surface of the lens 400, which are not on the optical path of the laser beam L1 input to the lens 400.

According to the first embodiment described above, since the shielding portion 700 is provided to the lens 400, it is possible to prevent, with a simple configuration, stray light generated through reflection or scattering at the lens 400 from being incident on the light receiving element 600.

In addition, according to the first embodiment, since the shielding portion 700 is formed by applying resin as a bonding agent to the lens 400, it is possible to prevent, with a simple configuration, stray light from being incident on the light receiving element 600.

First Modification of First Embodiment

Figure 2:
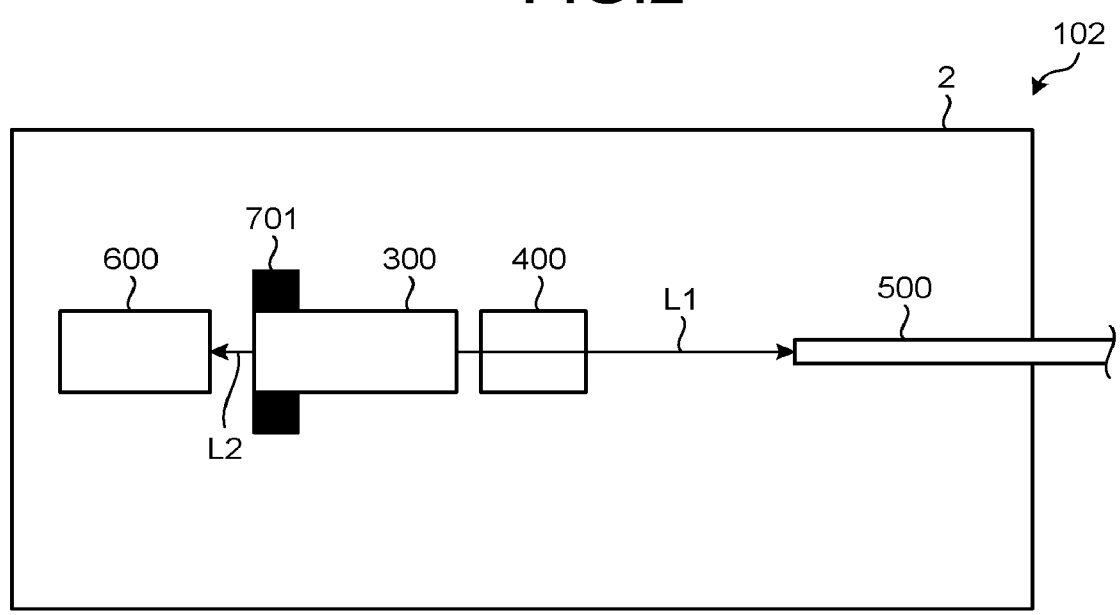
FIG. 2 is a plan view schematically illustrating the configuration of an optical module according to a first modification of the first embodiment.

Subsequently, a first modification of the first embodiment will be described below. FIG. 2 is a plan view schematically illustrating the configuration of an optical module according to the first modification of the first embodiment. This optical module 102 illustrated in FIG. 2 includes a shielding portion 701 in place of the shielding portion 700 in the first embodiment described above.

The shielding portion 701 prevents stray light generated through reflection or scattering in the base unit 2 from being incident on the light receiving element 600. The shielding portion 701 is formed of any of a light reflecting body that reflects stray light, a light scattering body that scatters stray light, and a light absorbing body that absorbs light. The shielding portion 701 is disposed by applying resin on part of the light emitting element 300. Specifically, the shielding portion 701 is disposed by applying resin on a side surface of the light emitting element 300 on the back side on which the light emitting element 300 emits the laser beam L2.

According to the first modification of the first embodiment described above, since the shielding portion 701 is disposed through application on the back side of the light emitting element 300, it is possible to prevent, with a simple configuration, stray light from the light emitting element 300 from being incident on the light receiving element 600.

Second Modification of First Embodiment

Figure 3:
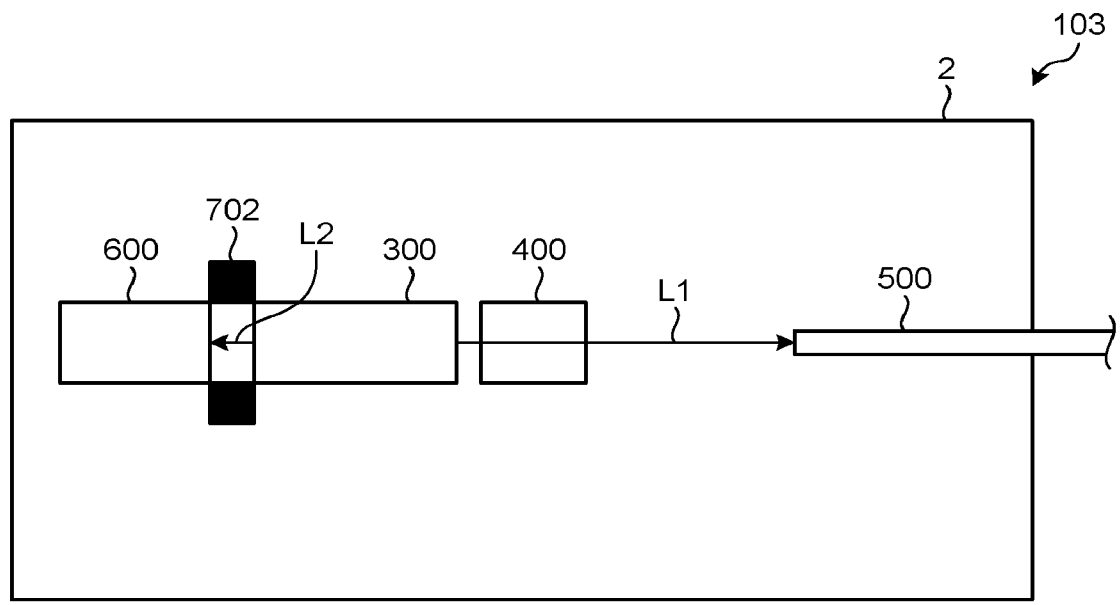
FIG. 3 is a plan view schematically illustrating the configuration of an optical module according to a second modification of the first embodiment.

Subsequently, a second modification of the first embodiment will be described below. FIG. 3 is a plan view schematically illustrating the configuration of an optical module according to the second modification of the first embodiment. This optical module 103 illustrated in FIG. 3 includes a shielding portion 702 in place of the shielding portion 700 described above.

The shielding portion 702 prevents stray light generated through reflection or scattering in the base unit 2 from being incident on the light receiving element 600. The shielding portion 702 is formed of any of a light reflecting body that reflects stray light, a light scattering body that scatters stray light, and a light absorbing body that absorbs light. Specifically, the shielding portion 702 is formed into a wall shape by applying and upraising resin outside both edges of the optical path of the laser beam L2 emitted from the light emitting element 300. Specifically, the shielding portion 702 is disposed through formation into a wall shape by applying and upraising resin on the base unit 2 in the interval (gap) between the light emitting element 300 and the light receiving element 600 except for the optical path of the laser beam L2.

According to the second modification of the first embodiment described above, since the shielding portion 702 is disposed through formation into a wall shape by applying and upraising resin on the base unit 2 in the interval between the light emitting element 300 and the light receiving element 600 and except for the optical path of the laser beam L2, it is possible to prevent, with a simple configuration, stray light generated when the laser beams L1 and L2 emitted from the light emitting element 300 are reflected or scattered at the package (not illustrated) or the like from being incident on the light receiving element 600.

Second Embodiment

Figure 4:
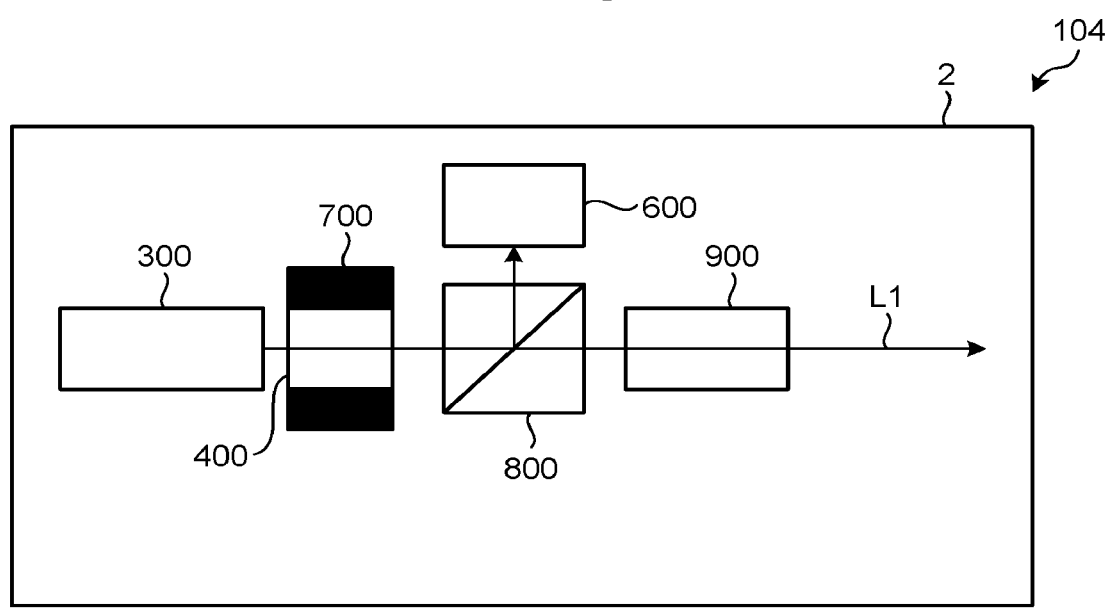
FIG. 4 is a plan view schematically illustrating the configuration of an optical module according to a second embodiment.

Subsequently, a second embodiment will be described below. FIG. 4 is a plan view schematically illustrating the configuration of an optical module according to the second embodiment. This optical module 104 illustrated in FIG. 4 includes a beam splitter 800 and an optical isolator 900 in addition to the configuration of the first embodiment described above. In FIG. 4, the optical fiber 500 described above is attached to the base unit 2 on the front side, and thus detailed description thereof will be omitted.

The beam splitter 800 divides the laser beam L1 incident from the lens 400 by reflecting part thereof toward the light receiving element 600 and transmitting the remaining part of the laser beam L1 to the optical isolator 900.

The optical isolator 900 transmits, toward the optical fiber 500 (not illustrated), the laser beam L1 having transmitted through the beam splitter 800 but shields light incident from the optical fiber 500 (not illustrated).

According to the second embodiment described above, since the shielding portion 700 is provided to the lens 400, it is possible to prevent, with a simple configuration, stray light generated through reflection or scattering at the lens 400 from being incident on the light receiving element 600.

First Modification of Second Embodiment

Figure 5:
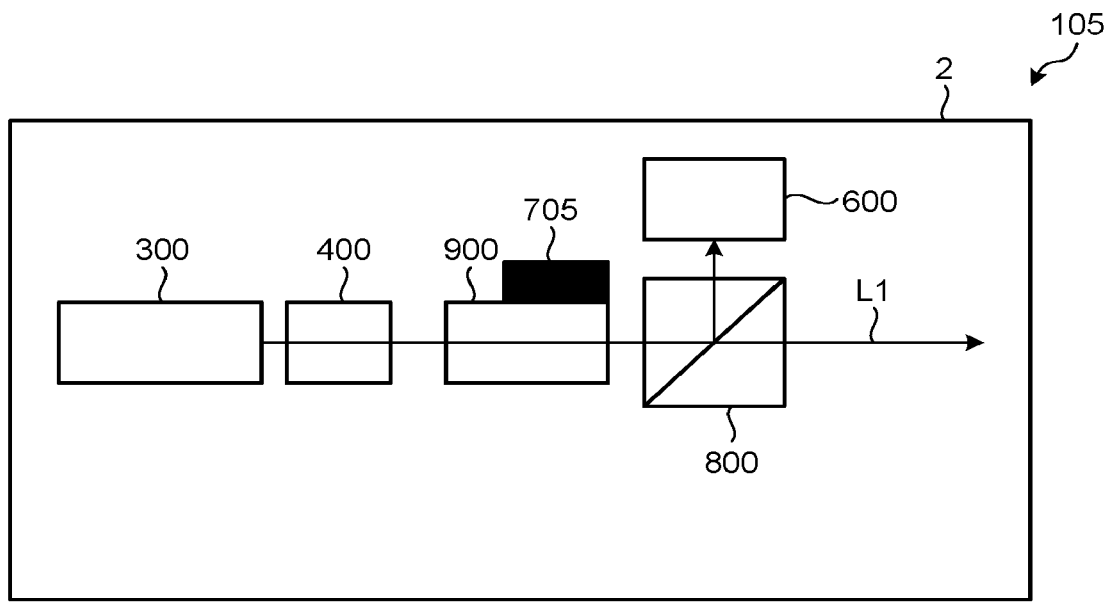
FIG. 5 is a plan view schematically illustrating the configuration of an optical module according to a first modification of the second embodiment.

Subsequently, a first modification of the second embodiment will be described below. FIG. 5 is a plan view schematically illustrating the configuration of an optical module according to the first modification of the second embodiment. This optical module 105 illustrated in FIG. 5 includes a shielding portion 705 in place of the shielding portion 700 in the second embodiment described above. In addition, the optical isolator 900 described above is disposed between the lens 400 and the beam splitter 800.

The shielding portion 705 prevents stray light generated through reflection or scattering in the base unit 2 from being incident on the light receiving element 600. The shielding portion 705 is formed of any of a light reflecting body that reflects stray light, a light scattering body that scatters stray light, and a light absorbing body that absorbs light. The shielding portion 705 is disposed by applying resin on a side surface of the optical isolator 900. Specifically, the shielding portion 705 is disposed through application on a side surface of the optical isolator 900 so that the shielding portion 705 is positioned on a straight line connecting the light emitting element 300 and the light receiving element 600.

According to the first modification of the second embodiment described above, since the shielding portion 705 is disposed by applying resin on a side surface of the optical isolator 900 so that the shielding portion 705 is positioned on a straight line connecting the light emitting element 300 and the light receiving element 600, it is possible to prevent, with a simple configuration, stray light from the light emitting element 300 from being incident on the light receiving element 600.

Second Modification of Second Embodiment

Figure 6:
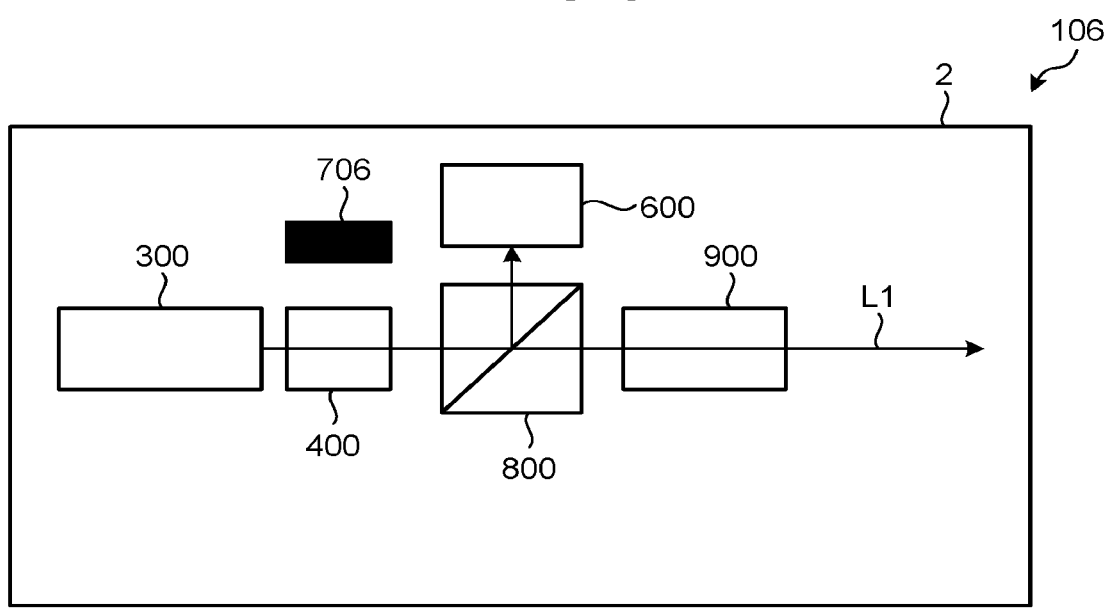
FIG. 6 is a plan view schematically illustrating the configuration of an optical module according to a second modification of the second embodiment.

Subsequently, a second modification of the second embodiment will be described below. FIG. 6 is a plan view schematically illustrating the configuration of an optical module according to the second modification of the second embodiment. This optical module 106 illustrated in FIG. 6 includes a shielding portion 706 in place of the shielding portion 700 in the second embodiment described above.

The shielding portion 706 prevents stray light generated through reflection or scattering in the base unit 2 from being incident on the light receiving element 600. The shielding portion 706 is formed of any of a light reflecting body that reflects stray light, a light scattering body that scatters stray light, and a light absorbing body that absorbs light. The shielding portion 706 is disposed through formation into a wall shape or a protrusion by applying and upraising resin on the base unit 2 positioned on a straight line connecting the light emitting element 300 and the light receiving element 600.

According to the second modification of the second embodiment described above, since the shielding portion 706 is disposed through formation by applying and upraising resin on the base unit 2 positioned on a straight line connecting the light emitting element 300 and the light receiving element 600, it is possible to prevent, with a simple configuration, stray light from the light emitting element 300 from being incident on the light receiving element 600.

Third Modification of Second Embodiment

Figure 7:
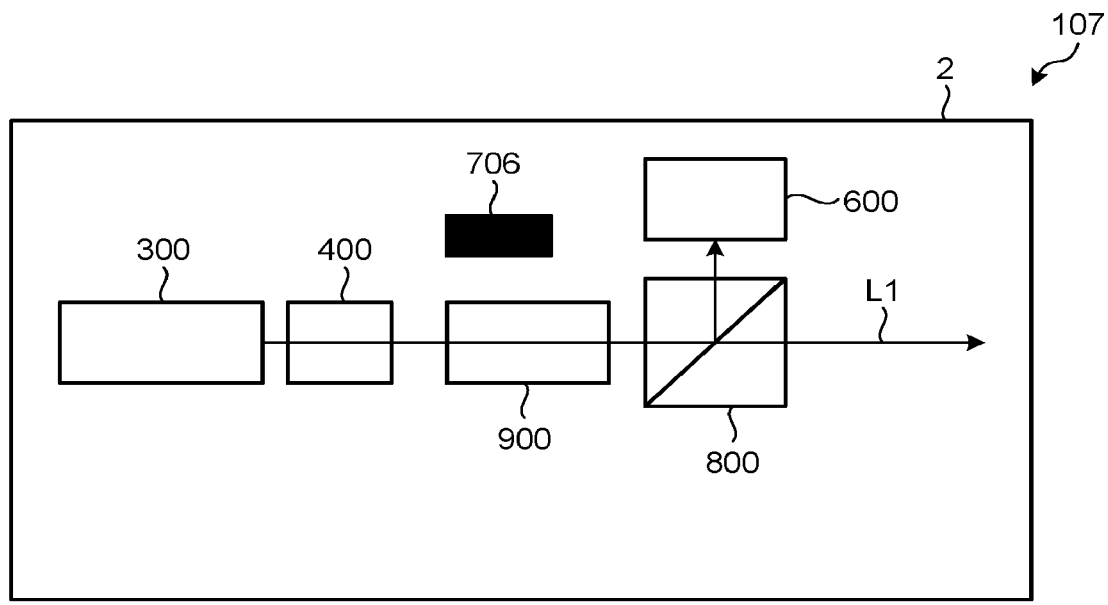
FIG. 7 is a plan view schematically illustrating the configuration of an optical module according to a third modification of the second embodiment.

Subsequently, a third modification of the second embodiment will be described below. FIG. 7 is a plan view schematically illustrating the configuration of an optical module according to the third modification of the second embodiment. In an optical module 107 illustrated in FIG. 7, disposition of the beam splitter 800 and the optical isolator 900 is different from that in the second modification of the second embodiment described above, and the optical isolator 900 and the beam splitter 800 are disposed in the base unit 2 in the stated order.

According to the third modification of the second embodiment described above, since the shielding portion 706 is disposed through formation by applying and upraising resin on the base unit 2 positioned on a straight line connecting the light emitting element 300 and the light receiving element 600, it is possible to prevent, with a simple configuration, stray light from the light emitting element 300 from being incident on the light receiving element 600.

Third Embodiment

Figure 8:
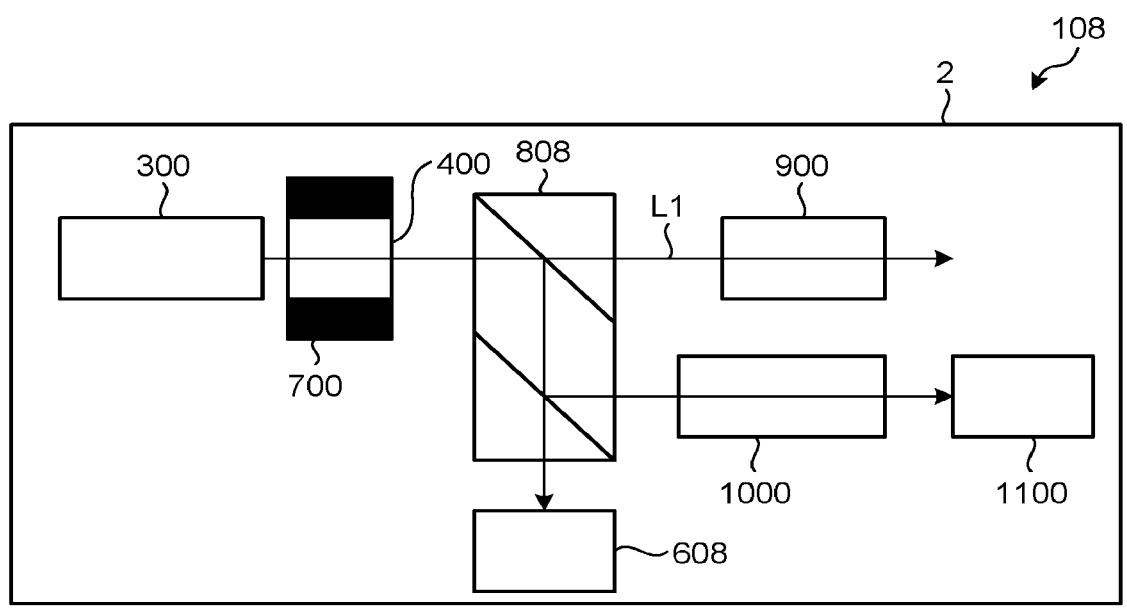
FIG. 8 is a plan view schematically illustrating the configuration of an optical module according to a third embodiment.

Subsequently, a third embodiment will be described below. FIG. 8 is a plan view schematically illustrating the configuration of an optical module according to the third embodiment. This optical module 108 illustrated in FIG. 8 includes a light receiving element 608 in place of the light receiving element 600 of the optical module 101 according to the first embodiment described above. In addition, the optical module 108 includes a beam splitter 808, the optical isolator 900, an etalon filter 1000, and a light receiving element 1100 in addition to the configuration of the optical module 101 according to the first embodiment described above.

The light receiving element 608 is formed of a photodiode. The light receiving element 608 receives the laser beam L1 incident through the beam splitter 808 and emits a current signal in accordance with the power of the received laser beam to the controller (not illustrated).

The beam splitter 808 divides the laser beam L1 incident from the lens 400 by reflecting part thereof toward each of the light receiving element 608 and the etalon filter 1000 and transmitting the remaining part of the laser beam L1 to the optical isolator 900.

The etalon filter 1000 has a periodic transmission characteristic for the wavelength of light. The etalon filter 1000 transmits, to the light receiving element 1100, the laser beam L1 incident from the beam splitter 808.

The light receiving element 1100 is formed of a photodiode. The light receiving element 1100 receives the laser beam L1 having transmitted through the etalon filter 1000 and emits a current signal in accordance with the power of the received laser beam to the controller (not illustrated).

The controller (not illustrated) specifies the wavelength of the laser beam L1 by measuring an intensity ratio of the intensity of light not having transmitted through the etalon filter 1000 and the intensity of light having transmitted through the etalon filter 1000 based on the two current signals incident from the light receiving element 608 and the light receiving element 1100.

According to the third embodiment described above, since the shielding portion 700 is provided to the lens 400, it is possible to prevent, with a simple configuration, stray light generated through reflection or scattering at the lens 400 from being incident on the light receiving element 608 and the light receiving element 1100.

First Modification of Third Embodiment

Figure 9:
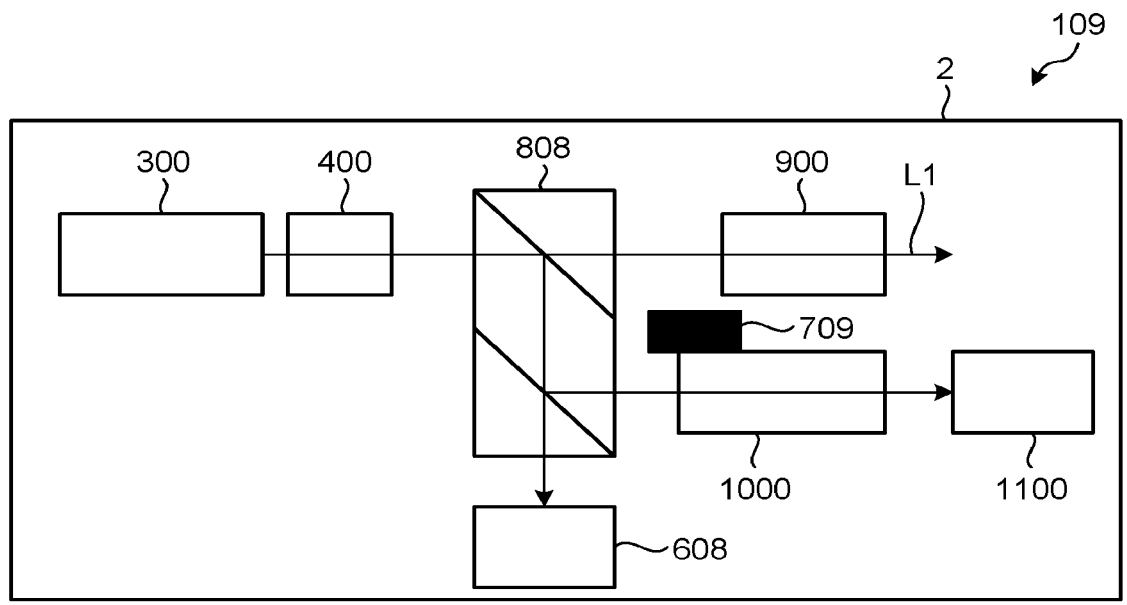
FIG. 9 is a plan view schematically illustrating the configuration of an optical module according to a first modification of the third embodiment.

Subsequently, a first modification of the third embodiment will be described below. FIG. 9 is a plan view schematically illustrating the configuration of an optical module according to the first modification of the third embodiment. This optical module 109 illustrated in FIG. 9 includes a shielding portion 709 in place of the shielding portion 700 of the optical module 108 according to the third embodiment described above.

The shielding portion 709 prevents stray light generated through reflection or scattering in the base unit 2 from being incident on the light receiving element 608 and the light receiving element 1100. The shielding portion 709 is formed of any of a light reflecting body that reflects stray light, a light scattering body that scatters stray light, and a light absorbing body that absorbs light. The shielding portion 709 is disposed by applying resin on part of the etalon filter 1000. Specifically, the shielding portion 709 is disposed by applying resin on a side surface of the etalon filter 1000 on a straight line connecting the optical isolator 900 and the light receiving element 608.

According to the first modification of the third embodiment described above, since the shielding portion 709 is disposed by applying resin on a side surface of the etalon filter 1000 on a straight line connecting the optical isolator 900 and the light receiving element 608, it is possible to prevent, with a simple configuration, stray light from being incident on the light receiving element 608 and the light receiving element 1100.

Second Modification of Third Embodiment

Figure 10:
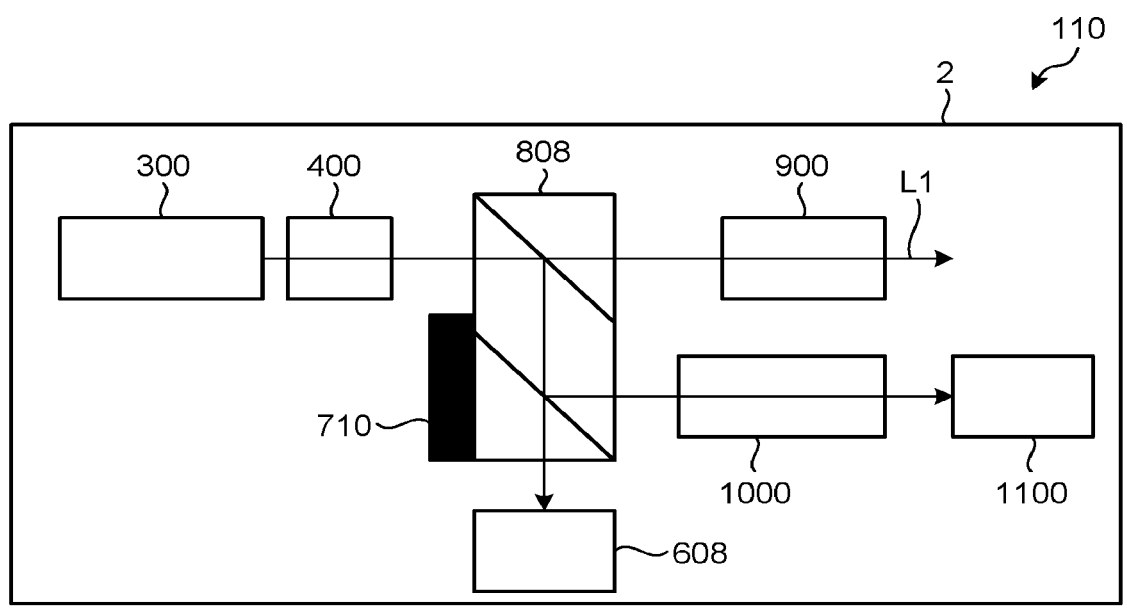
FIG. 10 is a plan view schematically illustrating the configuration of an optical module according to a second modification of the third embodiment.

Subsequently, a second modification of the third embodiment will be described below. FIG. 10 is a plan view schematically illustrating the configuration of an optical module according to the second modification of the third embodiment. This optical module 110 illustrated in FIG. 10 includes a shielding portion 710 in place of the shielding portion 700 of the optical module 108 according to the third embodiment described above.

The shielding portion 710 prevents stray light generated through reflection or scattering in the base unit 2 from being incident on the light receiving element 608 and the light receiving element 1100. The shielding portion 710 is formed of any of a light reflecting body that reflects stray light, a light scattering body that scatters stray light, and a light absorbing body that absorbs light. The shielding portion 710 is disposed by applying resin on part of the beam splitter 808. Specifically, the shielding portion 710 is disposed by applying resin on a side surface of the beam splitter 808 on a straight line connecting the light emitting element 300 and the light receiving element 608.

According to the second modification of the third embodiment described above, since the shielding portion 710 is disposed by applying resin on a side surface of the beam splitter 808 on a straight line connecting the light emitting element 300 and the light receiving element 608, it is possible to prevent, with a simple configuration, stray light from being incident on the light receiving element 608 and the light receiving element 1100.

Third Modification of Third Embodiment

Figure 11:
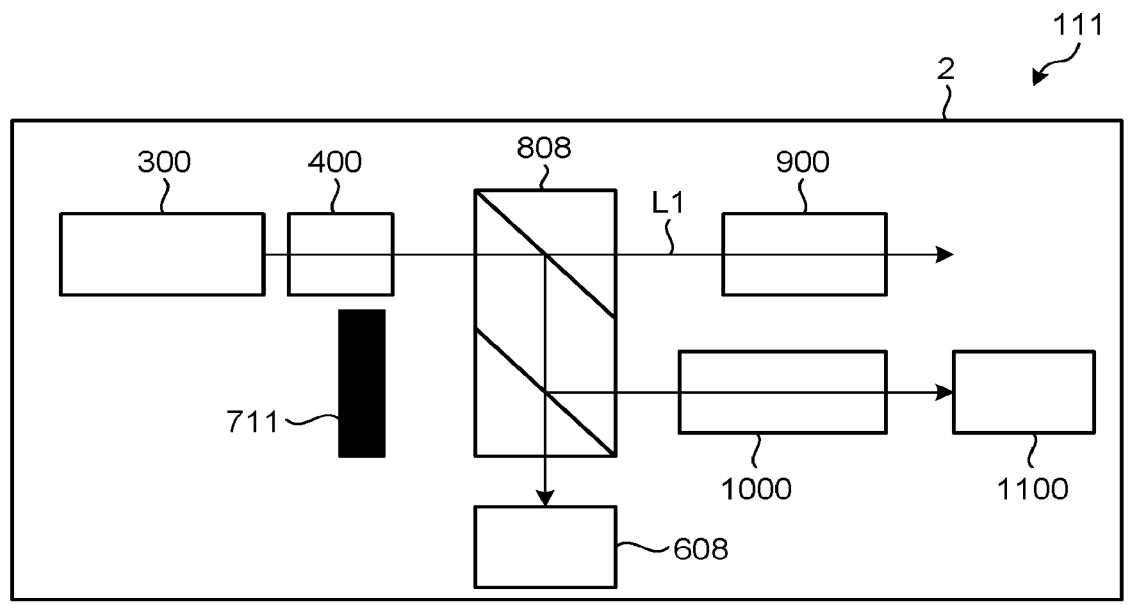
FIG. 11 is a plan view schematically illustrating the configuration of an optical module according to a third modification of the third embodiment.

Subsequently, a third modification of the third embodiment will be described below. FIG. 11 is a plan view schematically illustrating the configuration of an optical module according to the third modification of the third embodiment. This optical module 111 illustrated in FIG. 11 includes a shielding portion 711 in place of the shielding portion 700 of the optical module 108 according to the third embodiment described above.

The shielding portion 711 prevents stray light generated through reflection or scattering in the base unit 2 from being incident on the light receiving element 608 and the light receiving element 1100. The shielding portion 711 is formed of any of a light reflecting body that reflects stray light, a light scattering body that scatters stray light, and a light absorbing body that absorbs light. The shielding portion 711 is disposed through formation into a wall shape or a protrusion shape by applying and upraising resin on the base unit 2 on a straight line connecting the light emitting element 300 and the light receiving element 608.

According to the third modification of the third embodiment described above, since the shielding portion 711 is disposed through formation into a wall shape by applying and upraising resin on the base unit 2 on a straight line connecting the light emitting element 300 and the light receiving element 608, it is possible to prevent, with a simple configuration, stray light from being incident on the light receiving element 608 and the light receiving element 1100.

Fourth Embodiment

Figure 12:
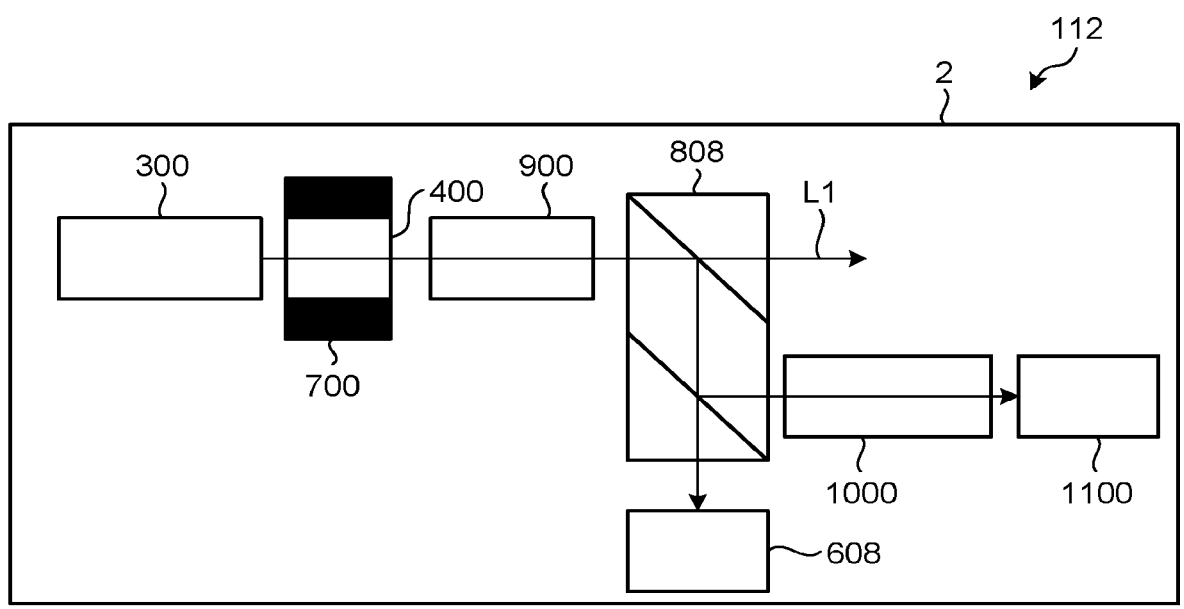
FIG. 12 is a plan view schematically illustrating the configuration of an optical module according to a fourth embodiment.

Subsequently, a fourth embodiment will be described below. FIG. 12 is a plan view schematically illustrating the configuration of an optical module according to the fourth embodiment. This optical module 112 illustrated in FIG. 12 has a configuration same as that of the third embodiment described above but disposition of each optical component is different. Specifically, in the optical module 112, the optical isolator 900 is provided between the lens 400 and the beam splitter 808.

According to the fourth embodiment described above, since the shielding portion 700 is provided to the lens 400, it is possible to prevent, with a simple configuration, stray light generated through reflection or scattering at the lens 400 from being incident on the light receiving element 608 and the light receiving element 1100.

First Modification of Fourth Embodiment

Figure 13:
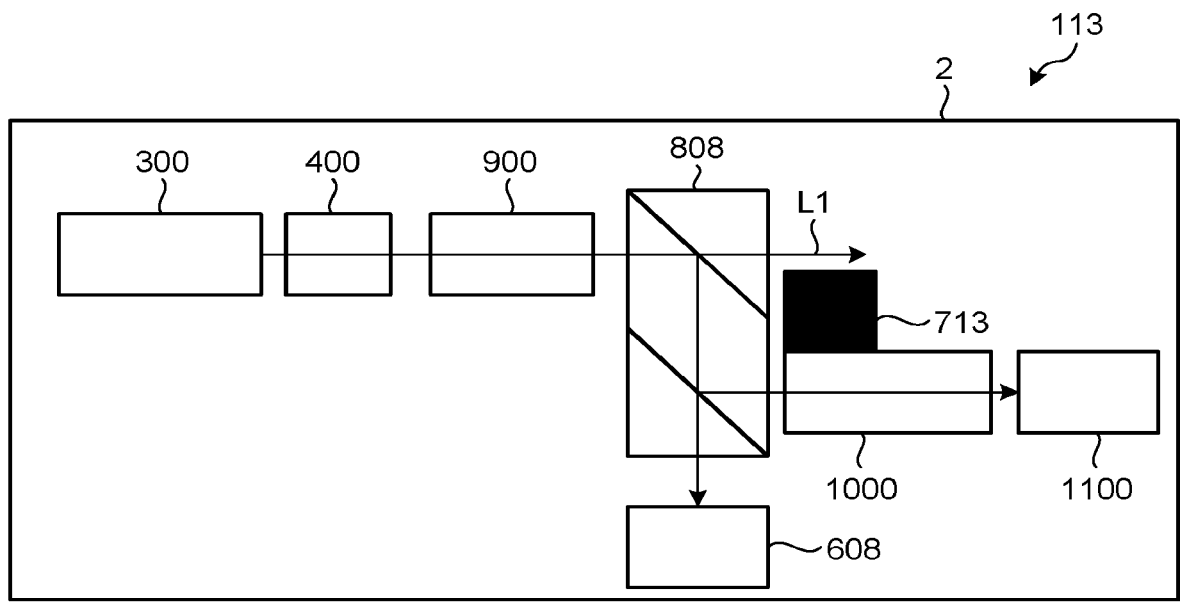
FIG. 13 is a plan view schematically illustrating the configuration of an optical module according to a first modification of the fourth embodiment.

Subsequently, a first modification of the fourth embodiment will be described below. FIG. 13 is a plan view schematically illustrating the configuration of an optical module according to the first modification of the fourth embodiment. This optical module 113 illustrated in FIG. 13 includes a shielding portion 713 in place of the shielding portion 700 of the optical module 112 according to the fourth embodiment described above.

The shielding portion 713 prevents stray light generated through reflection or scattering in the base unit 2 from being incident on the light receiving element 608 and the light receiving element 1100. The shielding portion 713 is formed of any of a light reflecting body that reflects stray light, a light scattering body that scatters stray light, and a light absorbing body that absorbs light. The shielding portion 713 is disposed by applying resin on part of the etalon filter 1000. Specifically, the shielding portion 713 is disposed by applying resin on a side surface of the etalon filter 1000 on a straight line connecting the lens 400 and the light receiving element 1100.

According to the first modification of the fourth embodiment described above, since the shielding portion 713 is disposed by applying resin on a side surface of the etalon filter 1000 on a straight line connecting the lens 400 and the light receiving element 1100, it is possible to prevent, with a simple configuration, stray light from being incident on the light receiving element 1100.

Second Modification of Fourth Embodiment

Figure 14:
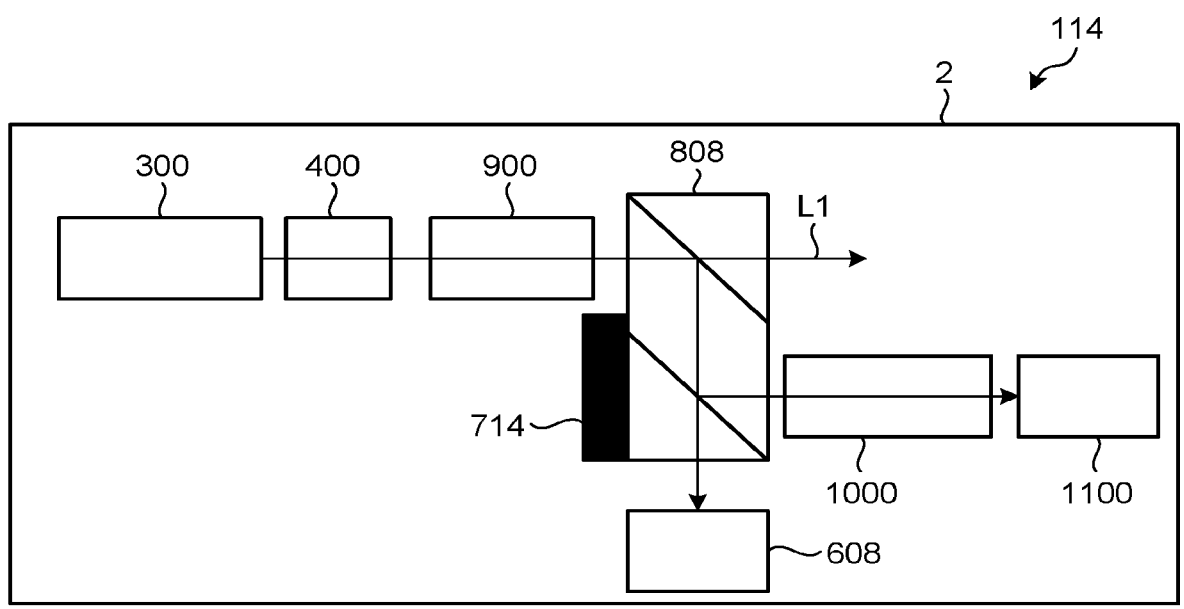
FIG. 14 is a plan view schematically illustrating the configuration of an optical module according to a second modification of the fourth embodiment.

Subsequently, a second modification of the fourth embodiment will be described below. FIG. 14 is a plan view schematically illustrating the configuration of an optical module according to the second modification of the fourth embodiment. This optical module 114 illustrated in FIG. 14 includes a shielding portion 714 in place of the shielding portion 700 of the optical module 112 according to the fourth embodiment described above.

The shielding portion 714 prevents stray light generated through reflection or scattering in the base unit 2 from being incident on the light receiving element 608. The shielding portion 714 is formed of any of a light reflecting body that reflects stray light, a light scattering body that scatters stray light, and a light absorbing body that absorbs light. The shielding portion 714 is disposed by applying resin on a side surface of the beam splitter 808. Specifically, the shielding portion 714 is disposed by applying resin on a side surface of the beam splitter 808 on a straight line connecting the lens 400 and the light receiving element 608.

According to the second modification of the fourth embodiment described above, since the shielding portion 714 is disposed by applying resin on a side surface of the beam splitter 808 on a straight line connecting the lens 400 and the light receiving element 608, it is possible to prevent, with a simple configuration, stray light from being incident on the light receiving element 608.

Third Modification of Fourth Embodiment

Figure 15:
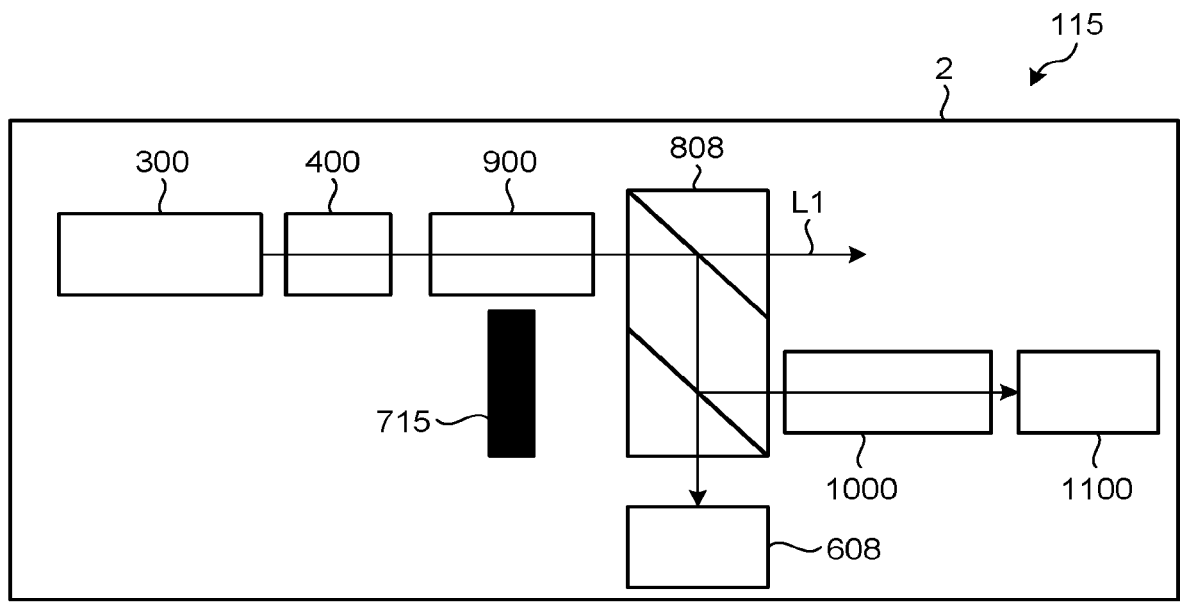
FIG. 15 is a plan view schematically illustrating the configuration of an optical module according to a third modification of the fourth embodiment.

Subsequently, a third modification of the fourth embodiment will be described below. FIG. 15 is a plan view schematically illustrating the configuration of an optical module according to the third modification of the fourth embodiment. This optical module 115 illustrated in FIG. 15 includes a shielding portion 715 in place of the shielding portion 700 of the optical module 112 according to the fourth embodiment described above.

The shielding portion 715 prevents stray light generated through reflection or scattering in the base unit 2 from being incident on the light receiving element 608. The shielding portion 715 is formed of any of a light reflecting body that reflects stray light, a light scattering body that scatters stray light, and a light absorbing body that absorbs light. The shielding portion 715 is disposed through formation into a wall shape or a protrusion by applying and upraising resin on the base unit 2 on a straight line connecting the light emitting element 300 and the light receiving element 608.

According to the third modification of the fourth embodiment described above, since the shielding portion 715 is disposed through formation into a wall shape or a protrusion by applying and upraising resin on the base unit 2 on a straight line connecting the light emitting element 300 and the light receiving element 608, it is possible to prevent, with a simple configuration, stray light from being incident on the light receiving element 608.

Fifth Embodiment

Figure 16:
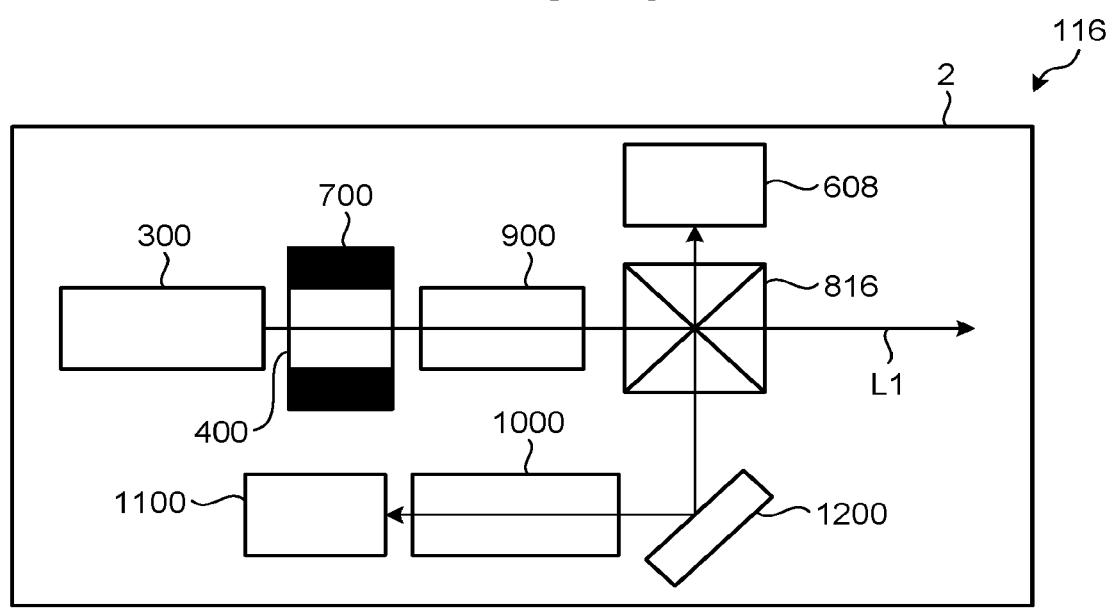
FIG. 16 is a plan view schematically illustrating the configuration of an optical module according to a fifth embodiment.

Subsequently, a fifth embodiment will be described below. FIG. 16 is a plan view schematically illustrating the configuration of an optical module according to the fifth embodiment. This optical module 116 illustrated in FIG. 16 includes a beam splitter 816 in place of the beam splitter 808 of the optical module 112 according to the fourth embodiment described above. In addition, the optical module 116 further includes a reflection component 1200.

The beam splitter 816 reflects the laser beam L1 incident from the optical isolator 900 to each of the light receiving element 608 and the reflection component 1200 and transmits the remaining part of the laser beam L1.

The reflection component 1200 is formed of a mirror or the like and reflects, to the etalon filter 1000, the laser beam L1 reflected by the beam splitter 816.

According to the fifth embodiment described above, since the shielding portion 700 is provided to the lens 400, it is possible to prevent, with a simple configuration, stray light generated through reflection or scattering at the lens 400 from being incident on the light receiving element 608 and the light receiving element 1100.

First Modification of Fifth Embodiment

Figure 17:
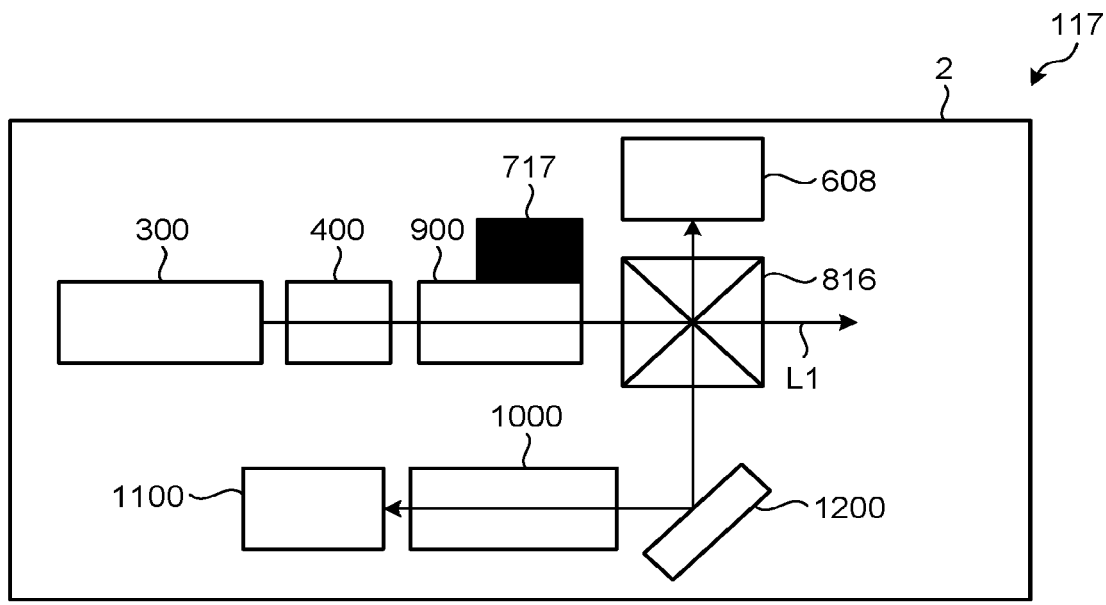
FIG. 17 is a plan view schematically illustrating the configuration of an optical module according to a first modification of the fifth embodiment.

Subsequently, a first modification of the fifth embodiment will be described below. FIG. 17 is a plan view schematically illustrating the configuration of an optical module according to the first modification of the fifth embodiment. This optical module 117 illustrated in FIG. 17 includes a shielding portion 717 according to the first modification of the second embodiment described above in place of the shielding portion 700 of the optical module 116 according to the fifth embodiment described above.

The shielding portion 717 prevents stray light generated through reflection or scattering in the base unit 2 from being incident on the light receiving element 608. The shielding portion 717 is formed of any of a light reflecting body that reflects stray light, a light scattering body that scatters stray light, and a light absorbing body that absorbs light. The shielding portion 717 is disposed by applying resin on a side surface of the optical isolator 900 so that the shielding portion 717 is positioned on a straight line connecting the light emitting element 300 and the light receiving element 608.

According to the first modification of the fifth embodiment described above, since the shielding portion 717 is disposed by applying resin on a side surface of the optical isolator 900 so that the shielding portion 717 is positioned on a straight line connecting the light emitting element 300 and the light receiving element 608, it is possible to prevent, with a simple configuration, stray light from the light emitting element 300.

Second Modification of Fifth Embodiment

Figure 18:
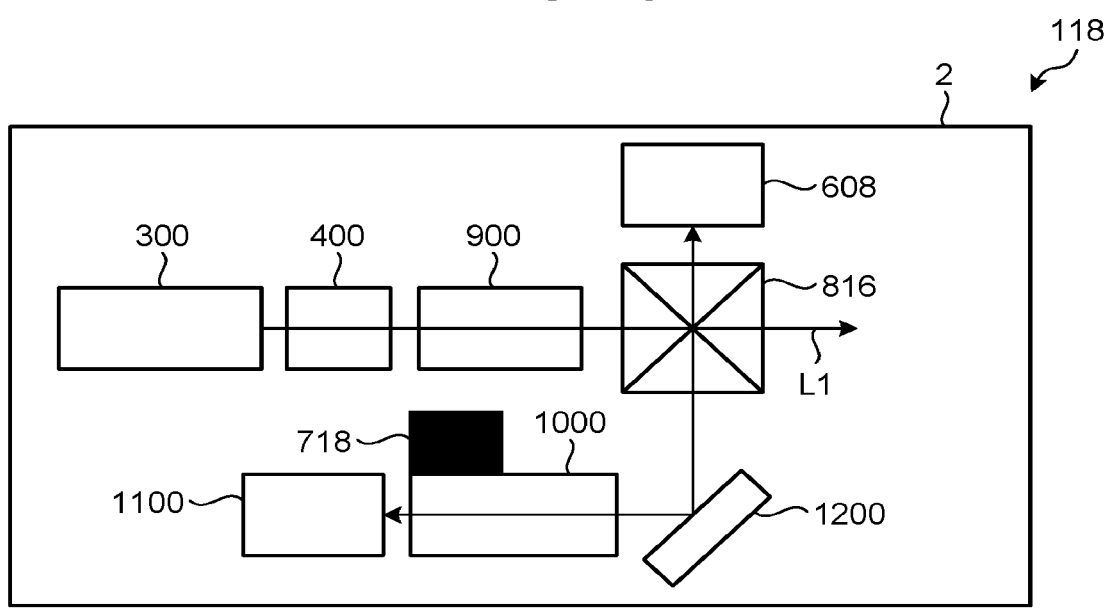
FIG. 18 is a plan view schematically illustrating the configuration of an optical module according to a second modification of the fifth embodiment.

Subsequently, a second modification of the fifth embodiment will be described below. FIG. 18 is a plan view schematically illustrating the configuration of an optical module according to the second modification of the fifth embodiment. This optical module 118 illustrated in FIG. 18 includes a shielding portion 718 in place of the shielding portion 700 of the optical module 116 according to the fifth embodiment described above.

The shielding portion 718 prevents stray light generated through reflection or scattering in the base unit 2 from being incident on the light receiving element 1100. The shielding portion 718 is formed of any of a light reflecting body that reflects stray light, a light scattering body that scatters stray light, and a light absorbing body that absorbs light. The shielding portion 718 is disposed by applying resin on part of the etalon filter 1000. Specifically, the shielding portion 718 is disposed by applying resin on a sidewall of the etalon filter 1000 on a straight line connecting the light emitting element 300 and the etalon filter 1000.

According to the second modification of the fifth embodiment described above, since the shielding portion 718 is disposed by applying resin on a sidewall of the etalon filter 1000 on a straight line connecting the light emitting element 300 and the etalon filter 1000, it is possible to prevent, with a simple configuration, stray light from being incident on the light receiving element 1100.

Third Modification of Fifth Embodiment

Figure 19:
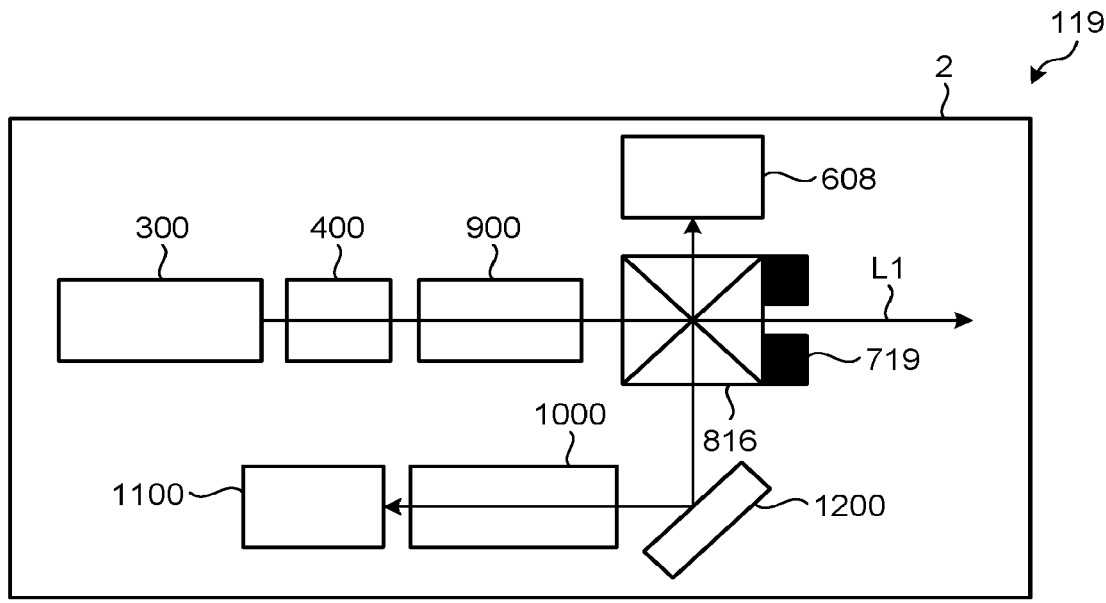
FIG. 19 is a plan view schematically illustrating the configuration of an optical module according to a third modification of the fifth embodiment.

Subsequently, a third modification of the fifth embodiment will be described below. FIG. 19 is a plan view schematically illustrating the configuration of an optical module according to the third modification of the fifth embodiment. This optical module 119 illustrated in FIG. 19 includes a shielding portion 719 in place of the shielding portion 700 of the optical module 116 according to the fifth embodiment described above.

The shielding portion 719 prevents stray light generated through reflection or scattering in the base unit 2 from being incident on the light receiving element 608. The shielding portion 719 is formed of any of a light reflecting body that reflects stray light, a light scattering body that scatters stray light, and a light absorbing body that absorbs light. The shielding portion 719 is formed through application to part of the beam splitter 816. Specifically, the shielding portion 719 is disposed by applying resin on a region in the beam splitter 816 except for the optical path of the laser beam L1.

According to the third modification of the fifth embodiment described above, since the shielding portion 719 is disposed by applying resin on a region in the beam splitter 816 except for the optical path of the laser beam L1, it is possible to prevent, with a simple configuration, stray light from being incident on the light receiving element 608 and the light receiving element 1100.

Fourth Modification of Fifth Embodiment

Figure 20:
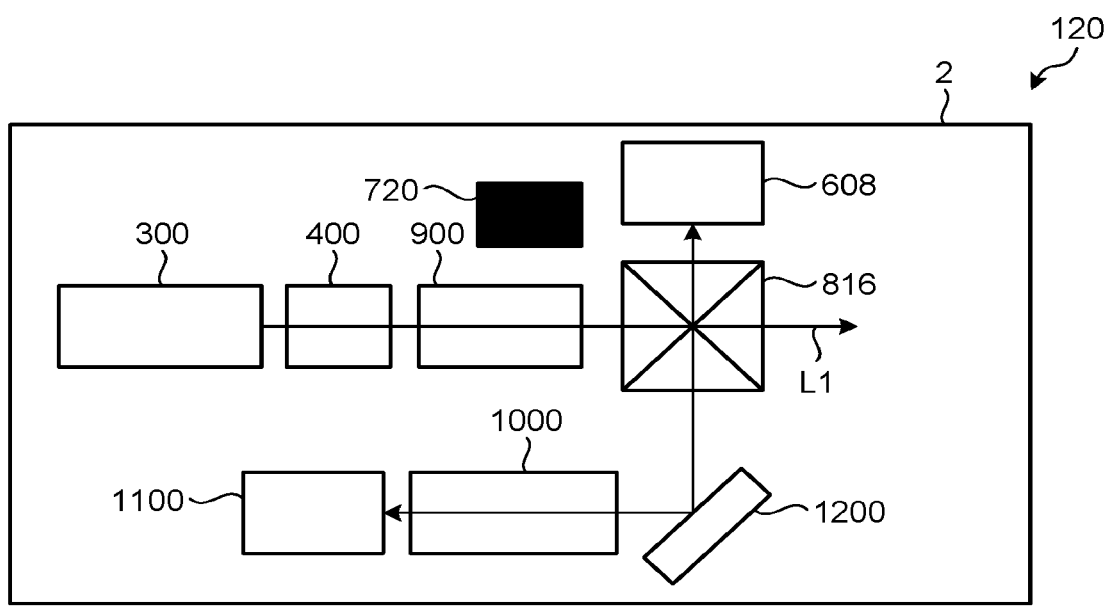
FIG. 20 is a plan view schematically illustrating the configuration of an optical module according to a fourth modification of the fifth embodiment.

Subsequently, a fourth modification of the fifth embodiment will be described below. FIG. 20 is a plan view schematically illustrating the configuration of an optical module according to the fourth modification of the fifth embodiment. This optical module 120 illustrated in FIG. 20 includes a shielding portion 720 in place of the shielding portion 700 of the optical module 116 according to the fifth embodiment described above.

The shielding portion 720 prevents stray light generated through reflection or scattering in the base unit 2 from being incident on the light receiving element 608. The shielding portion 720 is formed of any of a light reflecting body that reflects stray light, a light scattering body that scatters stray light, and a light absorbing body that absorbs light. The shielding portion 720 is disposed through formation into a wall shape by applying and upraising resin on the base unit 2 on a straight line connecting the lens 400 and the light receiving element 608.

According to the fourth modification of the fifth embodiment described above, since the shielding portion 720 is disposed through formation into a wall shape by applying and upraising resin on the base unit 2 on a straight line connecting the lens 400 and the light receiving element 608, it is possible to prevent, with a simple configuration, stray light from being incident on the light receiving element 608.

Fifth Modification of Fifth Embodiment

Figure 21:
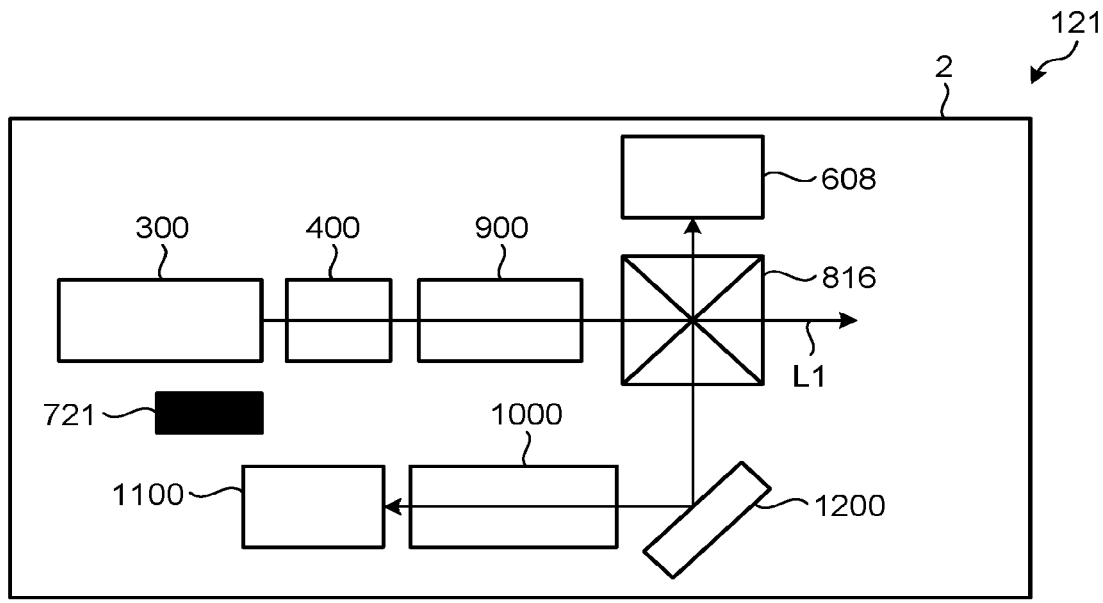
FIG. 21 is a plan view schematically illustrating the configuration of an optical module according to a fifth modification of the fifth embodiment.

Subsequently, a fifth modification of the fifth embodiment will be described below. FIG. 21 is a plan view schematically illustrating the configuration of an optical module according to the fifth modification of the fifth embodiment. This optical module 121 illustrated in FIG. 21 includes a shielding portion 721 in place of the shielding portion 700 of the optical module 116 according to the fifth embodiment described above.

The shielding portion 721 prevents stray light generated through reflection or scattering in the base unit 2 from being incident on the light receiving element 1100. The shielding portion 721 is formed of any of a light reflecting body that reflects stray light, a light scattering body that scatters stray light, and a light absorbing body that absorbs light. The shielding portion 721 is disposed through formation into a wall shape by applying and upraising resin on the base unit 2 on a straight line connecting the light emitting element 300 and the light receiving element 1100.

According to the fifth modification of the fifth embodiment described above, since the shielding portion 721 is disposed through formation into a wall shape by applying and upraising resin on the base unit 2 on a straight line connecting the light emitting element 300 and the light receiving element 1100, it is possible to prevent, with a simple configuration, stray light from being incident on the light receiving element 1100.

Sixth Embodiment

Figure 22:
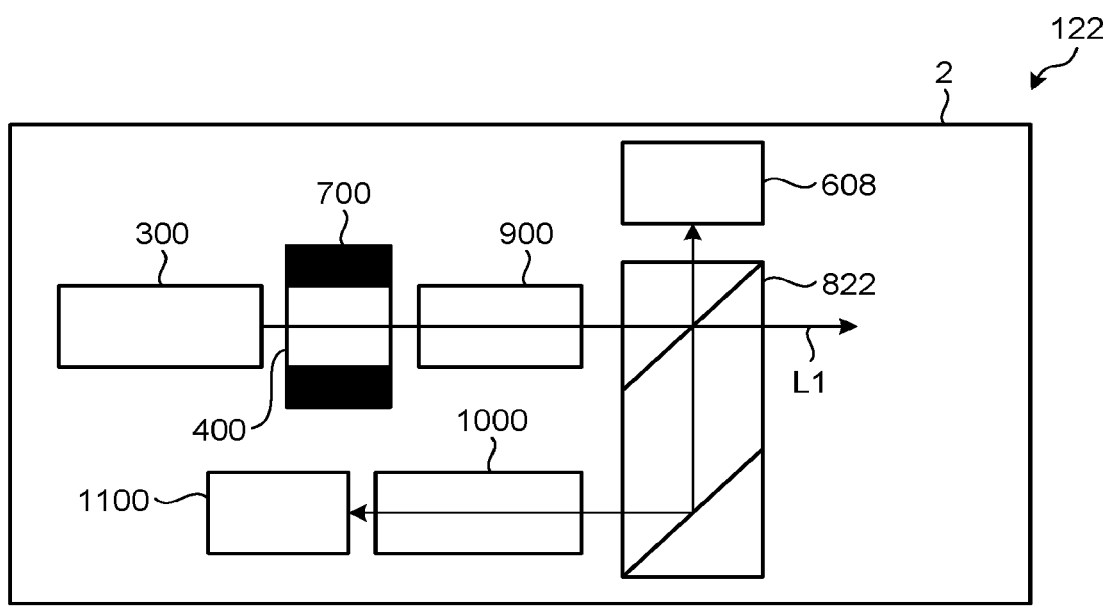
FIG. 22 is a plan view schematically illustrating the configuration of an optical module according to a sixth embodiment.

Subsequently, a sixth embodiment will be described below. FIG. 22 is a plan view schematically illustrating the configuration of an optical module according to the sixth embodiment. This optical module 122 illustrated in FIG. 22 includes a beam splitter 822 in place of the beam splitter 816 of the optical module 116 according to the fifth embodiment described above.

The beam splitter 822 reflects, to the light receiving element 608 and the etalon filter 1000, the laser beam L1 incident from the optical isolator 900, and transmits the remaining part of the laser beam L1.

According to the sixth embodiment described above, since the shielding portion 700 is provided to the lens 400, it is possible to prevent, with a simple configuration, stray light generated through reflection or scattering at the lens 400 from being incident on the light receiving element 608 and the light receiving element 1100.

First Modification of Sixth Embodiment

Figure 23:
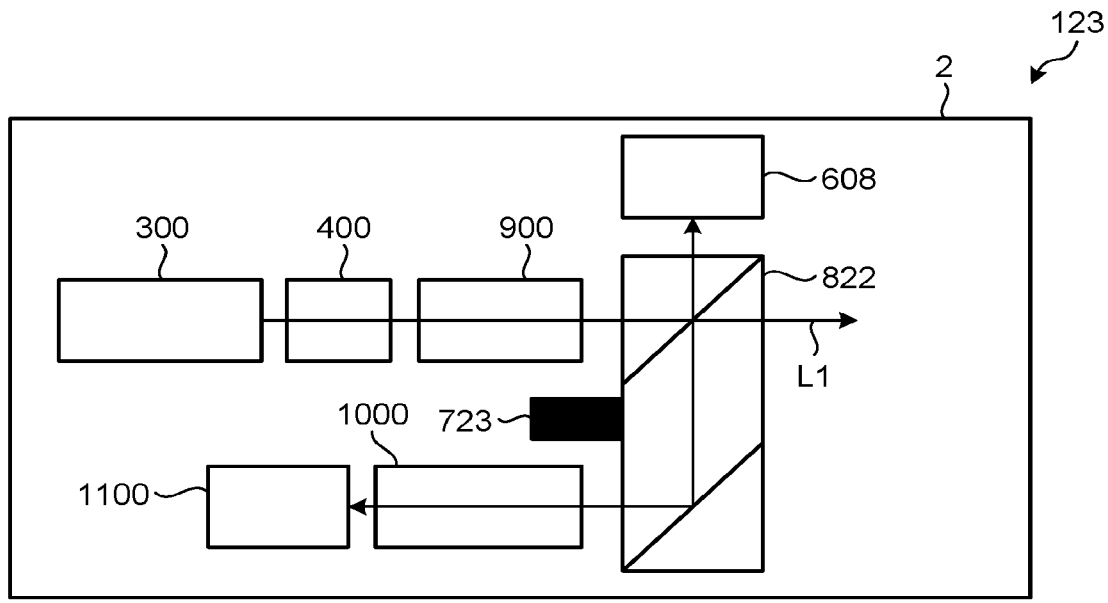
FIG. 23 is a plan view schematically illustrating the configuration of an optical module according to a first modification of the sixth embodiment.

Subsequently, a first modification of the sixth embodiment will be described below. FIG. 23 is a plan view schematically illustrating the configuration of an optical module according to the first modification of the sixth embodiment. This optical module 123 illustrated in FIG. 23 includes a shielding portion 723 in place of the shielding portion 700 of the optical module 122 according to the sixth embodiment described above.

The shielding portion 723 prevents stray light generated through reflection or scattering in the base unit 2 from being incident on the light receiving element 608. The shielding portion 723 is formed of any of a light reflecting body that reflects stray light, a light scattering body that scatters stray light, and a light absorbing body that absorbs light. The shielding portion 723 is disposed by applying resin on a side surface of the beam splitter 822. Specifically, the shielding portion 723 is disposed by applying resin on a side surface of the beam splitter 822 positioned on a straight line connecting the light emitting element 300 and the beam splitter 822.

According to the first modification of the sixth embodiment described above, since the shielding portion 723 is formed by disposing resin on a side surface of the beam splitter 822 positioned on a straight line connecting the light emitting element 300 and the beam splitter 822, it is possible to prevent, with a simple configuration, stray light from the light emitting element 300 from being incident on the light receiving element 608 and the light receiving element 1100.

Second Modification of Sixth Embodiment

Figure 24:
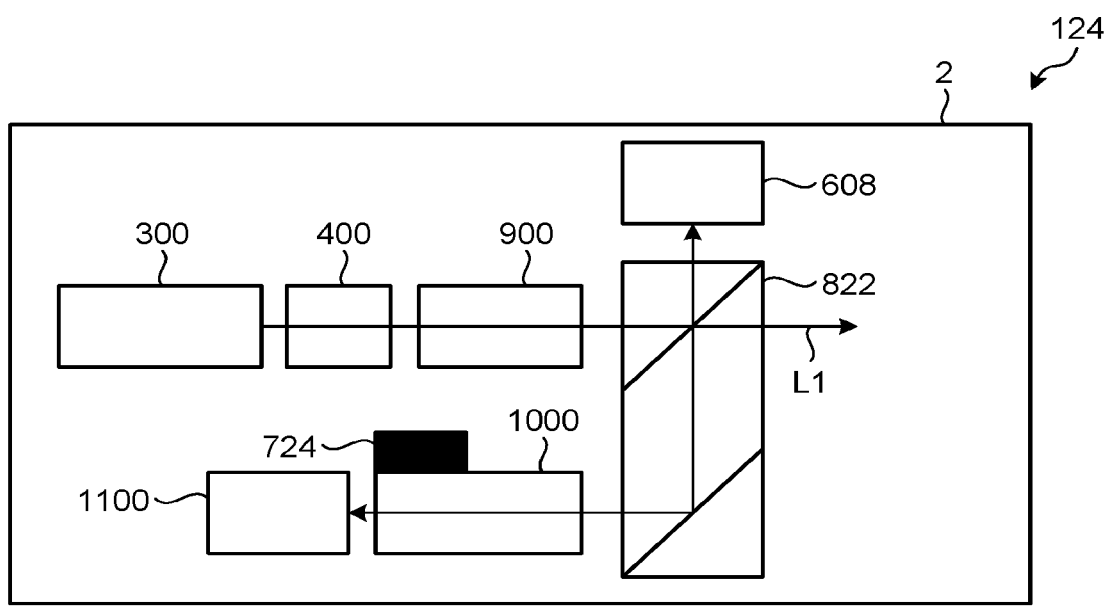
FIG. 24 is a plan view schematically illustrating the configuration of an optical module according to a second modification of the sixth embodiment.

Subsequently, a second modification of the sixth embodiment will be described below. FIG. 24 is a plan view schematically illustrating the configuration of an optical module according to the second modification of the sixth embodiment. This optical module 124 illustrated in FIG. 24 includes a shielding portion 724 in place of the shielding portion 700 of the optical module 122 according to the sixth embodiment described above.

The shielding portion 724 prevents stray light generated through reflection or scattering in the base unit 2 from being incident on the light receiving element 1100. The shielding portion 724 is formed of any of a light reflecting body that reflects stray light, a light scattering body that scatters stray light, and a light absorbing body that absorbs light. The shielding portion 724 is disposed by applying resin on a side surface of the etalon filter 1000. Specifically, the shielding portion 724 is disposed by applying resin on a side surface of the etalon filter 1000 so that the shielding portion 724 is positioned on a straight line connecting the light emitting element 300 and the etalon filter 1000.

According to the second modification of the sixth embodiment described above, since the shielding portion 724 is disposed by applying a side surface of the etalon filter 1000 so that the shielding portion 724 is positioned on a straight line connecting the light emitting element 300 and the etalon filter 1000, it is possible to prevent, with a simple configuration, stray light from the light emitting element 300 from being incident on the light receiving element 1100.

Third Modification of Sixth Embodiment

Figure 25:
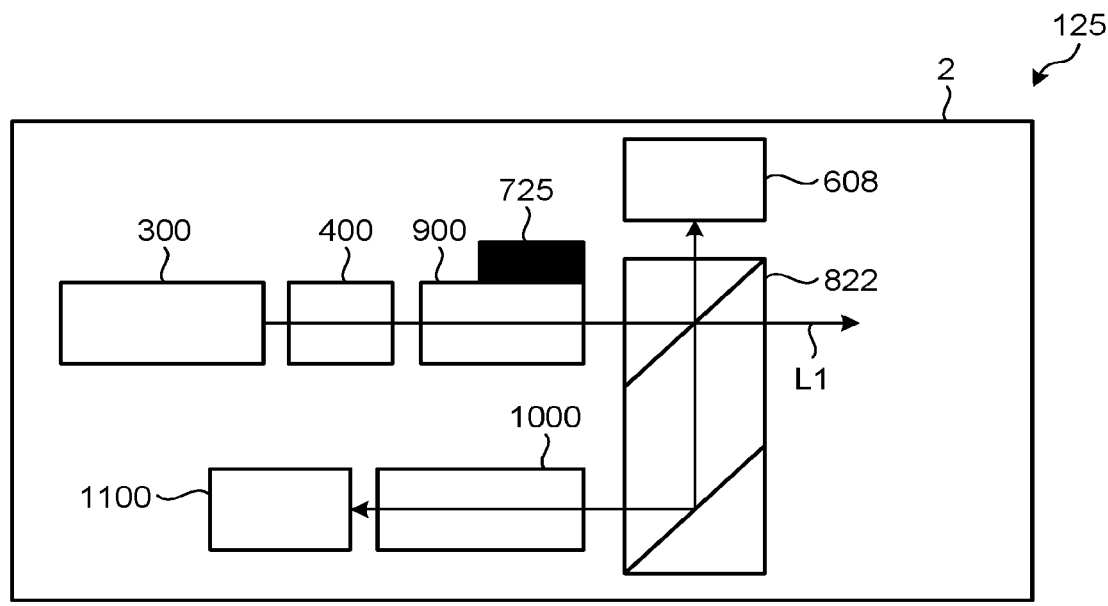
FIG. 25 is a plan view schematically illustrating the configuration of an optical module according to a third modification of the sixth embodiment.

Subsequently, a third modification of the sixth embodiment will be described below. FIG. 25 is a plan view schematically illustrating the configuration of an optical module according to the third modification of the sixth embodiment. This optical module 125 illustrated in FIG. 25 includes a shielding portion 725 in place of the shielding portion 700 of the optical module 122 according to the sixth embodiment described above.

The shielding portion 725 prevents stray light generated through reflection or scattering in the base unit 2 from being incident on the light receiving element 608. The shielding portion 725 is formed of any of a light reflecting body that reflects stray light, a light scattering body that scatters stray light, and a light absorbing body that absorbs light. The shielding portion 725 is disposed by applying resin on a side surface of the optical isolator 900. Specifically, the shielding portion 725 is disposed by applying resin on a side surface of the optical isolator 900 so that the shielding portion 725 is positioned on a straight line connecting the lens 400 and the light receiving element 608.

According to the third modification of the sixth embodiment described above, since the shielding portion 725 is formed by applying resin on a side surface of the optical isolator 900 so that the shielding portion 725 is positioned on a straight line connecting the lens 400 and the light receiving element 608, it is possible to prevent, with a simple configuration, stray light from the light emitting element 300 from being incident on the light receiving element 608.

Seventh Embodiment

Figure 26:
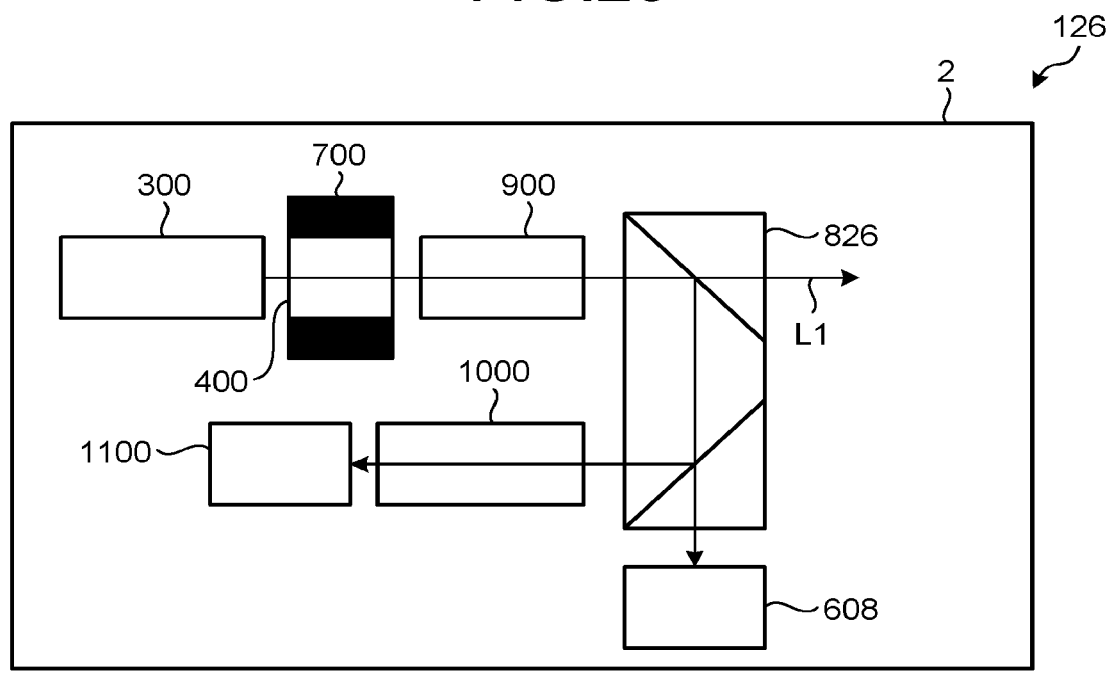
FIG. 26 is a plan view schematically illustrating the configuration of an optical module according to a seventh embodiment.

Subsequently, a seventh embodiment will be described below. FIG. 26 is a plan view schematically illustrating the configuration of an optical module according to the seventh embodiment. This optical module 126 illustrated in FIG. 26 includes a beam splitter 826 in place of the beam splitter 822 in the sixth embodiment described above.

The beam splitter 826 reflects, to the light receiving element 608 and the etalon filter 1000, the laser beam L1 incident from the optical isolator 900, and transmits the remaining part of the laser beam L1.

According to the sixth embodiment described above, since the shielding portion 700 is provided to the lens 400, it is possible to prevent, with a simple configuration, stray light generated through reflection or scattering at the lens 400 from being incident on the light receiving element 608 and the light receiving element 1100.

First Modification of Seventh Embodiment

Figure 27:
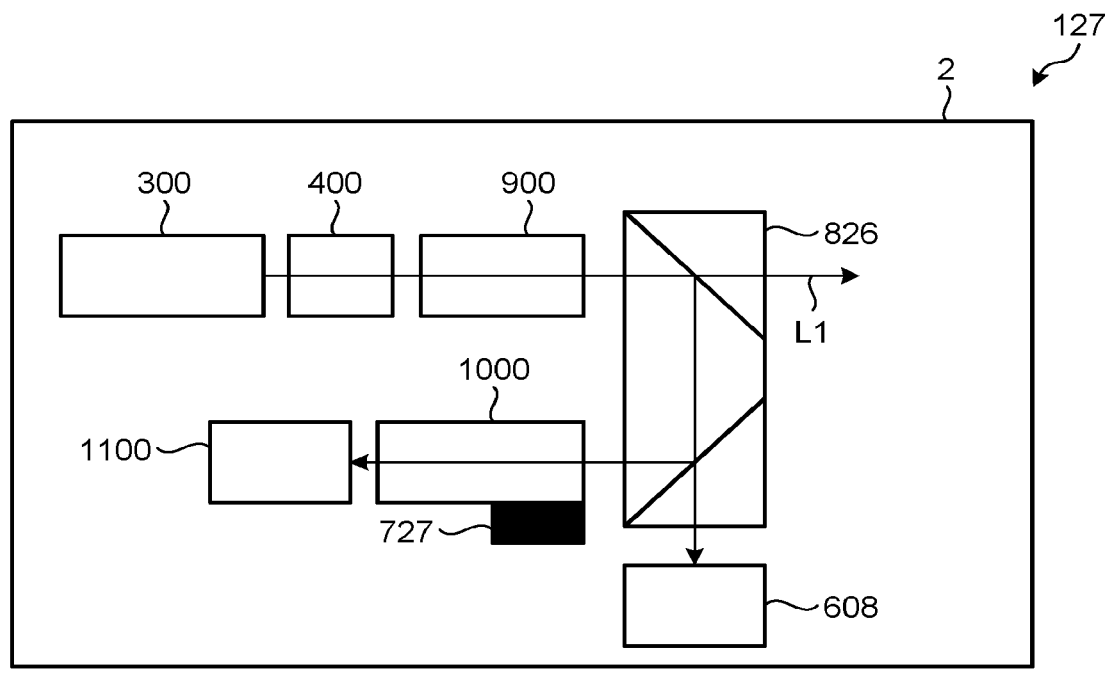
FIG. 27 is a plan view schematically illustrating the configuration of an optical module according to a first modification of the seventh embodiment.

Subsequently, a first modification of the seventh embodiment will be described below. FIG. 27 is a plan view schematically illustrating the configuration of an optical module according to the first modification of the seventh embodiment. This optical module 127 illustrated in FIG. 27 includes a shielding portion 727 in place of the shielding portion 700 of the optical module 126 according to the seventh embodiment described above.

The shielding portion 727 prevents stray light generated through reflection or scattering in the base unit 2 from being incident on the light receiving element 608. The shielding portion 727 is formed of any of a light reflecting body that reflects stray light, a light scattering body that scatters stray light, and a light absorbing body that absorbs light. The shielding portion 727 is formed by applying resin on a side surface of the etalon filter 1000. Specifically, the shielding portion 727 is disposed by applying resin on a side surface of the etalon filter 1000 positioned on a straight line connecting the light receiving element 608 and the lens 400.

According to the first modification of the seventh embodiment described above, since the shielding portion 727 is disposed by applying resin on a side surface of the etalon filter 1000 positioned on a straight line connecting the light receiving element 608 and the lens 400, it is possible to prevent, with a simple configuration, stray light from being incident on the light receiving element 608.

Second Modification of Seventh Embodiment

Figure 28:
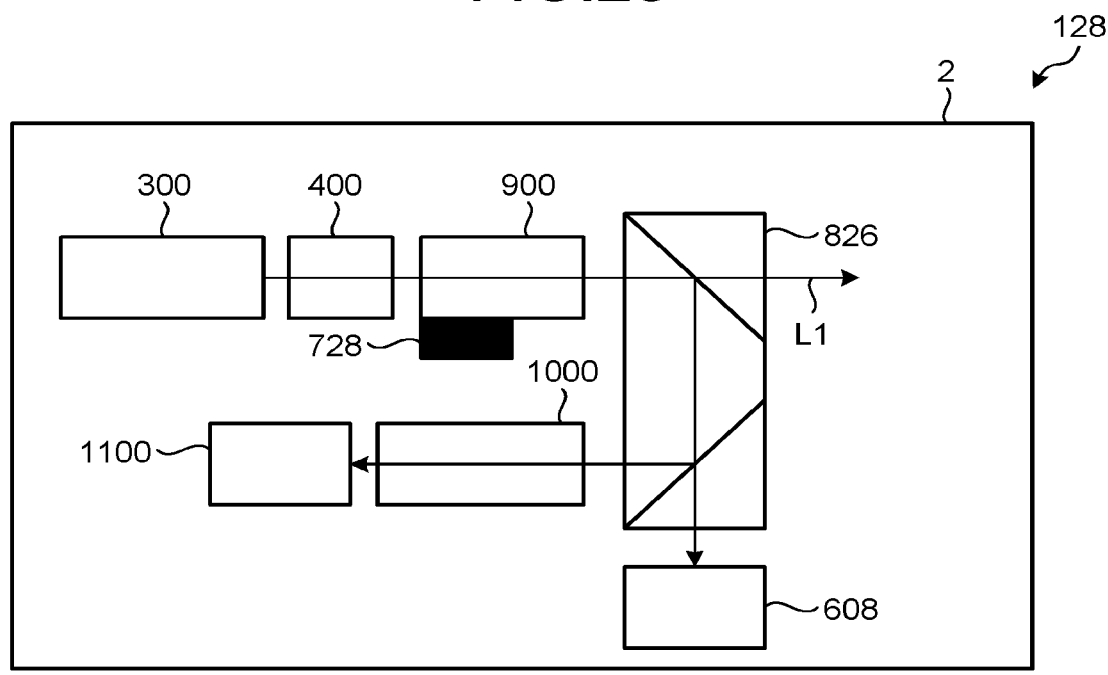
FIG. 28 is a plan view schematically illustrating the configuration of an optical module according to a second modification of the seventh embodiment.

Subsequently, a second modification of the seventh embodiment will be described below. FIG. 28 is a plan view schematically illustrating the configuration of an optical module according to the second modification of the seventh embodiment. This optical module 128 illustrated in FIG. 28 includes a shielding portion 728 in place of the shielding portion 700 of the optical module 126 according to the seventh embodiment described above.

The shielding portion 728 prevents stray light generated through reflection or scattering in the base unit 2 from being incident on the light receiving element 608. The shielding portion 728 is formed of any of a light reflecting body that reflects stray light, a light scattering body that scatters stray light, and a light absorbing body that absorbs light. The shielding portion 728 is disposed by applying resin on a side surface of the optical isolator 900. Specifically, the shielding portion 728 is disposed by applying resin on a side surface of the optical isolator 900 positioned on a straight line connecting the lens 400 and the light receiving element 608.

According to the second modification of the seventh embodiment described above, since the shielding portion 728 is disposed by applying resin on a side surface of the optical isolator 900 positioned on a straight line connecting the lens 400 and the light receiving element 608, it is possible to prevent, with a simple configuration, stray light from being incident on the light receiving element 608.

Third Modification of Seventh Embodiment

Figure 29:
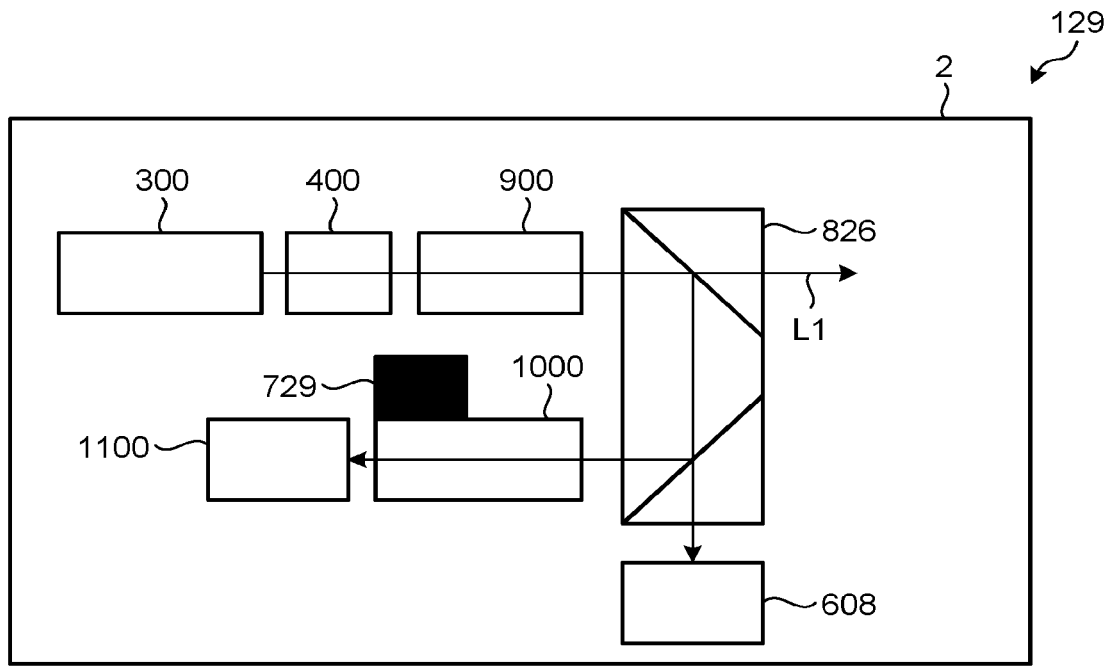
FIG. 29 is a plan view schematically illustrating the configuration of an optical module according to a third modification of the seventh embodiment.

Subsequently, a third modification of the seventh embodiment will be described below. FIG. 29 is a plan view schematically illustrating the configuration of an optical module according to the third modification of the seventh embodiment. This optical module 129 illustrated in FIG. 29 includes a shielding portion 729 in place of the shielding portion 700 of the optical module 126 according to the seventh embodiment described above.

The shielding portion 729 prevents stray light generated through reflection or scattering in the base unit 2 from being incident on the light receiving element 608. The shielding portion 729 is formed of any of a light reflecting body that reflects stray light, a light scattering body that scatters stray light, and a light absorbing body that absorbs light. The shielding portion 729 is disposed by applying resin on a side surface of the etalon filter 1000. Specifically, the shielding portion 729 is disposed by applying resin on a side surface of the etalon filter 1000 positioned on a straight line connecting the lens 400 and the light receiving element 608.

According to the third modification of the seventh embodiment described above, since the shielding portion 729 is disposed by applying resin on a side surface of the etalon filter 1000 positioned on a straight line connecting the lens 400 and the light receiving element 608, it is possible to prevent, with a simple configuration, stray light from being incident on the light receiving element 608.

Eighth Embodiment

Figure 30:
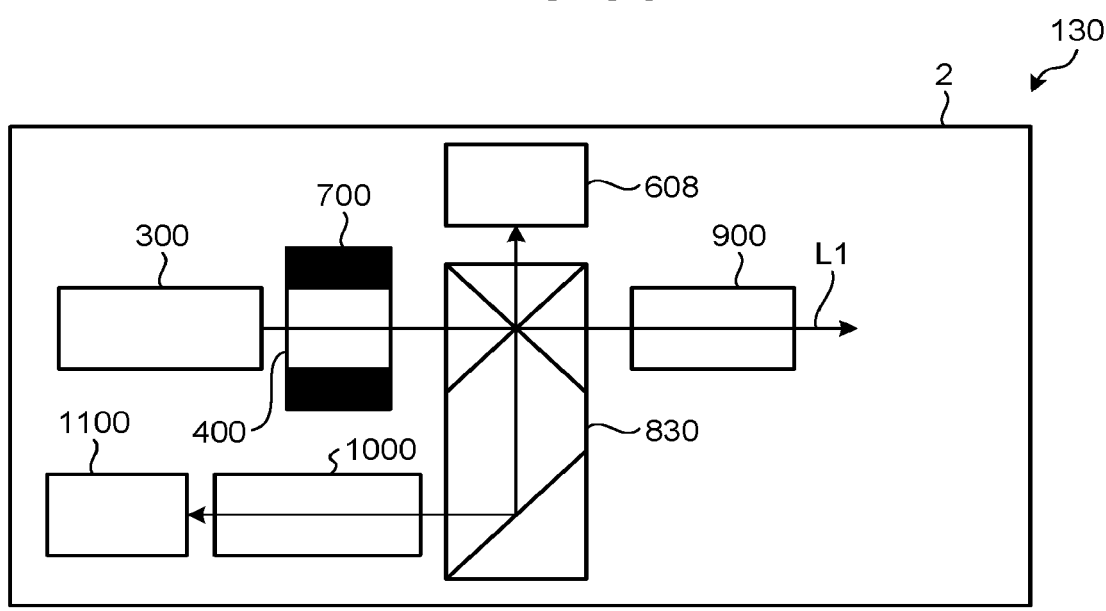
FIG. 30 is a plan view schematically illustrating the configuration of an optical module according to an eighth embodiment.

Subsequently, an eighth embodiment will be described below. FIG. 30 is a plan view schematically illustrating the configuration of an optical module according to the eighth embodiment. This optical module 130 illustrated in FIG. 30 includes a beam splitter 830 in place of the beam splitter 826 of the optical module 126 according to the seventh embodiment described above. In addition, in the optical module 130 illustrated in FIG. 30, disposition of the beam splitter 830 and the optical isolator 900 is opposite to that in the seventh embodiment described above. Specifically, in the optical module 130, the light emitting element 300, the lens 400, the beam splitter 830, and the optical isolator 900 are disposed on the base unit 2 in the stated order.

The beam splitter 830 divides the laser beam L1 incident from the lens 400 by reflecting part thereof toward each of the light receiving element 608 and the etalon filter 1000 and transmitting the remaining part of the laser beam L1 to the optical isolator 900.

According to the eighth embodiment described above, since the shielding portion 700 is provided to the lens 400, it is possible to prevent, with a simple configuration, stray light generated through reflection or scattering at the lens 400 from being incident on the light receiving element 608 and the light receiving element 1100.

First Modification of Eighth Embodiment

Figure 31:
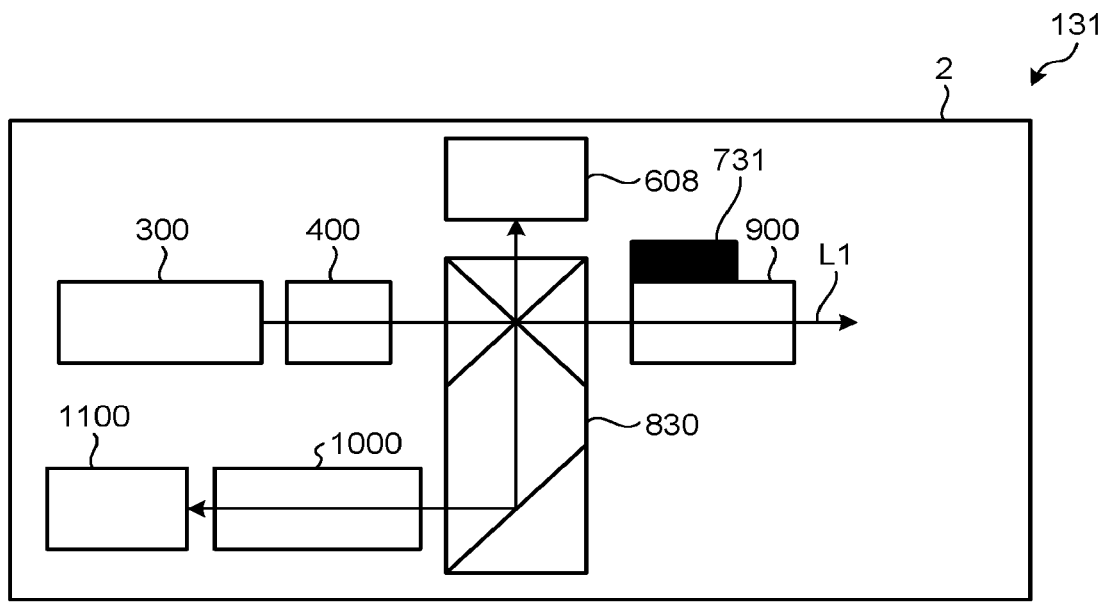
FIG. 31 is a plan view schematically illustrating the configuration of an optical module according to a first modification of the eighth embodiment.

Subsequently, a first modification of the eighth embodiment will be described below. FIG. 31 is a plan view schematically illustrating the configuration of an optical module according to the first modification of the eighth embodiment. This optical module 131 illustrated in FIG. 31 includes a shielding portion 731 in place of the shielding portion 700 of the optical module 130 according to the eighth embodiment described above.

The shielding portion 731 prevents stray light generated through reflection or scattering in the base unit 2 from being incident on the light receiving element 608. The shielding portion 731 is formed of any of a light reflecting body that reflects stray light, a light scattering body that scatters stray light, and a light absorbing body that absorbs light. The shielding portion 731 is disposed by applying resin on a side surface of the optical isolator 900. Specifically, the shielding portion 731 is disposed by applying resin on a side surface of the optical isolator 900 so that the shielding portion 731 is positioned on a straight line connecting the light receiving element 608 and the optical isolator 900.

According to the first modification of the eighth embodiment described above, since the shielding portion 731 is formed by applying resin on a side surface of the optical isolator 900 so that the shielding portion 731 is positioned on a straight line connecting the light receiving element 608 and the optical isolator 900, it is possible to prevent, with a simple configuration, stray light from being incident on the light receiving element 608.

Second Modification of Eighth Embodiment

Figure 32:
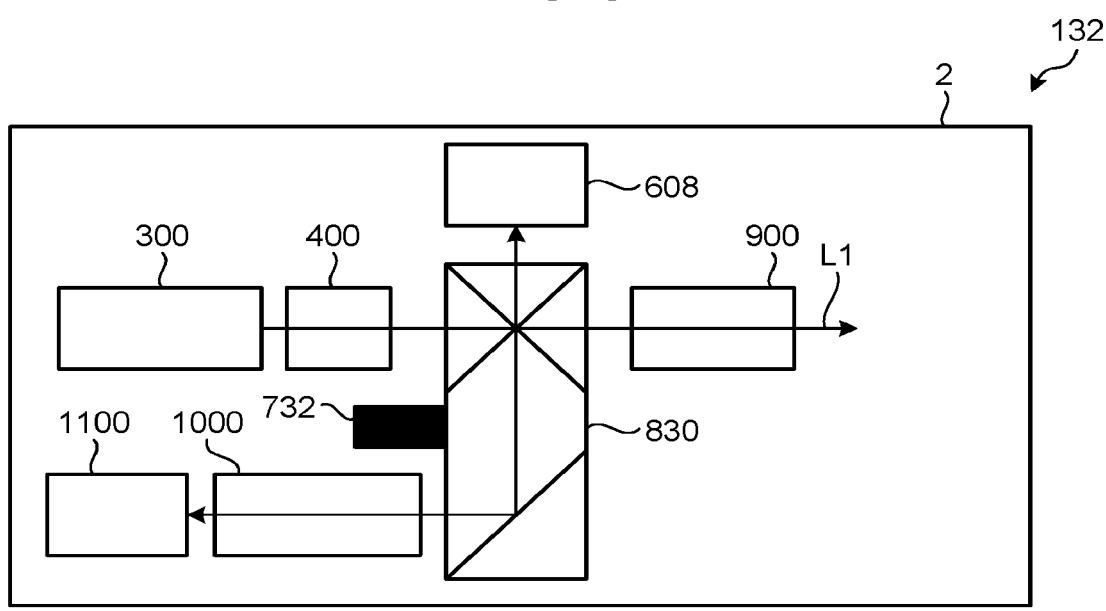
FIG. 32 is a plan view schematically illustrating the configuration of an optical module according to a second modification of the eighth embodiment.

Subsequently, a second modification of the eighth embodiment will be described below. FIG. 32 is a plan view schematically illustrating the configuration of an optical module according to the second modification of the eighth embodiment. This optical module 132 illustrated in FIG. 32 includes a shielding portion 732 in place of the shielding portion 700 of the optical module 130 according to the eighth embodiment described above.

The shielding portion 732 prevents stray light generated through reflection or scattering in the base unit 2 from being incident on the light receiving element 1100. The shielding portion 732 is formed of any of a light reflecting body that reflects stray light, a light scattering body that scatters stray light, and a light absorbing body that absorbs light. The shielding portion 732 is disposed by applying resin on a side surface of the beam splitter 830. Specifically, the shielding portion 732 is disposed by applying resin on a side surface of the beam splitter 830 so that the shielding portion 732 is positioned on a straight line connecting the lens 400 and the beam splitter 830.

According to the second modification of the eighth embodiment described above, since the shielding portion 732 is disposed by applying resin on a side surface of the beam splitter 830 so that the shielding portion 732 is positioned on a straight line connecting the lens 400 and the beam splitter 830, it is possible to prevent, with a simple configuration, stray light from being incident on the light receiving element 1100.

Third Modification of Eighth Embodiment

Figure 33:
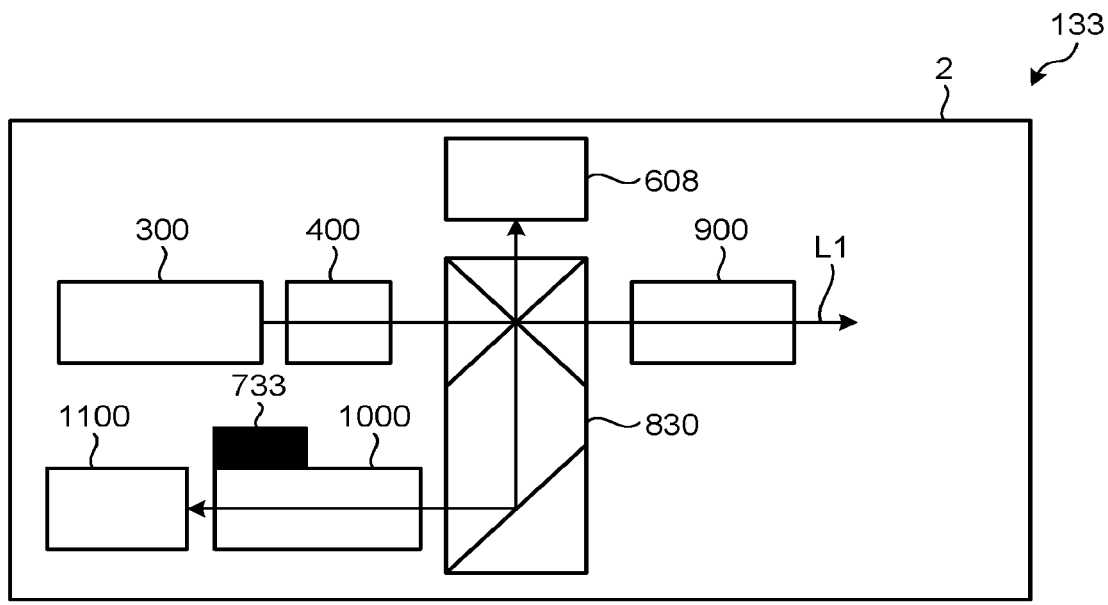
FIG. 33 is a plan view schematically illustrating the configuration of an optical module according to a third modification of the eighth embodiment.

Subsequently, a third modification of the eighth embodiment will be described below. FIG. 33 is a plan view schematically illustrating the configuration of an optical module according to the third modification of the eighth embodiment. This optical module 133 illustrated in FIG. 33 includes a shielding portion 733 in place of the shielding portion 700 of the optical module 130 according to the eighth embodiment described above.

The shielding portion 733 prevents stray light generated through reflection or scattering in the base unit 2 from being incident on the light receiving element 1100. The shielding portion 733 is formed of any of a light reflecting body that reflects stray light, a light scattering body that scatters stray light, and a light absorbing body that absorbs light. The shielding portion 733 is disposed by applying resin on a side surface of the etalon filter 1000. Specifically, the shielding portion 733 is disposed by applying resin on a side surface of the etalon filter 1000 so that the shielding portion 733 is positioned on a straight line connecting the light emitting element 300 and the etalon filter 1000.

According to the third modification of the eighth embodiment described above, since the shielding portion 733 is disposed by applying resin on a side surface of the etalon filter 1000 so that the shielding portion 733 is positioned on a straight line connecting the light emitting element 300 and the etalon filter 1000, it is possible to prevent stray light from being incident on the light receiving element 1100.

Ninth Embodiment

Figure 34:
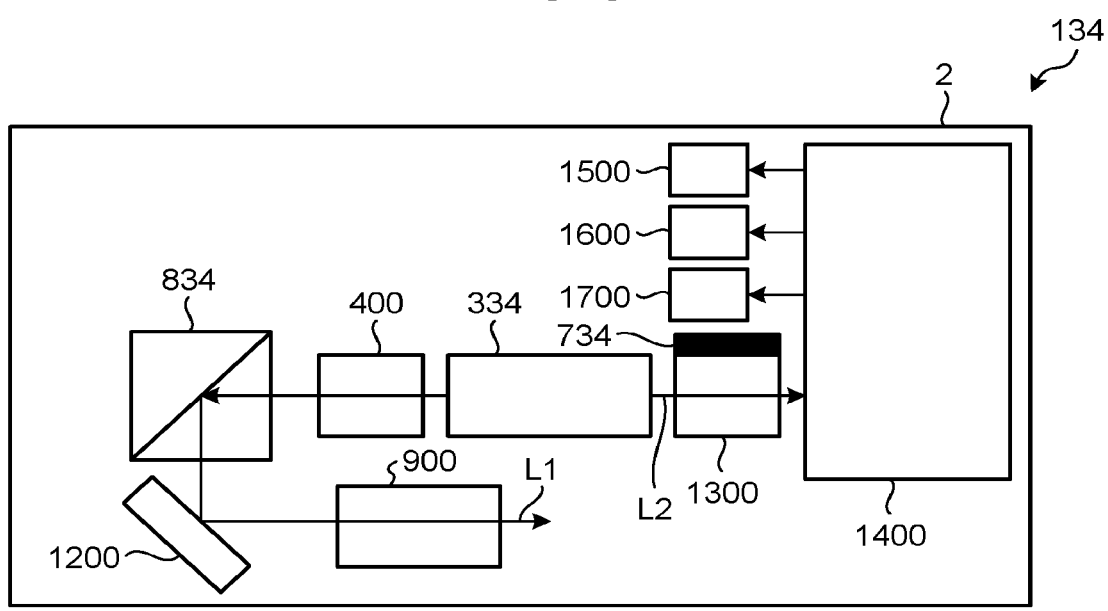
FIG. 34 is a plan view schematically illustrating the configuration of an optical module according to a ninth embodiment.

Subsequently, a ninth embodiment will be described below. FIG. 34 is a plan view schematically illustrating the configuration of an optical module according to the ninth embodiment. This optical module 134 illustrated in FIG. 34 includes a light emitting element 334, the lens 400, a shielding portion 734, a beam splitter 834, the reflection component 1200, the optical isolator 900, a coupling lens 1300, a wavelength detecting element 1400, a light receiving element 1500, a light receiving element 1600, a light receiving element 1700.

The light emitting element 334 emits the laser beam L1 and the laser beam L2 in accordance with the driving current supplied from the controller (not illustrated).

The shielding portion 734 prevents stray light generated through reflection or scattering in the base unit 2 from being incident on the light receiving element 1700. The shielding portion 734 is formed of any of a light reflecting body that reflects stray light, a light scattering body that scatters stray light, and a light absorbing body that absorbs light. The shielding portion 734 is disposed by applying resin on a side surface of the coupling lens 1300 to be described later. Specifically, the shielding portion 734 is disposed by applying resin on a side surface of the coupling lens 1300 positioned on a straight line connecting the coupling lens 1300 and the light receiving element 1700.

The beam splitter 834 reflects, to the reflection component 1200, the laser beam L1 collimated through the lens 400.

The reflection component 1200 reflects, to the optical isolator 900, the laser beam L1 incident from the beam splitter 834.

The coupling lens 1300 couples, to the wavelength detecting element 1400, the laser beam L2 incident from the light emitting element 334.

The wavelength detecting element 1400 includes at least a light dividing unit (not illustrated) and two filter units (not illustrated). The light dividing unit divides the laser beam L2 into three laser beams so that one of the laser beams is incident on the light receiving element 1500. The filter units have periodic transmission characteristics for the frequency of light and transmit the two remaining laser beams obtained through the division by the light dividing unit so that the laser beams are incident on the light receiving element 1600 and the light receiving element 1700.

The light receiving element 1500, the light receiving element 1600, and the light receiving element 1700 are each formed of a photodiode. The light receiving element 1500, the light receiving element 1600, and the light receiving element 1700 each receive a laser beam and emit a current signal in accordance with the power of the received laser beam to the controller (not illustrated). The controller (not illustrated) adjusts the temperature of the light emitting element 334 by controlling the driving current to be supplied to the temperature adjuster based on the current signal received from each of the light receiving element 1500, the light receiving element 1600, and the light receiving element 1700, thereby controlling the wavelength of the laser beam L1 emitted from the light emitting element 334. Such control is a well-known technology called wavelength locking. The wavelength detecting element 1400 can be achieved by a light waveguide element such as a planar lightwave circuit (PLC) or by a space coupling system. Each filter unit can be achieved by, for example, a ring filter or an etalon filter.

According to the ninth embodiment described above, since the shielding portion 734 is disposed by applying resin on a side surface of the coupling lens 1300 positioned on a straight line connecting the coupling lens 1300 and the light receiving element 1700, it is possible to prevent, with a simple configuration, stray light emitted through the coupling lens 1300 from being incident on the light receiving element 1700.

First Modification of Ninth Embodiment

Figure 35:
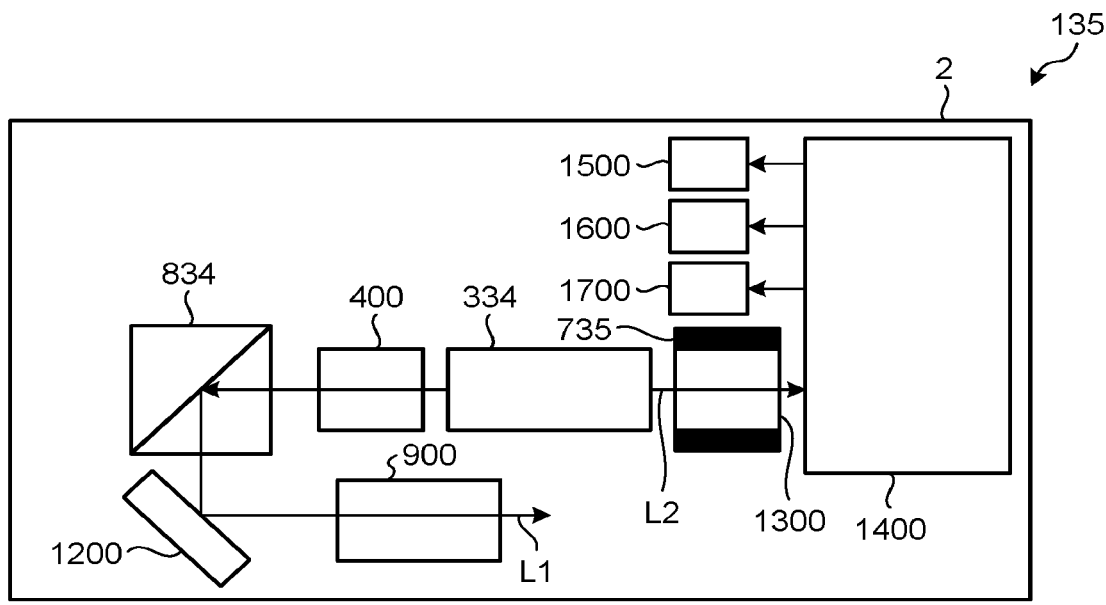
FIG. 35 is a plan view schematically illustrating the configuration of an optical module according to a first modification of the ninth embodiment.

Subsequently, a first modification of the ninth embodiment will be described below. FIG. 35 is a plan view schematically illustrating the configuration of an optical module according to the first modification of the ninth embodiment. This optical module 135 illustrated in FIG. 35 includes a shielding portion 735 in place of the shielding portion 734 of the optical module 134 according to the ninth embodiment described above. The shielding portion 735 is disposed by applying resin on both edges of the coupling lens 1300.

According to the first modification of the ninth embodiment described above, since the shielding portion 735 is disposed by applying resin on both edges of the coupling lens 1300, it is possible to prevent, with a simple configuration, stray light emitted through the coupling lens 1300 from being incident on the light receiving element 1700.

Second Modification of Ninth Embodiment

Figure 36:
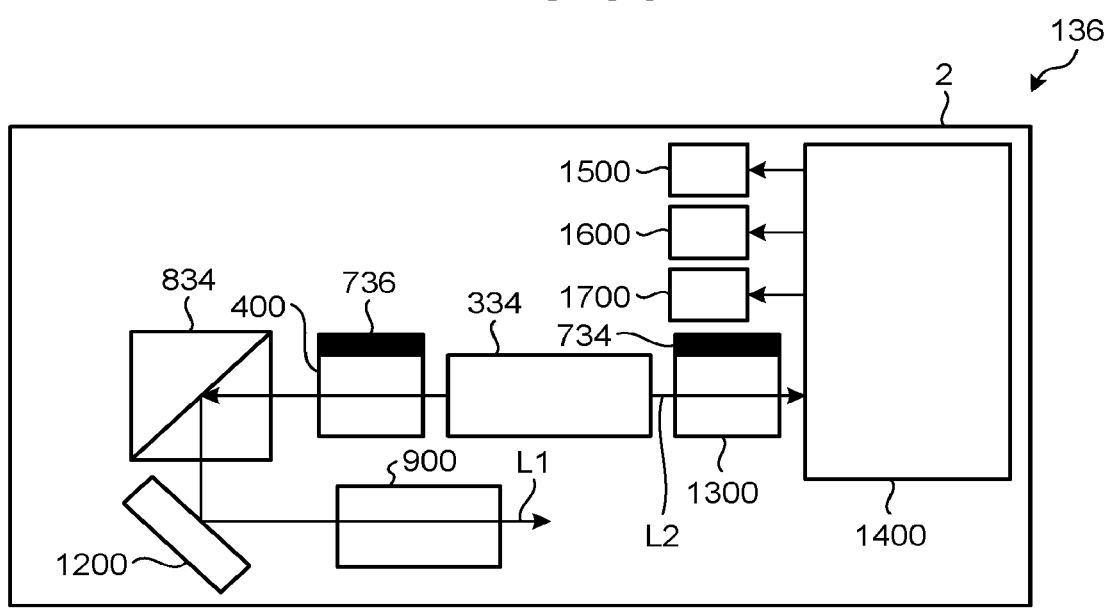
FIG. 36 is a plan view schematically illustrating the configuration of an optical module according to a second modification of the ninth embodiment.

Subsequently, a second modification of the ninth embodiment will be described below. FIG. 36 is a plan view schematically illustrating the configuration of an optical module according to the second modification of the ninth embodiment. This optical module 136 illustrated in FIG. 36 further includes a shielding portion 736 in addition to the configuration of the optical module 134 in the ninth embodiment.

The shielding portion 736 prevents stray light generated through reflection or scattering in the base unit 2 from being incident on the light receiving element 1500, the light receiving element 1600, and the light receiving element 1700. The shielding portion 736 is formed of any of a light reflecting body that reflects stray light, a light scattering body that scatters stray light, and a light absorbing body that absorbs light. The shielding portion 736 is disposed by applying resin on one side surface of the lens 400. Specifically, the shielding portion 736 is disposed by applying resin on a side surface of the lens 400 on which the light receiving element 1700 is disposed.

According to the second modification of the ninth embodiment described above, since the shielding portion 736 is disposed through application on the lens 400, it is possible to prevent, with a simple configuration, stray light emitted through the lens 400 and the coupling lens 1300 from being incident on the light receiving element 1500, the light receiving element 1600, and the light receiving element 1700.

Third Modification of Ninth Embodiment

Figure 37:
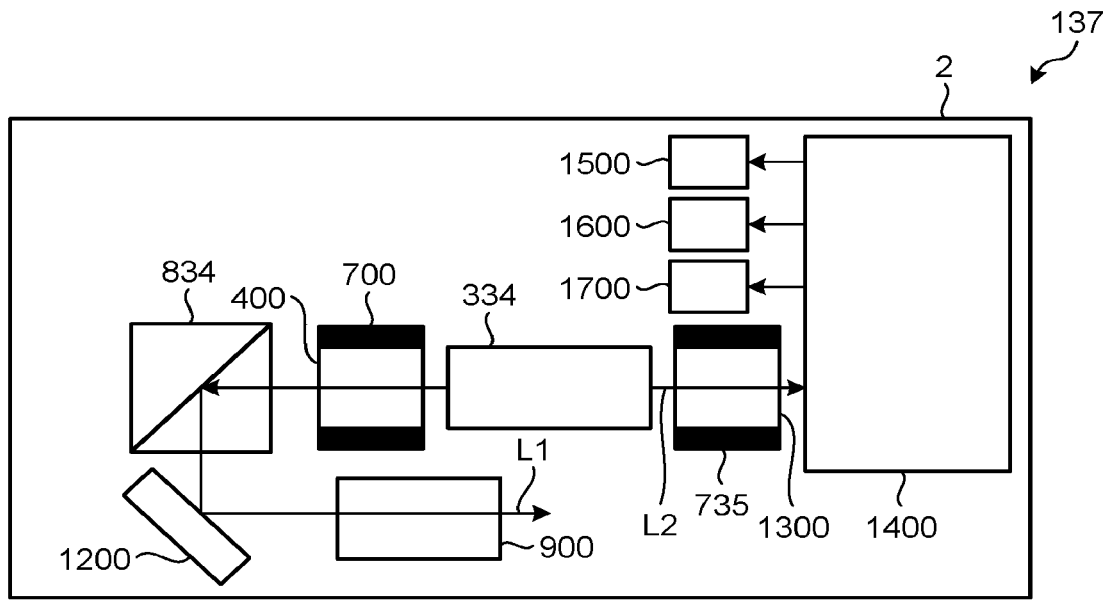
FIG. 37 is a plan view schematically illustrating the configuration of an optical module according to a third modification of the ninth embodiment.

Subsequently, a third modification of the ninth embodiment will be described below. FIG. 37 is a plan view schematically illustrating the configuration of an optical module according to the third modification of the ninth embodiment. This optical module 137 illustrated in FIG. 37 includes the shielding portion 700 formed through application on both edges of each of the shielding portion 735 and the lens 400 in the first modification of the ninth embodiment described above.

According to the third modification of the ninth embodiment described above, since the shielding portion 735 is disposed by applying resin on the coupling lens 1300 and the shielding portion 700 is disposed by applying resin on the lens 400, it is possible to prevent, with a simple configuration, stray light emitted through the lens 400 and the coupling lens 1300 from being incident on the light receiving element 1500, the light receiving element 1600, and the light receiving element 1700.

Tenth Embodiment

Figure 38:
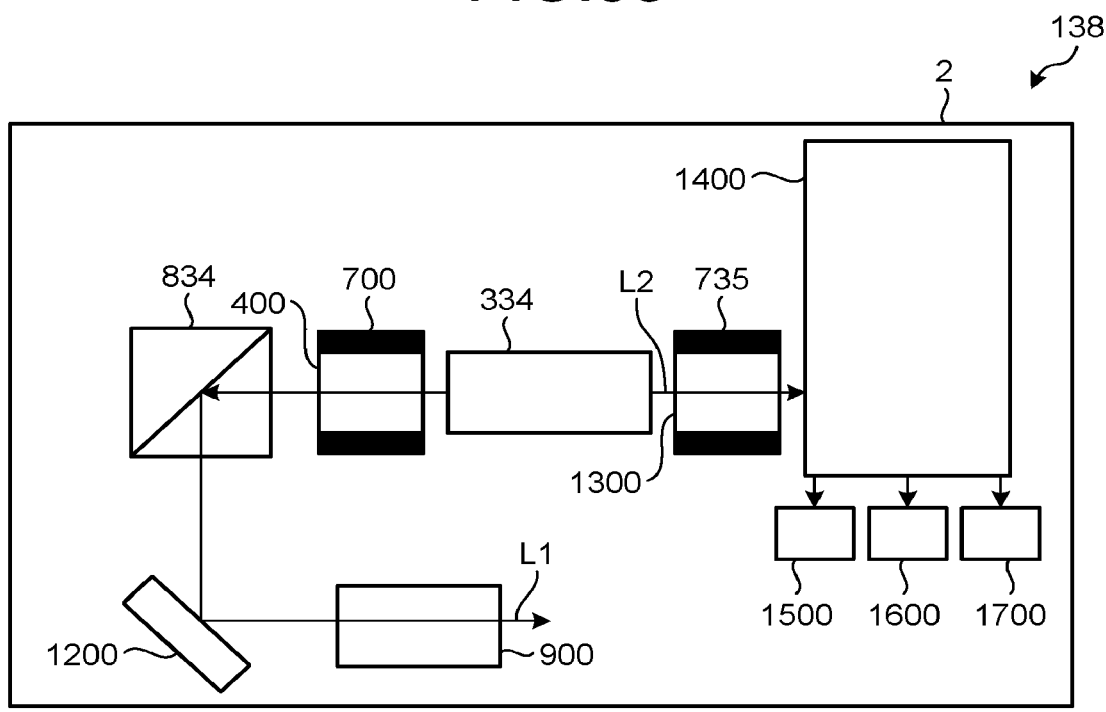
FIG. 38 is a plan view schematically illustrating the configuration of an optical module according to a tenth embodiment.

Subsequently, a tenth embodiment will be described below. FIG. 38 is a plan view schematically illustrating the configuration of an optical module according to the tenth embodiment. This optical module 138 illustrated in FIG. 38 has a configuration identical to that in the third modification of the ninth embodiment described above but is different only in the disposition positions of the light receiving element 1500, the light receiving element 1600, and the light receiving element 1700. Specifically, in the optical module 138, each of the light receiving element 1500, the light receiving element 1600, and the light receiving element 1700 is disposed below the wavelength detecting element 1400.

According to the tenth embodiment described above, it is possible to prevent, with a simple configuration, stray light emitted through the lens 400 and the coupling lens 1300 from being incident on the light receiving element 1500, the light receiving element 1600, and the light receiving element 1700.

First Modification of Tenth Embodiment

Figure 39:
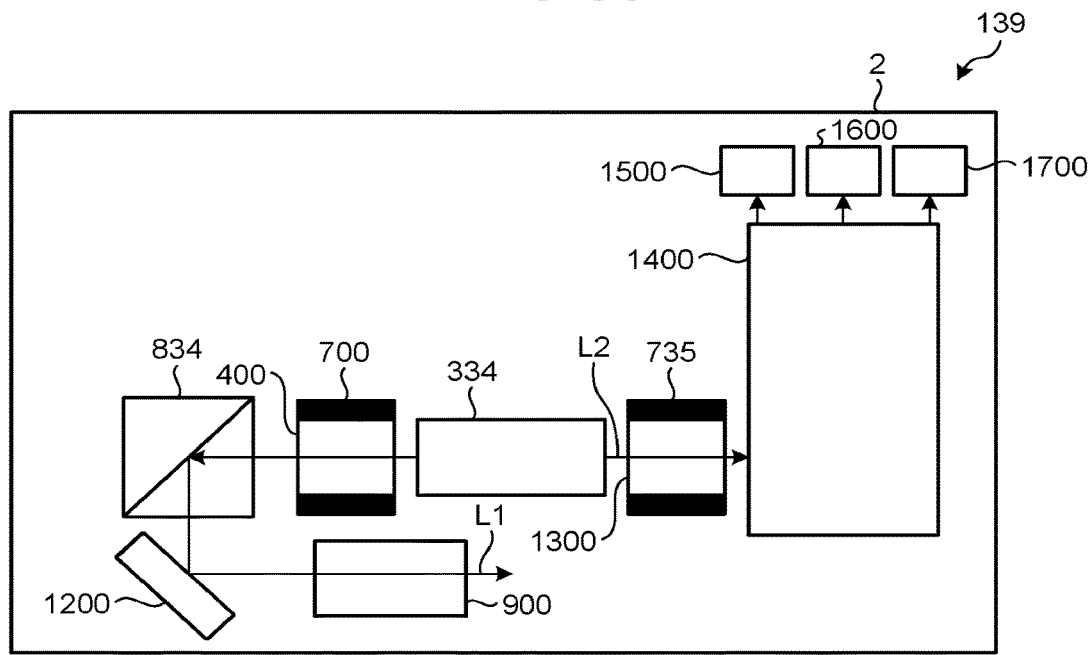
FIG. 39 is a plan view schematically illustrating the configuration of an optical module according to a first modification of the tenth embodiment.

Subsequently, a first modification of the tenth embodiment will be described below. FIG. 39 is a plan view schematically illustrating the configuration of an optical module according to the first modification of the tenth embodiment. This optical module 139 illustrated in FIG. 39 has a configuration identical to that in the third modification of the ninth embodiment described above but is different only in the disposition positions of the light receiving element 1500, the light receiving element 1600, and the light receiving element 1700. Specifically, in the optical module 139, each of the light receiving element 1500, the light receiving element 1600, and the light receiving element 1700 is disposed above the wavelength detecting element 1400.

According to the first modification of the tenth embodiment described above, it is possible to prevent, with a simple configuration, stray light emitted through the lens 400 and the coupling lens 1300 from being incident on the light receiving element 1500, the light receiving element 1600, and the light receiving element 1700.

Second Modification of Tenth Embodiment

Figure 40:
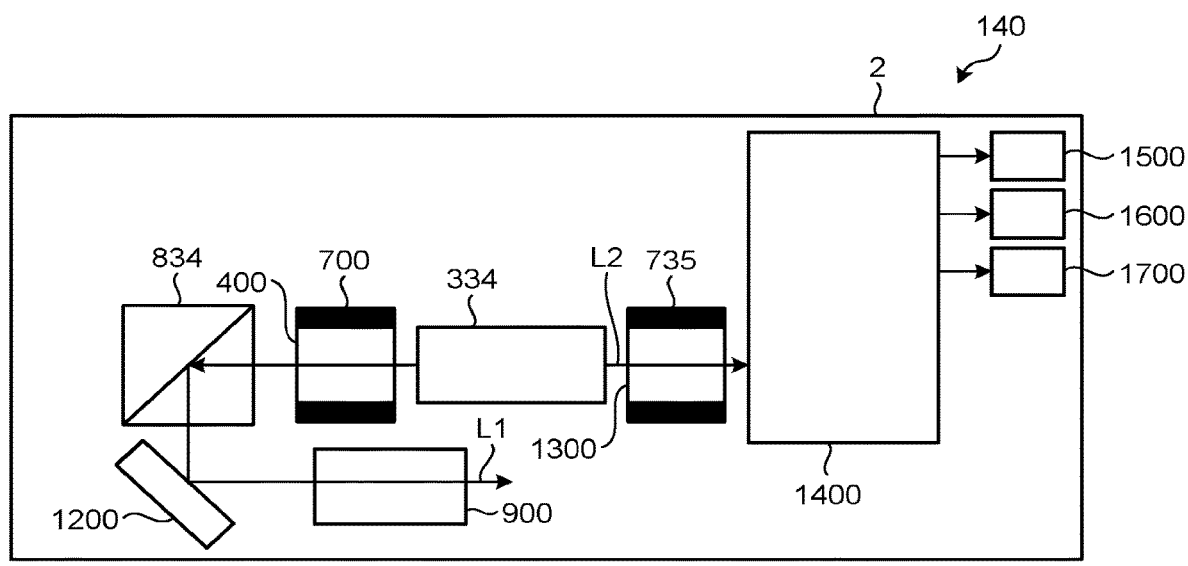
FIG. 40 is a plan view schematically illustrating the configuration of an optical module according to a second modification of the tenth embodiment.

Subsequently, a second modification of the tenth embodiment will be described below. FIG. 40 is a plan view schematically illustrating the configuration of an optical module according to the second modification of the tenth embodiment. This optical module 140 illustrated in FIG. 40 has a configuration identical to that in the third modification of the ninth embodiment described above, but is different only in the disposition positions of the light receiving element 1500, the light receiving element 1600, and the light receiving element 1700. Specifically, in the optical module 140, each of the light receiving element 1500, the light receiving element 1600, and the light receiving element 1700 is disposed on the front side of the base unit 2.

According to the second modification of the tenth embodiment described above, it is possible to prevent, with a simple configuration, stray light emitted through the lens 400 and the coupling lens 1300 from being incident on the light receiving element 1500, the light receiving element 1600, and the light receiving element 1700.

Eleventh Embodiment

Figure 41:
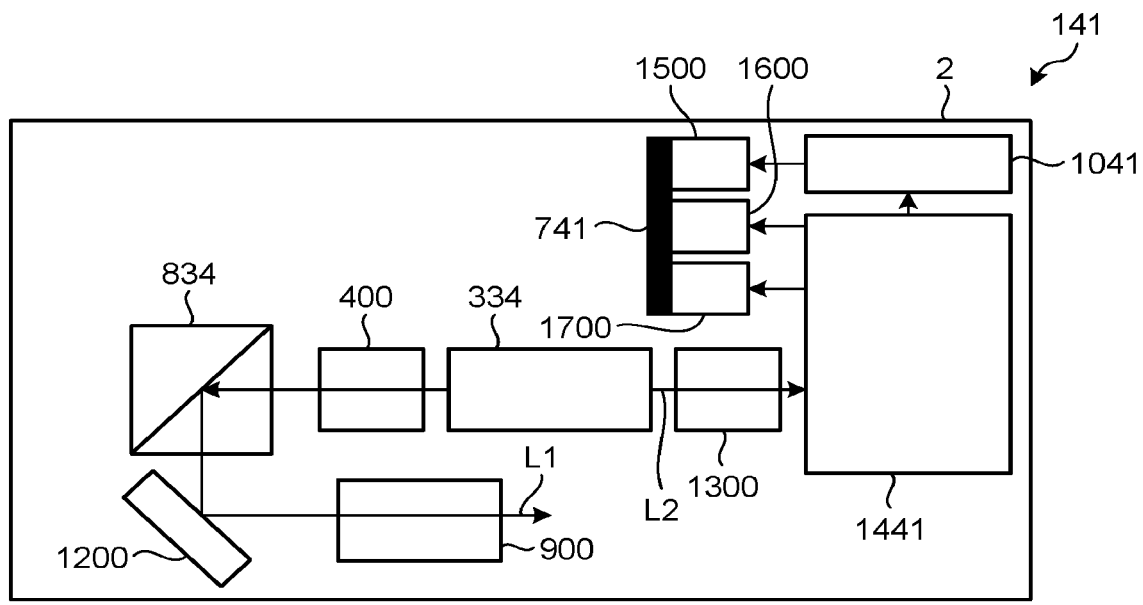
FIG. 41 is a plan view schematically illustrating the configuration of an optical module according to an eleventh embodiment.

Subsequently, an eleventh embodiment will be described below. FIG. 41 is a plan view schematically illustrating the configuration of an optical module according to the eleventh embodiment. This optical module 141 illustrated in FIG. 41 includes a wavelength detecting element 1441 and an etalon filter 1041 in place of the wavelength detecting element 1400 of the optical module 134 according to the ninth embodiment described above. In addition, the optical module 141 includes a shielding portion 741 in place of the shielding portion 734 described above.

The shielding portion 741 is formed of any of a light reflecting body that reflects stray light, a light scattering body that scatters stray light, and a light absorbing body that absorbs light. The shielding portion 741 is disposed through integral formation into a wall shape by applying resin on a surface of each of the light receiving element 1500, the light receiving element 1600, and the light receiving element 1700 on a side opposite to the light receiving surface thereof. The shielding portion 741 prevents stray light generated through reflection or scattering in the base unit 2 from being incident on the light receiving element 1500, the light receiving element 1600, and the light receiving element 1700.

The wavelength detecting element 1441 includes at least a light dividing unit (not illustrated) and two filter units (not illustrated). The light dividing unit divides the laser beam L2 into three laser beams so that one of the laser beams is incident on the etalon filter 1041. The filter units have periodic transmission characteristics for the frequency of light and transmit the two remaining laser beams obtained through the division by the light dividing unit so that the laser beams are incident on the light receiving element 1600 and the light receiving element 1700.

The etalon filter 1041 has a periodic transmission characteristic for the wavelength of light. The etalon filter 1041 transmits, to the light receiving element 1500, the laser beam L2 incident from the wavelength detecting element 1441.

According to the eleventh embodiment described above, since the shielding portion 741 is disposed through integral formation into a wall shape by applying resin on a surface of each of the light receiving element 1500, the light receiving element 1600, and the light receiving element 1700 on a side opposite to the light receiving surface thereof, it is possible to prevent, with a simple configuration, stray light generated through reflection or scattering at the lens 400 from being incident on the light receiving element 1500, the light receiving element 1600, and the light receiving element 1700.

First Modification of Eleventh Embodiment

Figure 42:
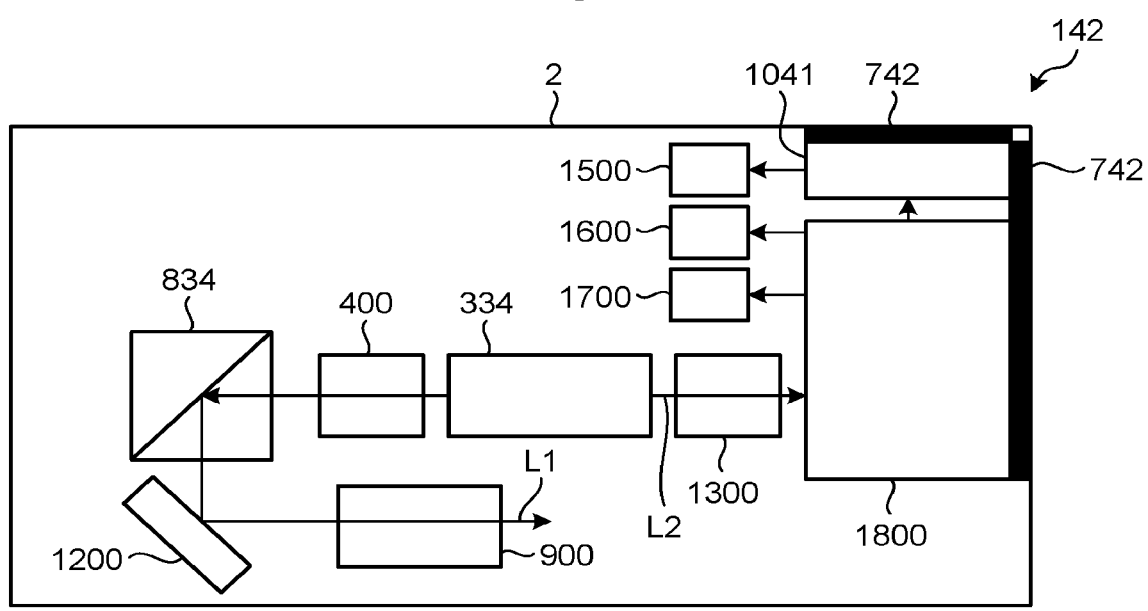
FIG. 42 is a plan view schematically illustrating the configuration of an optical module according to a first modification of the eleventh embodiment.

Subsequently, a first modification of the eleventh embodiment will be described below. FIG. 42 is a plan view schematically illustrating the configuration of an optical module according to the first modification of the eleventh embodiment. This optical module 142 illustrated in FIG. 42 includes a shielding portion 742 and a wavelength detecting filter 1800 in place of the shielding portion 741 and the wavelength detecting element 1441 in the eleventh embodiment described above.

The shielding portion 742 prevents stray light generated through reflection or scattering in the base unit 2 from being incident on the light receiving element 1500, the light receiving element 1600, and the light receiving element 1700. The shielding portion 742 is formed of any of a light reflecting body that reflects stray light, a light scattering body that scatters stray light, and a light absorbing body that absorbs light. The shielding portion 742 is disposed by applying resin on a side surface of each of the etalon filter 1041 and the wavelength detecting filter 1800. Specifically, the shielding portion 742 is disposed by applying resin on a side surface of each of the etalon filter 1041 and the wavelength detecting filter 1800, which is opposite to the light receiving element 1500, the light receiving element 1600, and the light receiving element 1700.

The wavelength detecting filter 1800 includes at least a light dividing unit (not illustrated) and two filter units (not illustrated). The light dividing unit divides the laser beam L2 into three laser beams so that one of the laser beams is incident on the etalon filter 1041. The filter units have periodic transmission characteristics for the frequency of light and transmit the two remaining laser beams obtained through the division by the light dividing unit so that the laser beams are incident on the light receiving element 1600 and the light receiving element 1700.

According to the first modification of the eleventh embodiment described above, since the shielding portion 742 is disposed by applying resin on a side surface of each of the etalon filter 1041 and the wavelength detecting filter 1800, which is opposite to the light receiving element 1500, the light receiving element 1600, and the light receiving element 1700, it is possible to prevent, with a simple configuration, stray light from being incident on the light receiving element 1500, the light receiving element 1600, and the light receiving element 1700.

Second Modification of Eleventh Embodiment

Figure 43:
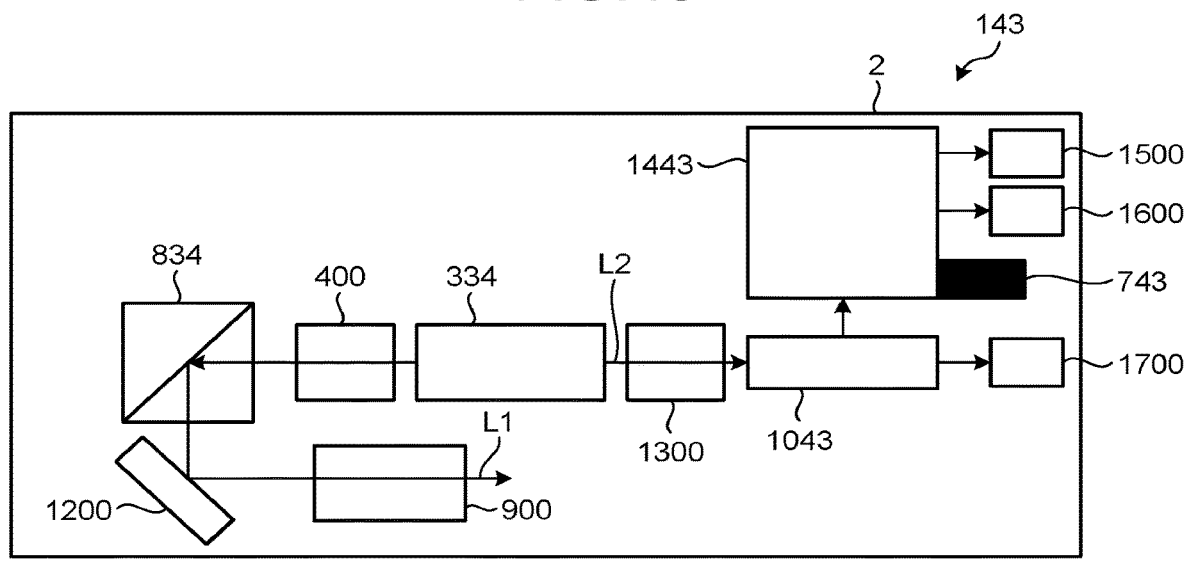
FIG. 43 is a plan view schematically illustrating the configuration of an optical module according to a second modification of the eleventh embodiment.

Subsequently, a second modification of the eleventh embodiment will be described below. FIG. 43 is a plan view schematically illustrating the configuration of an optical module according to the second modification of the eleventh embodiment. This optical module 143 according to the second modification of the eleventh embodiment includes a shielding portion 743, an etalon filter 1043, and a wavelength detecting element 1443 in place of the shielding portion 741, the etalon filter 1041, and the wavelength detecting element 1441 of the optical module 141 according to the eleventh embodiment described above.

The shielding portion 743 prevents stray light generated through reflection or scattering in the base unit 2 from being incident on the light receiving element 1500, the light receiving element 1600, and the light receiving element 1700. The shielding portion 743 is formed of any of a light reflecting body that reflects stray light, a light scattering body that scatters stray light, and a light absorbing body that absorbs light. The shielding portion 743 is disposed by applying resin on a side surface of the wavelength detecting element 1443. Specifically, the shielding portion 743 is disposed through formation by applying and protruding resin on a side surface of the wavelength detecting element 1443 positioned on a straight line connecting the light receiving element 1600 and the light receiving element 1700.

The etalon filter 1043 has a periodic transmission characteristic for the wavelength of light. The etalon filter 1043 reflects, to the wavelength detecting element 1443, the laser beam L2 incident from the coupling lens 1300, and transmits the remaining part of the laser beam L2 to the light receiving element 1700.

The wavelength detecting element 1443 includes at least a light dividing unit (not illustrated) and one filter unit (not illustrated). The light dividing unit divides the laser beam L2 into two beams so that one of the laser beams is incident on the light receiving element 1500. The filter unit has periodic transmission characteristics for the frequency of light and transmits the remaining laser beam obtained through the division by the light dividing unit so that the laser beam is incident on the light receiving element 1600.

According to the second modification of the eleventh embodiment described above, since the shielding portion 743 is disposed through formation by applying and protruding resin on a side surface of the wavelength detecting element 1443 positioned on a straight line connecting the light receiving element 1600 and the light receiving element 1700, it is possible to prevent, with a simple configuration, stray light from being incident on the light receiving element 1500, the light receiving element 1600, and the light receiving element 1700.

Third Modification of Eleventh Embodiment

Figure 44:
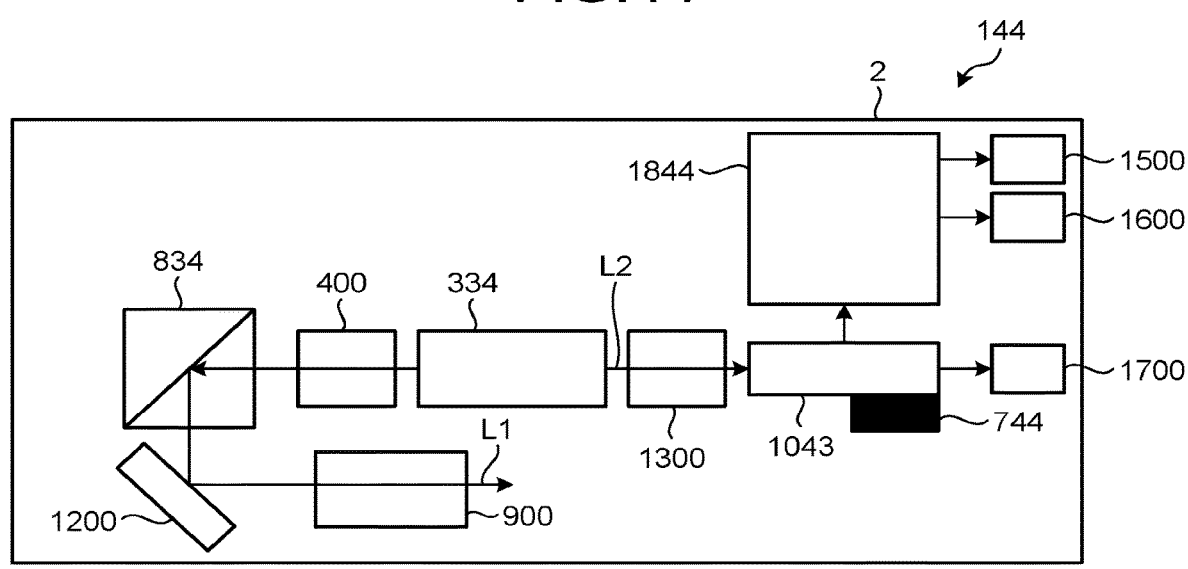
FIG. 44 is a plan view schematically illustrating the configuration of an optical module according to a third modification of the eleventh embodiment.

Subsequently, a third modification of the eleventh embodiment will be described below. FIG. 44 is a plan view schematically illustrating the configuration of an optical module according to the third modification of the eleventh embodiment. This optical module 144 illustrated in FIG. 44 includes a shielding portion 744 and a wavelength detecting filter 1844 in place of the shielding portion 743 and the wavelength detecting element 1443 in the second modification of the eleventh embodiment described above.

The shielding portion 744 prevents stray light generated through reflection or scattering in the base unit 2 from being incident on the light receiving element 1500, the light receiving element 1600, and the light receiving element 1700. The shielding portion 744 is formed of any of a light reflecting body that reflects stray light, a light scattering body that scatters stray light, and a light absorbing body that absorbs light. The shielding portion 744 is disposed through application on a side surface of the etalon filter 1043. Specifically, the shielding portion 744 is disposed by applying resin on a side surface of the etalon filter 1043 opposite to a side surface thereof that reflects the laser beam L2.

The wavelength detecting filter 1844 includes at least a light dividing unit (not illustrated) and one filter unit (not illustrated). The light dividing unit divides the laser beam L2 into two beams so that one of the laser beams is incident on the light receiving element 1500. The filter unit has periodic transmission characteristics for the frequency of light and transmits the remaining laser beam obtained through the division by the light dividing unit so that the laser beam is incident on the light receiving element 1600.

According to the third modification of the eleventh embodiment described above, since the shielding portion 744 is disposed by applying resin on a side surface of the etalon filter 1043 opposite to a side surface thereof that reflects the laser beam L2, it is possible to prevent, with a simple configuration, stray light from being incident on the light receiving element 1700.

Twelfth Embodiment

Figure 45:
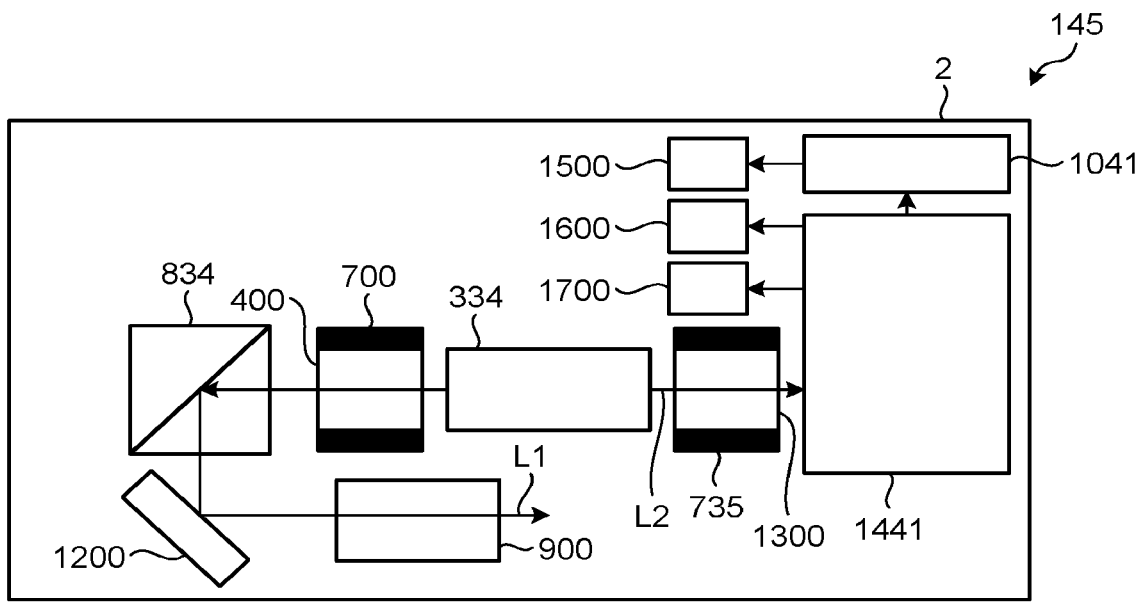
FIG. 45 is a plan view schematically illustrating the configuration of an optical module according to a twelfth embodiment.

Subsequently, a twelfth embodiment will be described below. FIG. 45 is a plan view schematically illustrating the configuration of an optical module according to the twelfth embodiment. This optical module 145 illustrated in FIG. 45 includes the shielding portion 700 and the shielding portion 735 described above in place of the shielding portion 741 of the optical module 141 according to the eleventh embodiment described above.

According to the twelfth embodiment described above, it is possible to prevent, with a simple configuration, stray light from being incident on the light receiving element 1500, the light receiving element 1600, and the light receiving element 1700.

First Modification of Twelfth Embodiment

Figure 46:
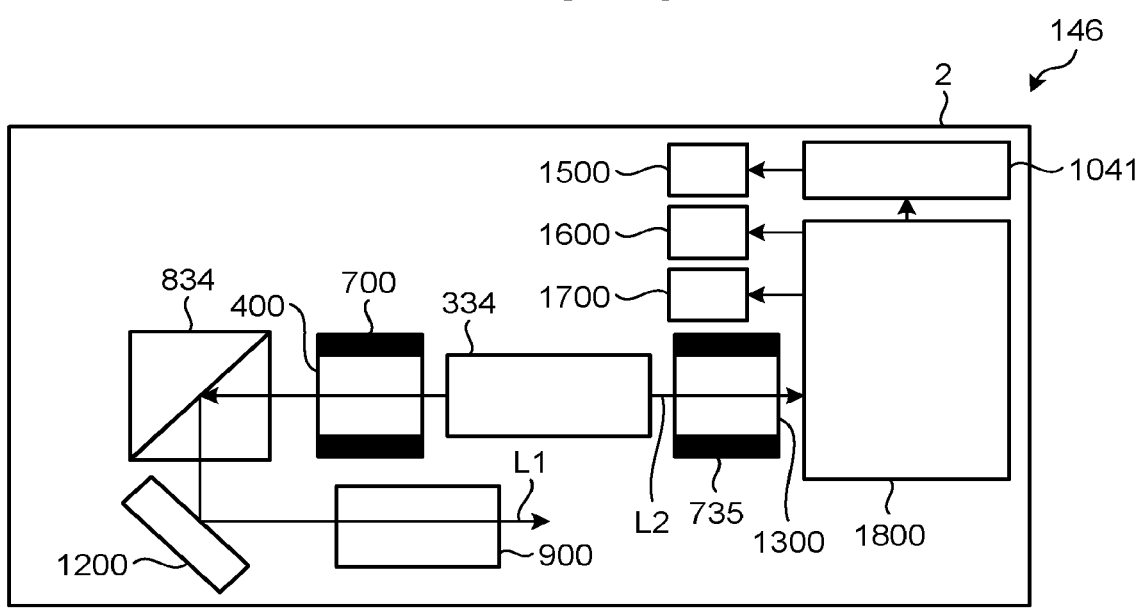
FIG. 46 is a plan view schematically illustrating the configuration of an optical module according to a first modification of the twelfth embodiment.

Subsequently, a first modification of the twelfth embodiment will be described below. FIG. 46 is a plan view schematically illustrating the configuration of an optical module according to the first modification of the twelfth embodiment. This optical module 146 illustrated in FIG. 46 includes the shielding portion 700 and the shielding portion 735 described above in place of the shielding portion 742 of the optical module 142 according to the first modification of the eleventh embodiment described above.

According to the first modification of the twelfth embodiment described above, it is possible to prevent, with a simple configuration, stray light from being incident on the light receiving element 1500, the light receiving element 1600, and the light receiving element 1700.

Second Modification of Twelfth Embodiment

Figure 47:
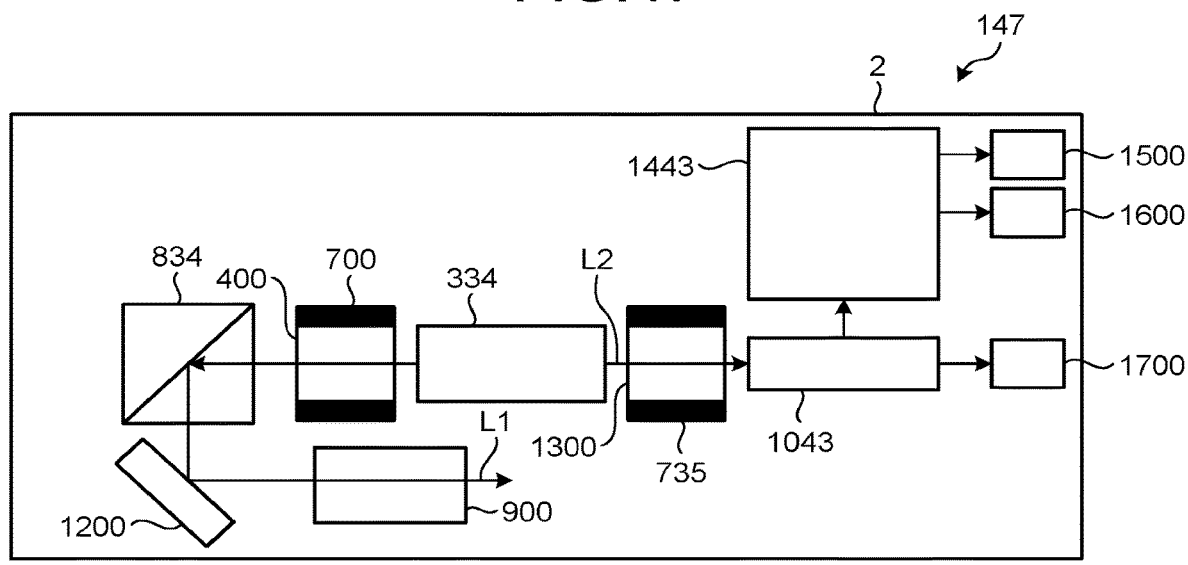
FIG. 47 is a plan view schematically illustrating the configuration of an optical module according to a second modification of the twelfth embodiment.

Subsequently, a second modification of the twelfth embodiment will be described below. FIG. 47 is a plan view schematically illustrating the configuration of an optical module according to the second modification of the twelfth embodiment. This optical module 147 illustrated in FIG. 47 includes the shielding portion 700 and the shielding portion 735 described above in place of the shielding portion 743 of the optical module 143 according to the second modification of the eleventh embodiment described above.

According to the second modification of the twelfth embodiment described above, it is possible to prevent, with a simple configuration, stray light from being incident on the light receiving element 1500, the light receiving element 1600, and the light receiving element 1700.

Third Modification of Twelfth Embodiment

Figure 48:
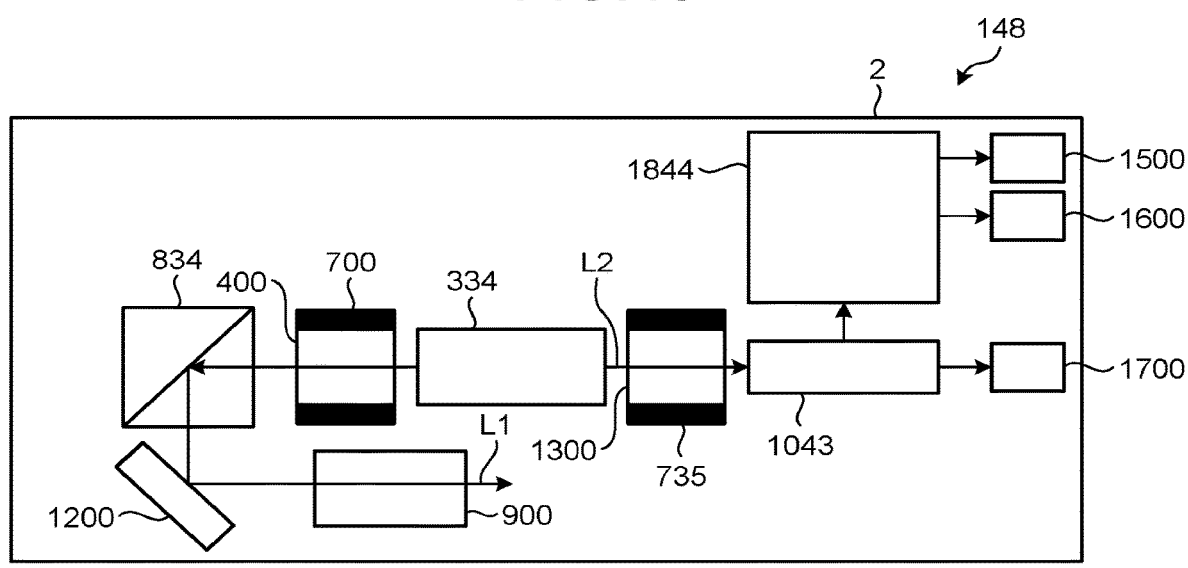
FIG. 48 is a plan view schematically illustrating the configuration of an optical module according to a third modification of the twelfth embodiment.

Subsequently, a third modification of the twelfth embodiment will be described below. FIG. 48 is a plan view schematically illustrating the configuration of an optical module according to the third modification of the twelfth embodiment. This optical module 148 illustrated in FIG. 48 includes the shielding portion 700 and the shielding portion 735 described above in place of the shielding portion 744 of the optical module 144 according to the third modification of the eleventh embodiment described above.

According to the third modification of the twelfth embodiment described above, it is possible to prevent, with a simple configuration, stray light from being incident on the light receiving element 1500, the light receiving element 1600, and the light receiving element 1700.

Thirteenth Embodiment

Figure 49:
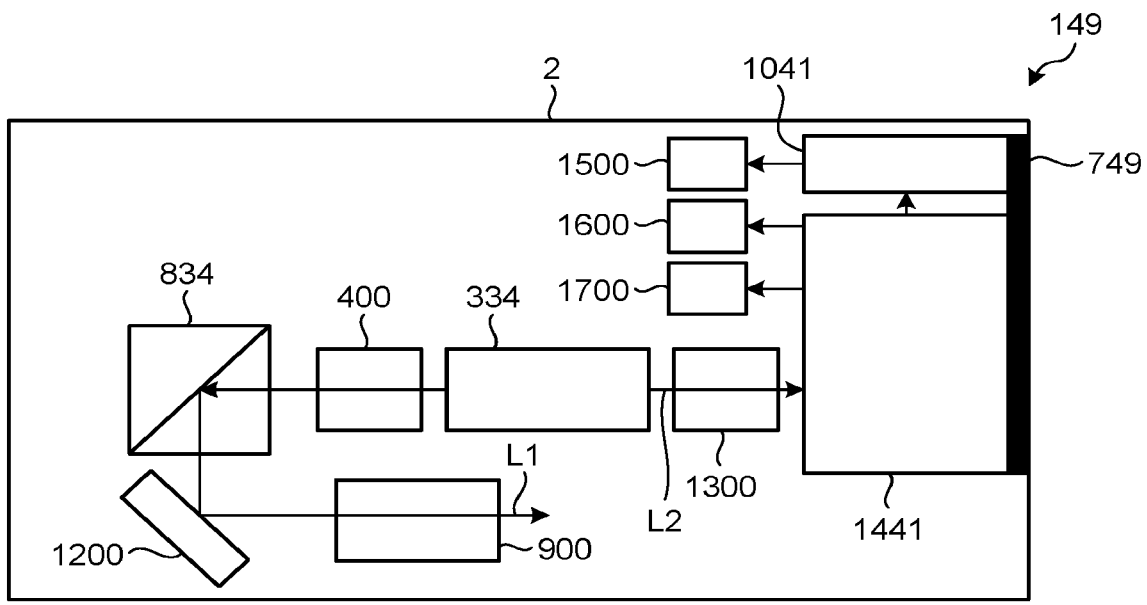
FIG. 49 is a plan view schematically illustrating the configuration of an optical module according to a thirteenth embodiment.

Subsequently, a thirteenth embodiment will be described below. FIG. 49 is a plan view schematically illustrating the configuration of an optical module according to the thirteenth embodiment. This optical module 149 illustrated in FIG. 49 includes a shielding portion 749 in place of the shielding portion 741 of the optical module 141 according to the eleventh embodiment described above.

The shielding portion 749 prevents stray light generated through reflection or scattering in the base unit 2 from being incident on the light receiving element 1500, the light receiving element 1600, and the light receiving element 1700. The shielding portion 749 is formed of any of a light reflecting body that reflects stray light, a light scattering body that scatters stray light, and a light absorbing body that absorbs light. The shielding portion 749 is disposed through application on a side surface of each of the wavelength detecting element 1441 and the etalon filter 1041. Specifically, the shielding portion 749 is disposed by applying resin on a side surface of each of the wavelength detecting element 1441 and the etalon filter 1041, which is opposite to an incident edge at which the laser beam L2 incident from the coupling lens 1300 is incident.

According to the thirteenth embodiment described above, since the shielding portion 749 is disposed by applying resin on a side surface of each of the wavelength detecting element 1441 and the etalon filter 1041, which is opposite to the incident edge at which the laser beam L2 incident from the coupling lens 1300 is incident, it is possible to prevent, with a simple configuration, stray light from being incident on the light receiving element 1500, the light receiving element 1600, and the light receiving element 1700.

First Modification of Thirteenth Embodiment

Figure 50:
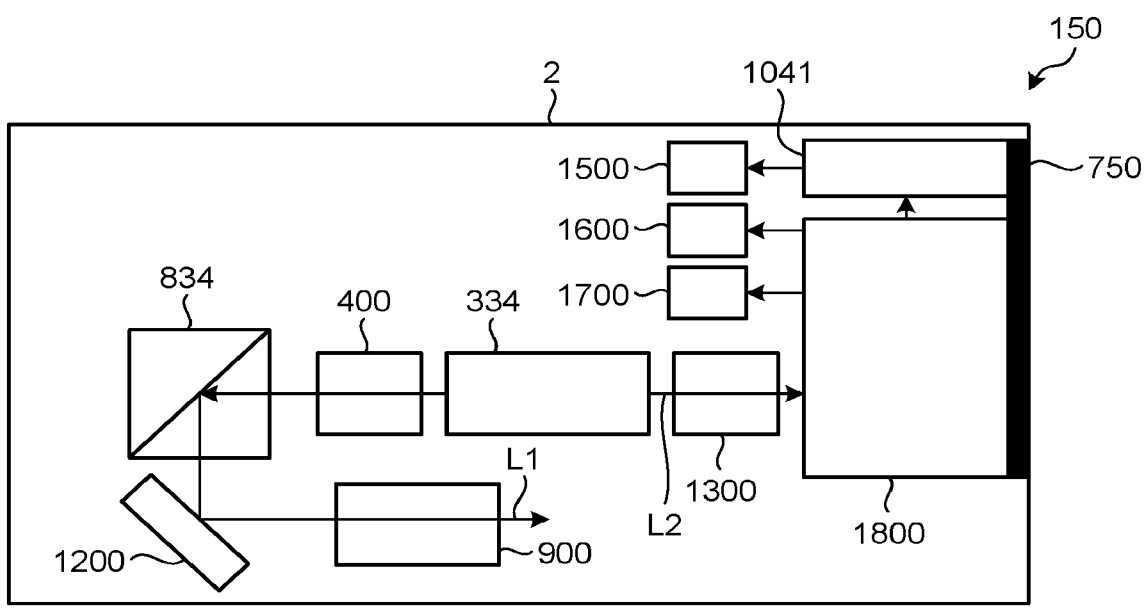
FIG. 50 is a plan view schematically illustrating the configuration of an optical module according to a first modification of the thirteenth embodiment.

Subsequently, a first modification of the thirteenth embodiment will be described below. FIG. 50 is a plan view schematically illustrating the configuration of an optical module according to the first modification of the thirteenth embodiment. This optical module 150 illustrated in FIG. 50 includes a shielding portion 750 in place of the shielding portion 742 of the optical module 142 according to the first modification of the eleventh embodiment described above.

The shielding portion 750 prevents stray light generated through reflection or scattering in the base unit 2 from being incident on the light receiving element 1500, the light receiving element 1600, and the light receiving element 1700. The shielding portion 750 is formed of any of a light reflecting body that reflects stray light, a light scattering body that scatters stray light, and a light absorbing body that absorbs light. The shielding portion 750 is disposed by applying resin on a side surface of each of the wavelength detecting filter 1800 and the etalon filter 1041. Specifically, the shielding portion 750 is disposed by applying resin on a side surface of each of the wavelength detecting filter 1800 and the etalon filter 1041, which is opposite to an emission side on which the wavelength detecting filter 1800 and the etalon filter 1041 emit the laser beams L2.

According to the first modification of the thirteenth embodiment described above, it is possible to prevent, with a simple configuration, stray light from being incident on the light receiving element 1500, the light receiving element 1600, and the light receiving element 1700.

Second Modification of Thirteenth Embodiment

Figure 51:
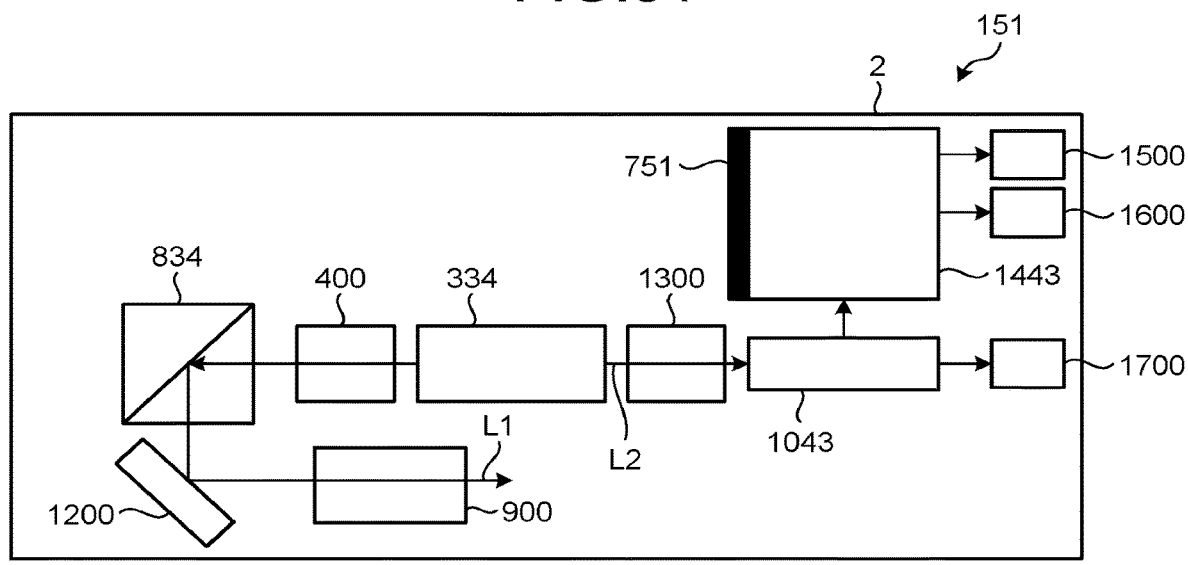
FIG. 51 is a plan view schematically illustrating the configuration of an optical module according to a second modification of the thirteenth embodiment.

Subsequently, a second modification of the thirteenth embodiment will be described below. FIG. 51 is a plan view schematically illustrating the configuration of an optical module according to the second modification of the thirteenth embodiment. This optical module 151 illustrated in FIG. 51 includes a shielding portion 751 in place of the shielding portion 743 of the optical module 143 according to the second modification of the eleventh embodiment described above.

The shielding portion 751 prevents stray light generated through reflection or scattering in the base unit 2 from being incident on the light receiving element 1500, the light receiving element 1600, and the light receiving element 1700. The shielding portion 751 is formed of any of a light reflecting body that reflects stray light, a light scattering body that scatters stray light, and a light absorbing body that absorbs light. The shielding portion 751 is disposed by applying resin on a side surface of the wavelength detecting element 1443. Specifically, the shielding portion 751 is disposed by applying resin on a side surface of the wavelength detecting element 1443, which is opposite to an emission side on which the wavelength detecting element 1443 emits the laser beam L2.

According to the second modification of the thirteenth embodiment described above, it is possible to prevent, with a simple configuration, stray light from being incident on the light receiving element 1500, the light receiving element 1600, and the light receiving element 1700.

Third Modification of Thirteenth Embodiment

Figure 52:
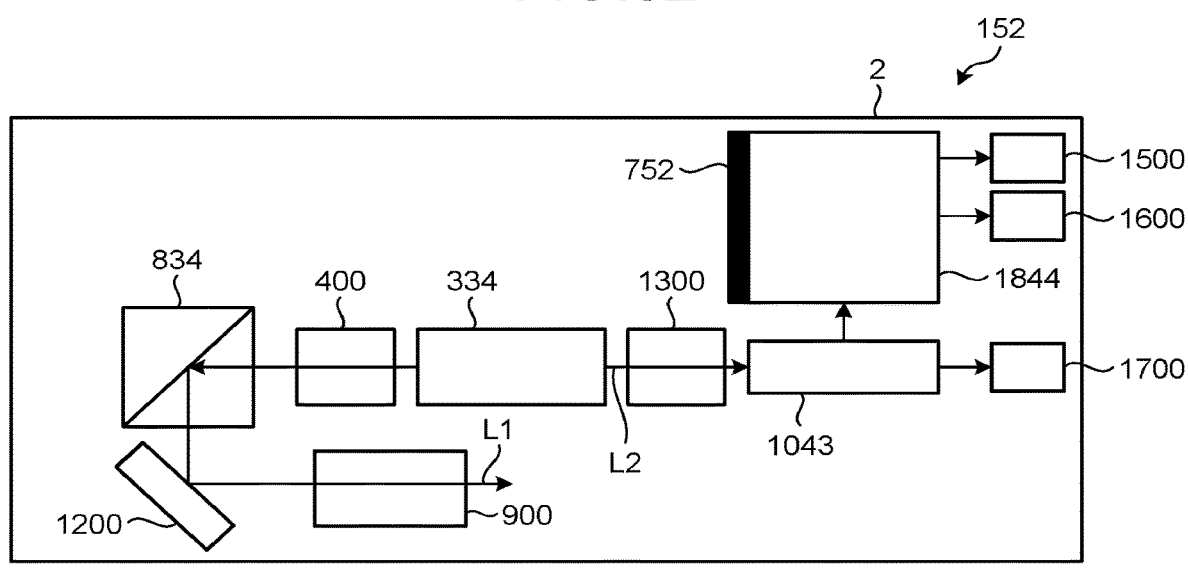
FIG. 52 is a plan view schematically illustrating the configuration of an optical module according to a third modification of the thirteenth embodiment.

Subsequently, the third modification of the thirteenth embodiment will be described below. FIG. 52 is a plan view schematically illustrating the configuration of an optical module according to a third modification of the thirteenth embodiment. This optical module 152 illustrated in FIG. 52 includes a shielding portion 752 in place of the shielding portion 744 of the optical module 144 according to the third modification of the eleventh embodiment described above.

The shielding portion 752 prevents stray light generated through reflection or scattering in the base unit 2 from being incident on the light receiving element 1500, the light receiving element 1600, and the light receiving element 1700. The shielding portion 752 is formed of any of a light reflecting body that reflects stray light, a light scattering body that scatters stray light, and a light absorbing body that absorbs light. The shielding portion 752 is disposed by applying resin on a side surface of the wavelength detecting filter 1844. Specifically, the shielding portion 752 is disposed by applying resin on a side surface of the wavelength detecting filter 1844, which is opposite to an emission side on which the wavelength detecting filter 1844 emits the laser beam L2.

According to the third modification of the thirteenth embodiment described above, since the shielding portion 752 is disposed by applying resin on a side surface of the wavelength detecting filter 1844, which is opposite to the emission side on which the wavelength detecting filter 1844 emits the laser beam L2, it is possible to prevent, with a simple configuration, stray light from being incident on the light receiving element 1500, the light receiving element 1600, and the light receiving element 1700.

Fourteenth Embodiment

Figure 53:
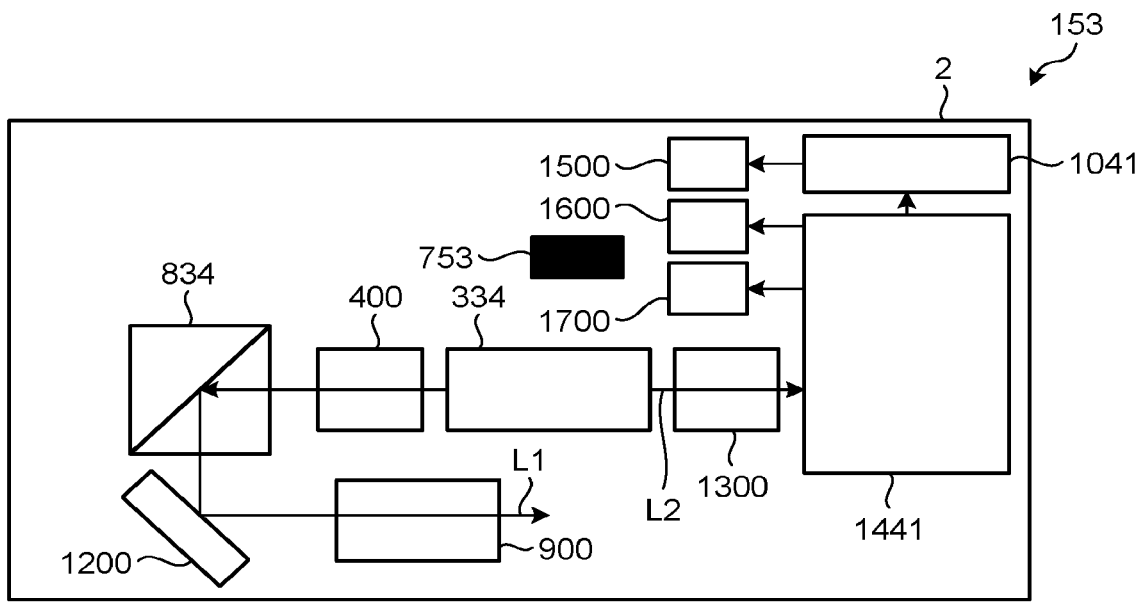
FIG. 53 is a plan view schematically illustrating the configuration of an optical module according to a fourteenth embodiment.

Subsequently, a fourteenth embodiment will be described below. FIG. 53 is a plan view schematically illustrating the configuration of an optical module according to the fourteenth embodiment. This optical module 153 illustrated in FIG. 53 includes the shielding portion 753 in place of a shielding portion 741 of the optical module 141 according to the eleventh embodiment described above.

The shielding portion 753 is disposed through formation into a wall shape by applying and upraising resin on the base unit 2 on a straight line connecting the lens 400 and the light receiving element 1600. The shielding portion 753 prevents stray light generated through reflection or scattering in the base unit 2 from being incident on the light receiving element 1500, the light receiving element 1600, and the light receiving element 1700. The shielding portion 753 is formed of any of a light reflecting body that reflects stray light, a light scattering body that scatters stray light, and a light absorbing body that absorbs light.

According to the fourteenth embodiment described above, since the shielding portion 753 is disposed through formation into a wall shape by applying and upraising resin on the base unit 2 on a straight line connecting the lens 400 and the light receiving element 1600, it is possible to prevent, with a simple configuration, stray light from being incident on the light receiving element 1500, the light receiving element 1600, and the light receiving element 1700.

First Modification of Fourteenth Embodiment

Figure 54:
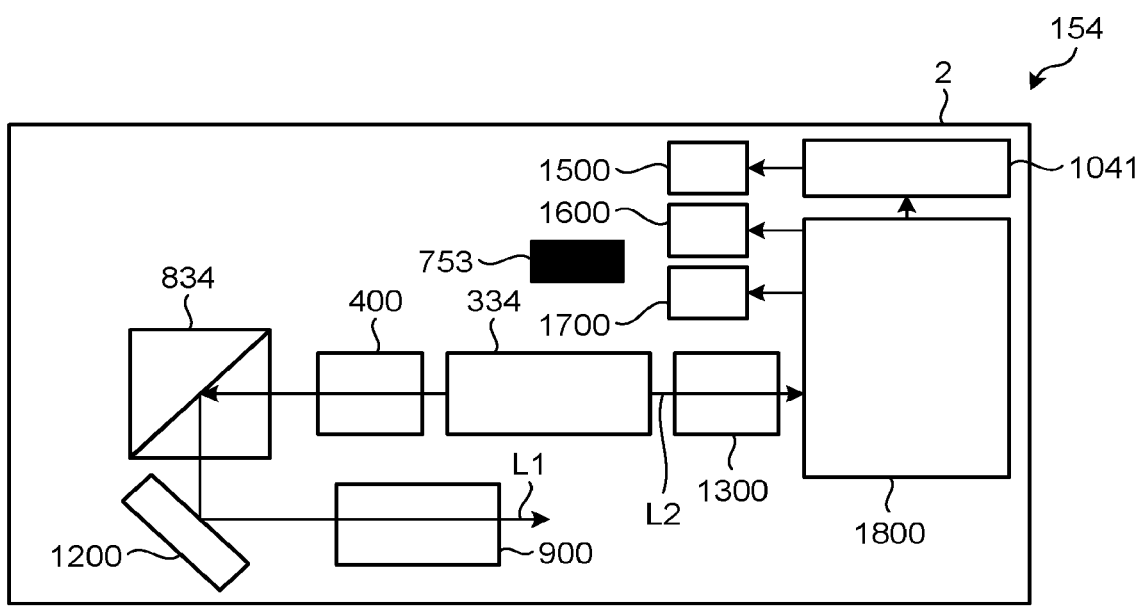
FIG. 54 is a plan view schematically illustrating the configuration of an optical module according to a first modification of the fourteenth embodiment.

Subsequently, a first modification of the fourteenth embodiment will be described below. FIG. 54 is a plan view schematically illustrating the configuration of an optical module according to the first modification of the fourteenth embodiment. This optical module 154 illustrated in FIG. 54 includes the shielding portion 753 in the fourteenth embodiment described above in place of the shielding portion 742 of the optical module 142 according to the first modification of the eleventh embodiment described above.

According to the first modification of the fourteenth embodiment described above, it is possible to prevent, with a simple configuration, stray light from being incident on the light receiving element 1500, the light receiving element 1600, and the light receiving element 1700.

Second Modification of Fourteenth Embodiment

Figure 55:
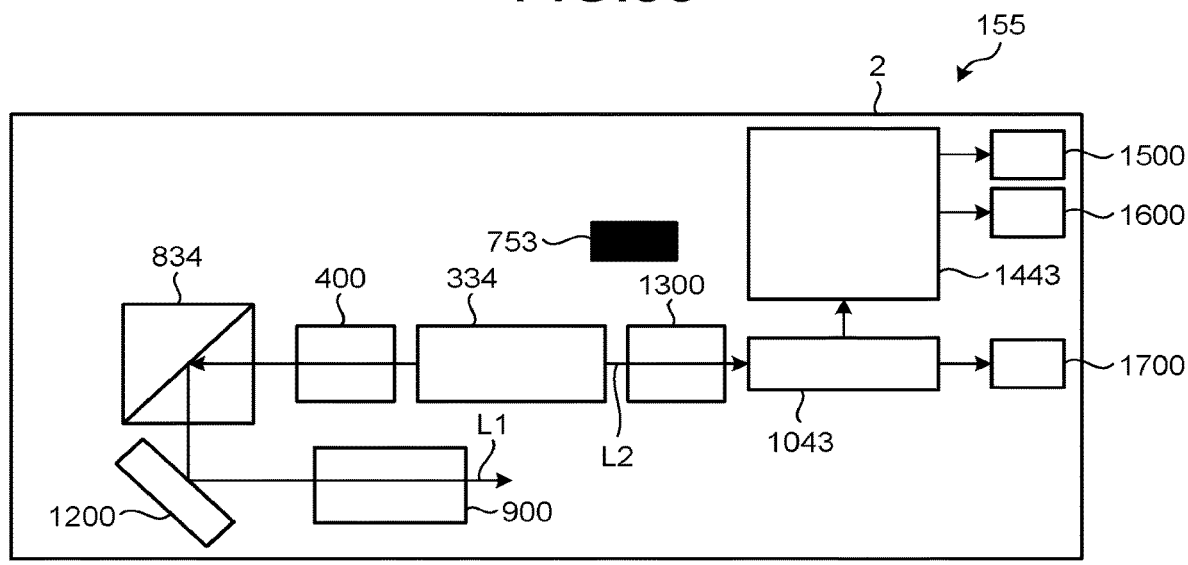
FIG. 55 is a plan view schematically illustrating the configuration of an optical module according to a second modification of the fourteenth embodiment.

Subsequently, a second modification of the fourteenth embodiment will be described below. FIG. 55 is a plan view schematically illustrating the configuration of an optical module according to the second modification of the fourteenth embodiment. This optical module 155 illustrated in FIG. 55 includes the shielding portion 753 according to the fourteenth embodiment described above in place of the shielding portion 743 of the optical module 143 according to the second modification of the eleventh embodiment described above.

According to the second modification of the fourteenth embodiment described above, it is possible to prevent, with a simple configuration, stray light from being incident on the light receiving element 1500, the light receiving element 1600, and the light receiving element 1700.

Third Modification of Fourteenth Embodiment

Figure 56:
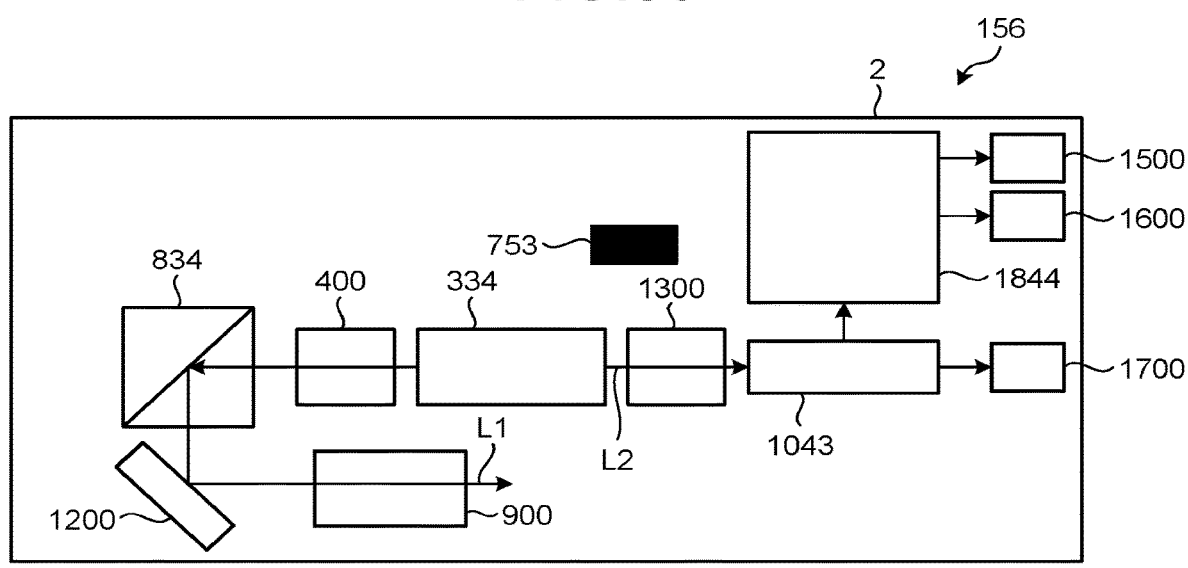
FIG. 56 is a plan view schematically illustrating the configuration of an optical module according to a third modification of the fourteenth embodiment.

Subsequently, a third modification of the fourteenth embodiment will be described below. FIG. 56 is a plan view schematically illustrating the configuration of an optical module according to the third modification of the fourteenth embodiment. This optical module 156 illustrated in FIG. 56 includes the shielding portion 753 described above in place of the shielding portion 744 of the optical module 144 according to the third modification of the eleventh embodiment described above.

According to the third modification of the fourteenth embodiment described above, it is possible to prevent, with a simple configuration, stray light from being incident on the light receiving element 1500, the light receiving element 1600, and the light receiving element 1700.

Fifteenth Embodiment

Figure 57:
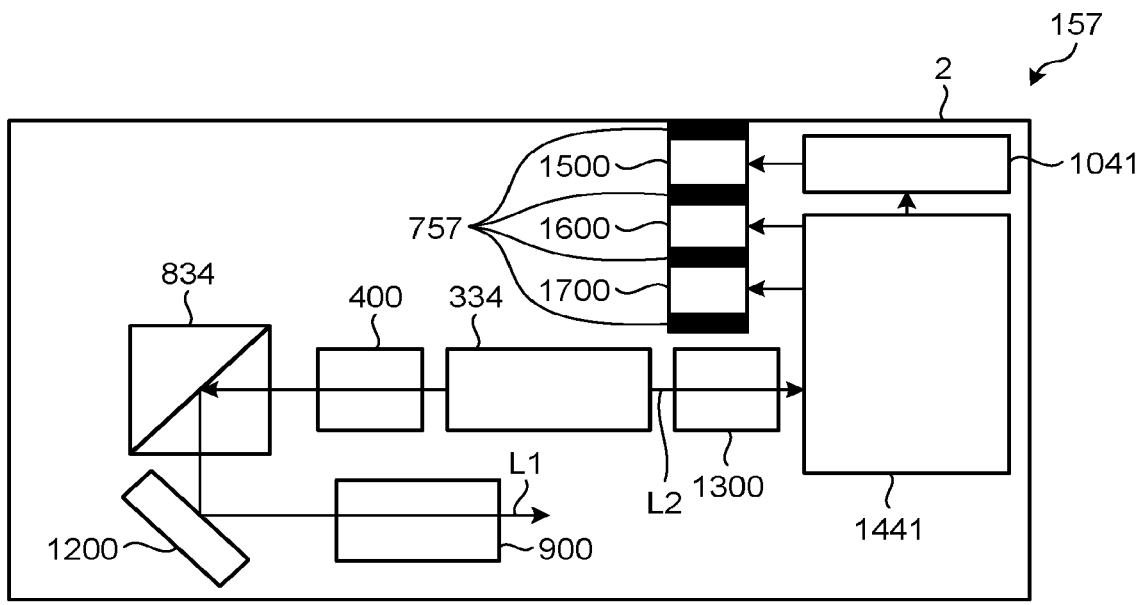
FIG. 57 is a plan view schematically illustrating the configuration of an optical module according to a fifteenth embodiment.

Subsequently, a fifteenth embodiment will be described below. FIG. 57 is a plan view schematically illustrating the configuration of an optical module according to the fifteenth embodiment. This optical module 157 illustrated in FIG. 57 includes a shielding portion 757 in place of the shielding portion 741 of the optical module 141 according to the eleventh embodiment described above.

The shielding portion 757 prevents stray light generated through reflection or scattering in the base unit 2 from being incident on the light receiving element 1500, the light receiving element 1600, and the light receiving element 1700. The shielding portion 757 is formed of any of a light reflecting body that reflects stray light, a light scattering body that scatters stray light, and a light absorbing body that absorbs light. The shielding portion 757 is disposed by applying resin on both edges of each of the light receiving element 1500, the light receiving element 1600, and the light receiving element 1700. Specifically, the shielding portion 757 is disposed by applying resin on both edges in a direction orthogonal to the light receiving surface of the light receiving element 1600 on which the light receiving element 1600 receives the laser beam L2.

According to the fifteenth embodiment described above, since the shielding portion 757 is disposed by applying resin on both edges of each of the light receiving element 1500, the light receiving element 1600, and the light receiving element 1700, it is possible to prevent, with a simple configuration, stray light from being incident on the light receiving element 1500, the light receiving element 1600, and the light receiving element 1700.

First Modification of Fifteenth Embodiment

Figure 58:
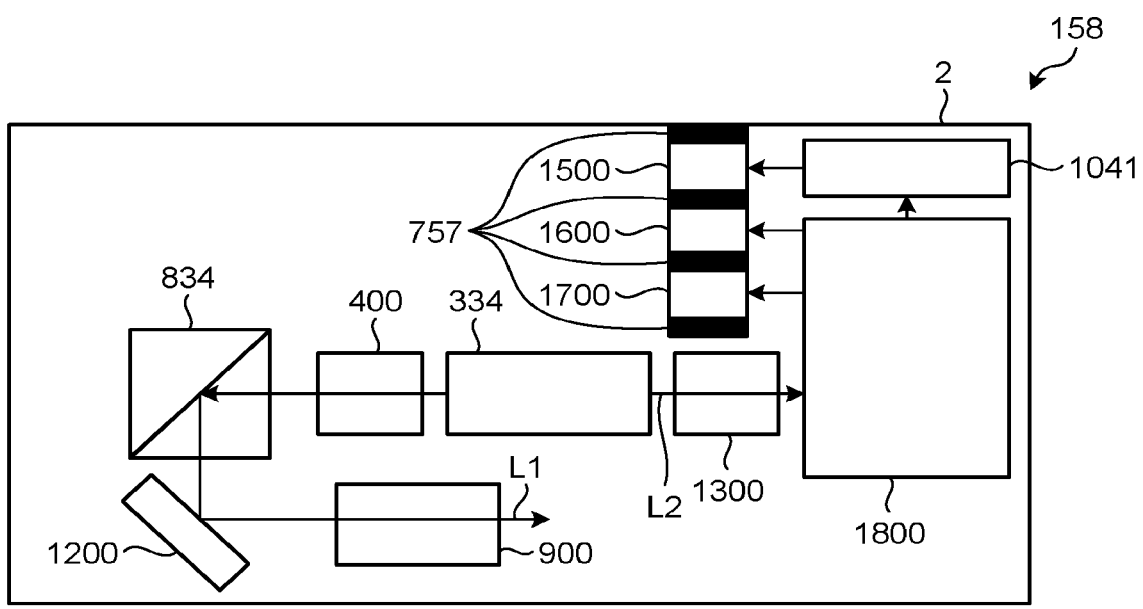
FIG. 58 is a plan view schematically illustrating the configuration of an optical module according to a first modification of the fifteenth embodiment.

Subsequently, a first modification of the fifteenth embodiment will be described below. FIG. 58 is a plan view schematically illustrating the configuration of an optical module according to the first modification of the fifteenth embodiment. This optical module 158 illustrated in FIG. 58 includes the shielding portion 757 in the fifteenth embodiment described above in place of the shielding portion 742 of the optical module 142 according to the first modification of the eleventh embodiment described above.

According to the first modification of the fifteenth embodiment described above, it is possible to prevent, with a simple configuration, stray light from being incident on the light receiving element 1500, the light receiving element 1600, and the light receiving element 1700.

Second Modification of Fifteenth Embodiment

Figure 59:
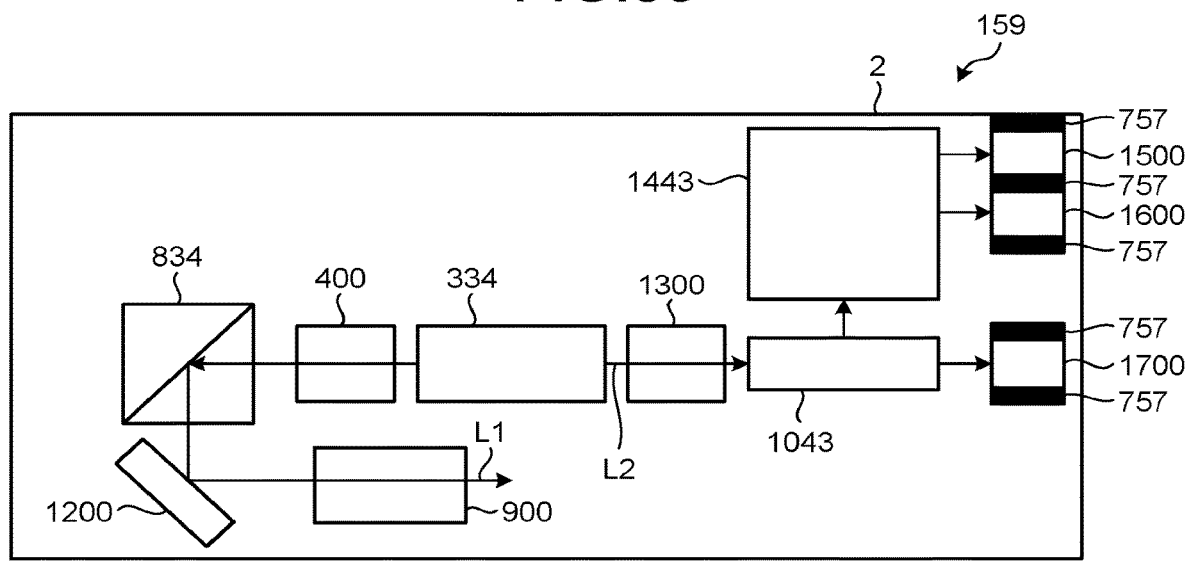
FIG. 59 is a plan view schematically illustrating the configuration of an optical module according to a second modification of the fifteenth embodiment.

Subsequently, a second modification of the fifteenth embodiment will be described below. FIG. 59 is a plan view schematically illustrating the configuration of an optical module according to the second modification of the fifteenth embodiment. This optical module 159 illustrated in FIG. 59 includes the shielding portion 757 described above in place of the shielding portion 743 of the optical module 143 according to the second modification of the eleventh embodiment described above.

According to the second modification of the fifteenth embodiment described above, it is possible to prevent, with a simple configuration, stray light from being incident on the light receiving element 1500, the light receiving element 1600, and the light receiving element 1700.

Third Modification of Fifteenth Embodiment

Figure 60:
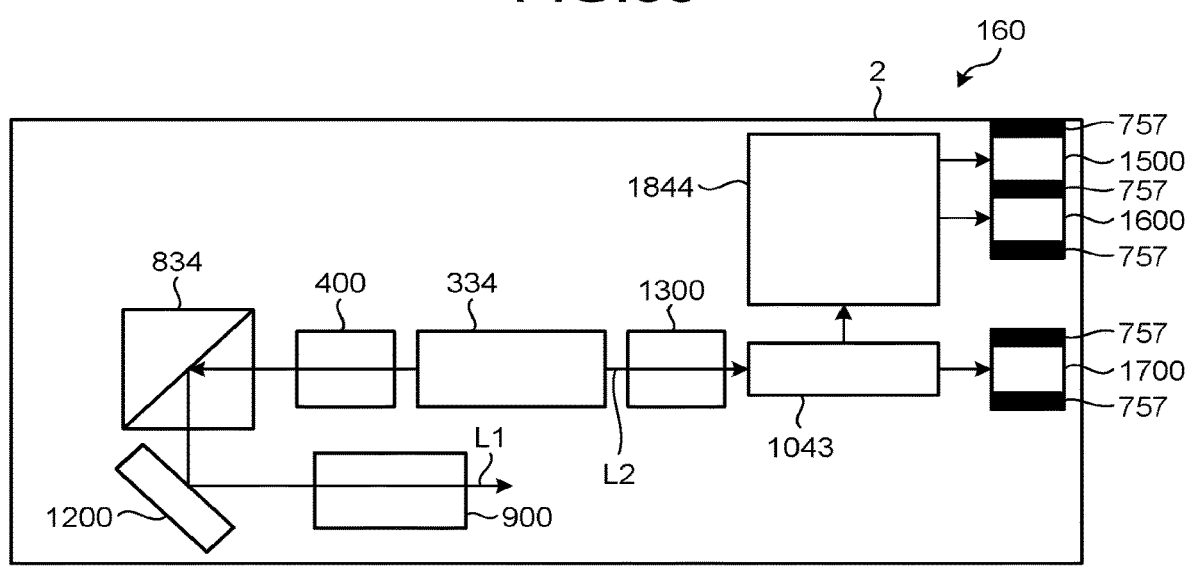
FIG. 60 is a plan view schematically illustrating the configuration of an optical module according to a third modification of the fifteenth embodiment.

Subsequently, the third modification of the fifteenth embodiment will be described below. FIG. 60 is a plan view schematically illustrating the configuration of an optical module according to a third modification of the fifteenth embodiment. This optical module 160 illustrated in FIG. 60 includes the shielding portion 757 described above in place of the shielding portion 744 of the optical module 144 according to the third modification of the eleventh embodiment described above.

According to the third modification of the fifteenth embodiment described above, it is possible to prevent, with a simple configuration, stray light from being incident on the light receiving element 1500, the light receiving element 1600, and the light receiving element 1700.

Sixteenth Embodiment

Figure 61:
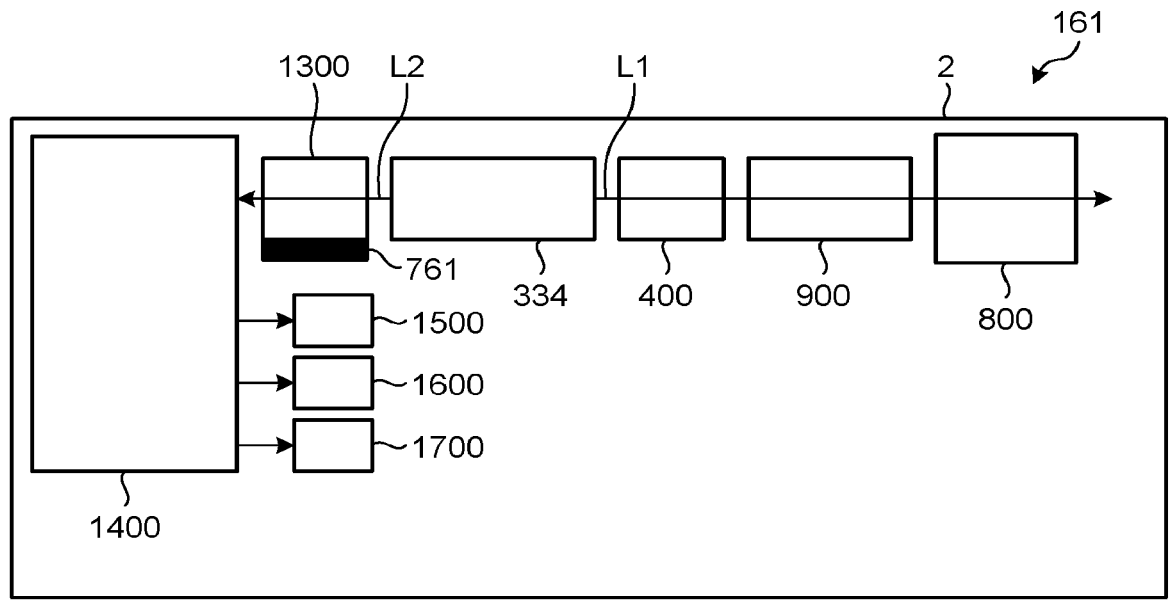
FIG. 61 is a plan view schematically illustrating the configuration of an optical module according to a sixteenth embodiment.

Subsequently, a sixteenth embodiment will be described below. FIG. 61 is a plan view schematically illustrating the configuration of an optical module according to the sixteenth embodiment. In this optical module 161 illustrated in FIG. 61, the lens 400, the optical isolator 900, and the beam splitter 800 are disposed in the base unit 2 in the stated order in an emission direction in which the light emitting element 334 emits the laser beam L1. In addition, in the optical module 161, the coupling lens 1300, the wavelength detecting element 1400, and the light receiving elements (the light receiving element 1500, the light receiving element 1600, and the light receiving element 1700) are disposed in the base unit 2 in an emission direction in which the light emitting element 334 emits the laser beam L2. The optical module 161 also includes a shielding portion 761.

The shielding portion 761 prevents stray light generated through reflection or scattering in the base unit 2 from being incident on the light receiving element 600. The shielding portion 761 is formed of any of a light reflecting body that reflects stray light, a light scattering body that scatters stray light, and a light absorbing body that absorbs light. The shielding portion 761 is disposed by applying resin on a side surface of the coupling lens 1300. Specifically, the shielding portion 761 is disposed by applying resin on a side surface of the coupling lens 1300 on a straight line connecting the coupling lens 1300 and the light receiving element 1500.

According to the sixteenth embodiment described above, since the shielding portion 761 is disposed by applying resin on a side surface of the coupling lens 1300 on a straight line connecting the coupling lens 1300 and the light receiving element 1500, it is possible to prevent, with a simple configuration, stray light from being incident on the light receiving element 1500, the light receiving element 1600, and the light receiving element 1700.

First Modification of Sixteenth Embodiment

Figure 62:
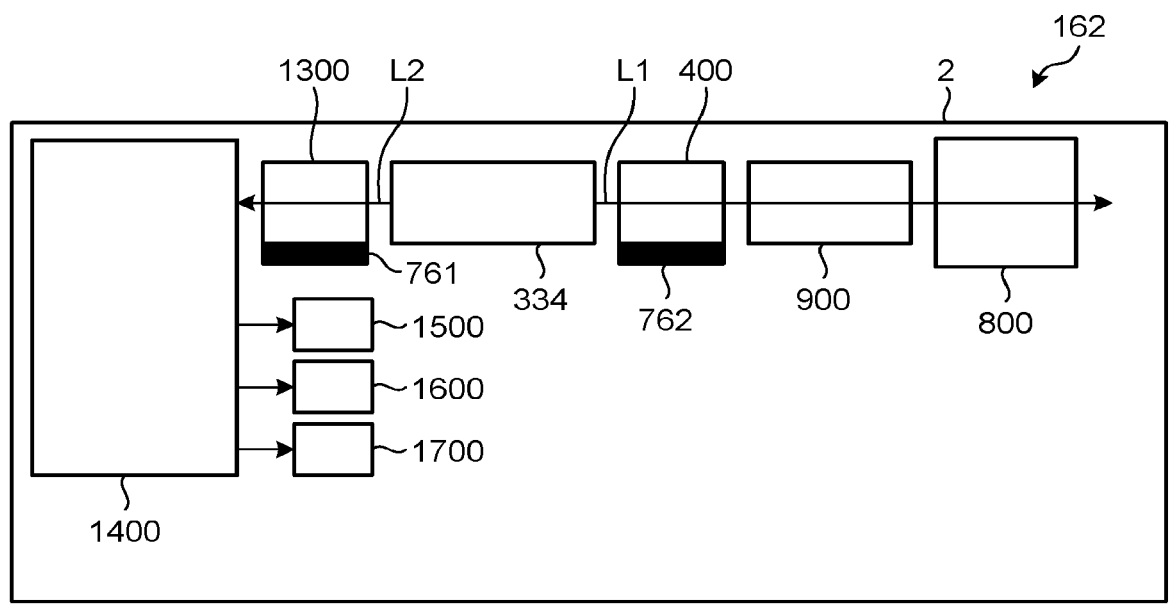
FIG. 62 is a plan view schematically illustrating the configuration of an optical module according to a first modification of the sixteenth embodiment.

Subsequently, a first modification of the sixteenth embodiment will be described below. FIG. 62 is a plan view schematically illustrating the configuration of an optical module according to the first modification of the sixteenth embodiment. This optical module 162 illustrated in FIG. 62 further includes a shielding portion 762 in addition to the configuration of the sixteenth embodiment described above.

The shielding portion 762 prevents stray light generated through reflection or scattering in the base unit 2 from being incident on the light receiving element 600. The shielding portion 762 is disposed by using any of a light reflecting body that reflects stray light, a light scattering body that scatters stray light, and a light absorbing body that absorbs light. The shielding portion 762 is formed through application on a side surface of the lens 400. Specifically, the shielding portion 762 is disposed by applying resin on a side surface of the lens 400 on a straight line connecting the lens 400 and the light receiving element 1500.

According to the first modification of the sixteenth embodiment described above, it is possible to prevent stray light generated at the lens 400 from being incident on the light receiving element 1500, the light receiving element 1600, and the light receiving element 1700.

Second Modification of Sixteenth Embodiment

Figure 63:
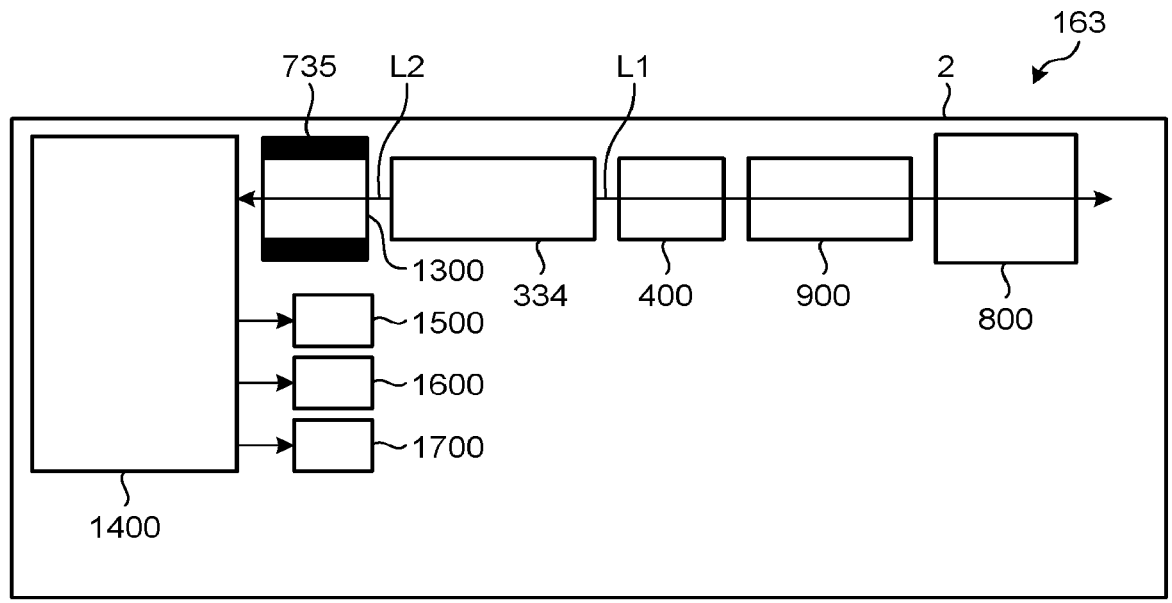
FIG. 63 is a plan view schematically illustrating the configuration of an optical module according to a second modification of the sixteenth embodiment.

Subsequently, a second modification of the sixteenth embodiment will be described below. FIG. 63 is a plan view schematically illustrating the configuration of an optical module according to the second modification of the sixteenth embodiment. This optical module 163 illustrated in FIG. 63 includes the shielding portion 735 described above in place of the shielding portion 761 of the optical module 161 according to the sixteenth embodiment described above.

According to the second modification of the sixteenth embodiment described above, it is possible to prevent, with a simple configuration, stray light from being incident on the light receiving element 1500, the light receiving element 1600, and the light receiving element 1700.

Third Modification of Sixteenth Embodiment

Figure 64:
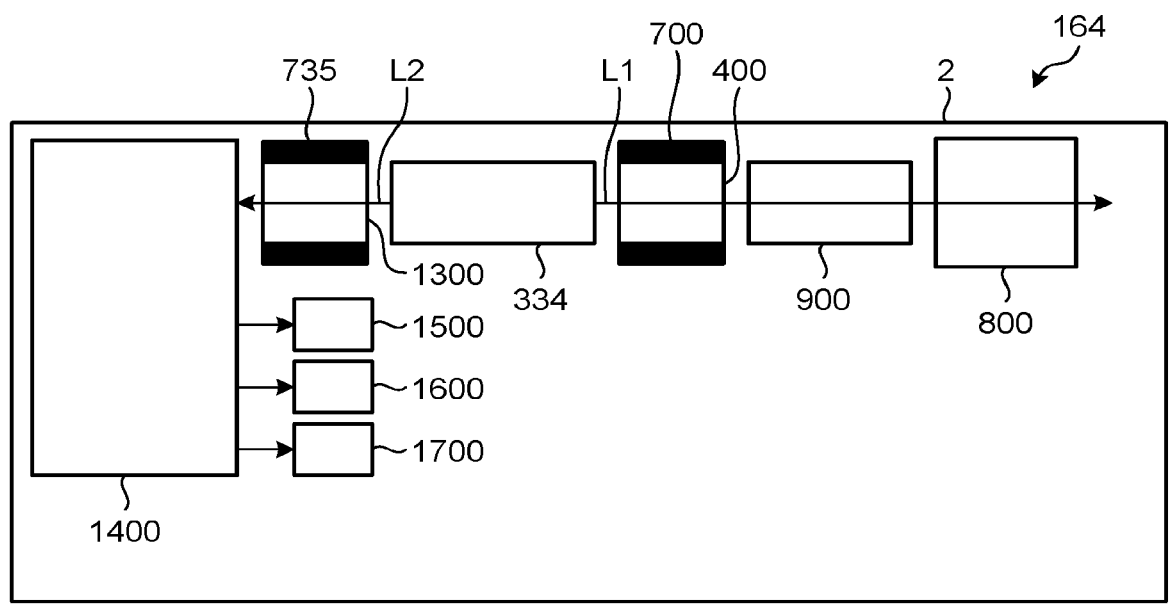
FIG. 64 is a plan view schematically illustrating the configuration of an optical module according to a third modification of the sixteenth embodiment.

Subsequently, a third modification of the sixteenth embodiment will be described below. FIG. 64 is a plan view schematically illustrating the configuration of an optical module according to the third modification of the sixteenth embodiment. This optical module 164 illustrated in FIG. 64 further includes the shielding portion 700 described above in addition to the configuration of the second modification of the sixteenth embodiment described above.

According to the third modification of the sixteenth embodiment described above, it is possible to prevent, with a simple configuration, stray light from being incident on the light receiving element 1500, the light receiving element 1600, and the light receiving element 1700.

Seventeenth Embodiment

Figure 65:
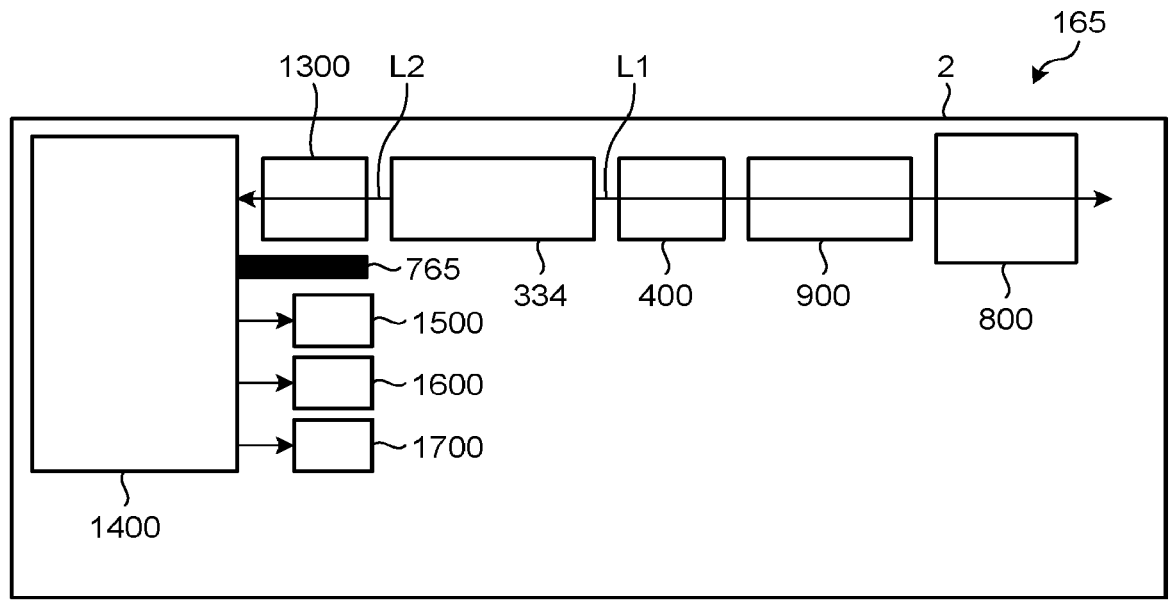
FIG. 65 is a plan view schematically illustrating the configuration of an optical module according to a seventeenth embodiment.

Subsequently, a seventeenth embodiment will be described below. FIG. 65 is a plan view schematically illustrating the configuration of an optical module according to the seventeenth embodiment. This optical module 165 illustrated in FIG. 65 includes a shielding portion 765 in place of the shielding portion 761 in the sixteenth embodiment described above.

The shielding portion 765 prevents stray light generated through reflection or scattering in the base unit 2 from being incident on the light receiving element 600. The shielding portion 765 is formed of any of a light reflecting body that reflects stray light, a light scattering body that scatters stray light, and a light absorbing body that absorbs light. The shielding portion 765 is disposed through application on a side surface of the wavelength detecting element 1400. Specifically, the shielding portion 765 is disposed through formation into a wall shape by applying and upraising resin on a side surface of the wavelength detecting element 1400 so that the coupling lens 1300 and the light receiving element 1500 are optically shielded from each other.

According to the seventeenth embodiment described above, since the shielding portion 765 is disposed through formation into a wall shape by applying and upraising resin on a side surface of the wavelength detecting element 1400 so that the coupling lens 1300 and the light receiving element 1500 are optically shielded from each other, it is possible to prevent, with a simple configuration, stray light from being incident on the light receiving element 1500, the light receiving element 1600, and the light receiving element 1700.

First Modification of Seventeenth Embodiment

Figure 66:
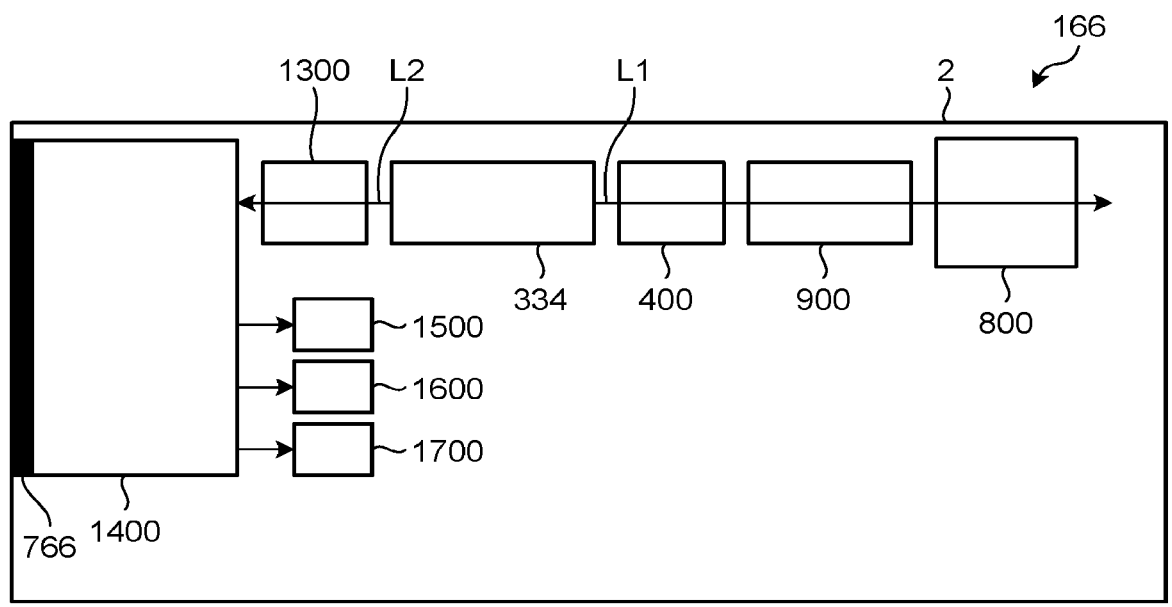
FIG. 66 is a plan view schematically illustrating the configuration of an optical module according to a first modification of the seventeenth embodiment.

Subsequently, a first modification of the seventeenth embodiment will be described below. FIG. 66 is a plan view schematically illustrating the configuration of an optical module according to the first modification of the seventeenth embodiment. This optical module 166 illustrated in FIG. 66 includes a shielding portion 766 in place of the shielding portion 765 in the seventeenth embodiment described above.

The shielding portion 766 is formed through application on a side surface of the wavelength detecting element 1400. Specifically, the shielding portion 766 is disposed by applying resin on a side surface opposite to the incident edge at which the laser beam L2 is incident. The shielding portion 766 may be disposed through formation by applying resin on a side surface parallel to the incident edge at which the laser beam L2 is incident.

According to the first modification of the seventeenth embodiment described above, since the shielding portion 766 is disposed by applying resin on a side surface opposite to the incident edge at which the laser beam L2 is incident, it is possible to prevent, with a simple configuration, stray light from being incident on the light receiving element 1500, the light receiving element 1600, and the light receiving element 1700.

Second Modification of Seventeenth Embodiment

Figure 67:
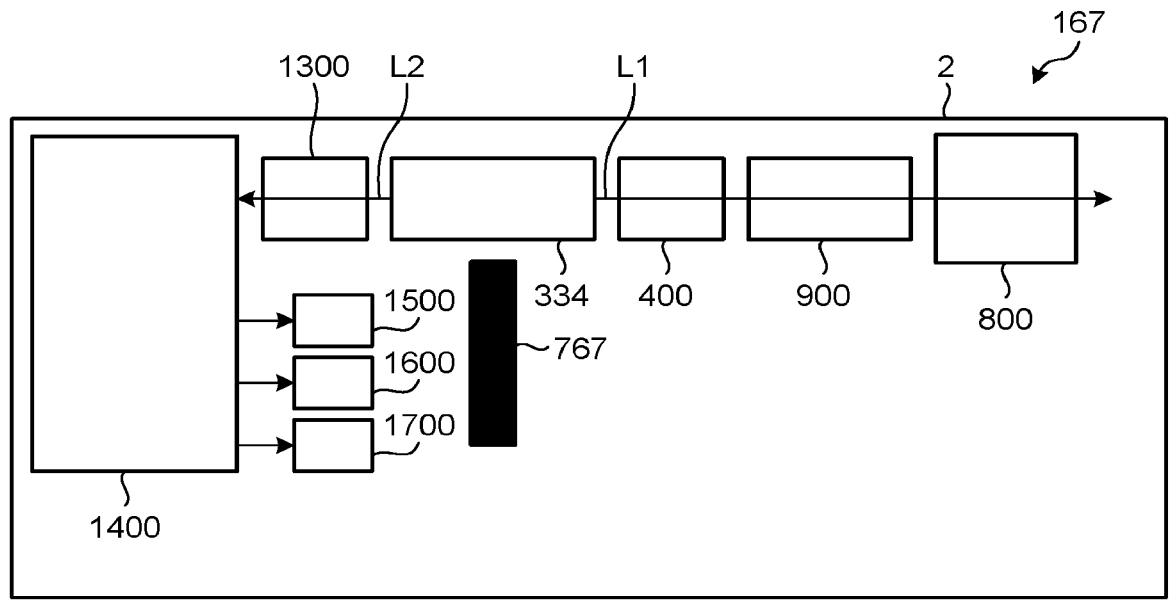
FIG. 67 is a plan view schematically illustrating the configuration of an optical module according to a second modification of the seventeenth embodiment.

Subsequently, a second modification of the seventeenth embodiment will be described below. FIG. 67 is a plan view schematically illustrating the configuration of an optical module according to the second modification of the seventeenth embodiment. This optical module 167 illustrated in FIG. 67 includes a shielding portion 767 in place of the shielding portion 765 in the seventeenth embodiment described above.

The shielding portion 767 is disposed through formation into a wall shape by applying and upraising resin at a position on the base unit 2 along a straight line connecting the lens 400 and each of the light receiving element 1500, the light receiving element 1600, and the light receiving element 1700.

According to the second modification of the seventeenth embodiment described above, since the shielding portion 767 is disposed through formation into a wall shape by applying and upraising resin at a position on the base unit 2 along a straight line connecting the lens 400 and each of the light receiving element 1500, the light receiving element 1600, and the light receiving element 1700, it is possible to prevent, with a simple configuration, stray light from being incident on the light receiving element 1500, the light receiving element 1600, and the light receiving element 1700.

Third Modification of Seventeenth Embodiment

Figure 68:
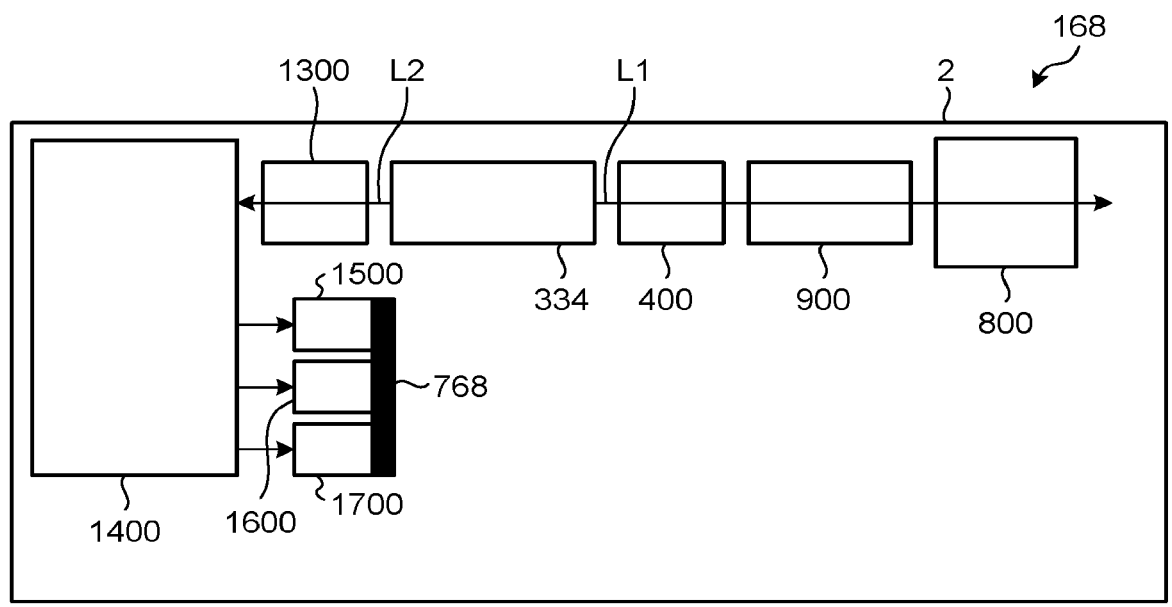
FIG. 68 is a plan view schematically illustrating the configuration of an optical module according to a third modification of the seventeenth embodiment.

Subsequently, a third modification of the seventeenth embodiment will be described below. FIG. 68 is a plan view schematically illustrating the configuration of an optical module according to the third modification of the seventeenth embodiment. This optical module 168 illustrated in FIG. 68 includes a shielding portion 768 in place of the shielding portion 765 in the seventeenth embodiment described above.

The shielding portion 768 is disposed through formation into a wall shape by applying resin on a side surface of each of the light receiving element 1500, the light receiving element 1600, and the light receiving element 1700, which is opposite to the light receiving surface thereof.

According to the third modification of the seventeenth embodiment described above, since the shielding portion 768 is disposed through formation into a wall shape by applying resin on a side surface of each of the light receiving element 1500, the light receiving element 1600, and the light receiving element 1700, which is opposite to the light receiving surface thereof, it is possible to prevent, with a simple configuration, stray light from being incident on the light receiving element 1500, the light receiving element 1600, and the light receiving element 1700.

Eighteenth Embodiment

Figure 69:
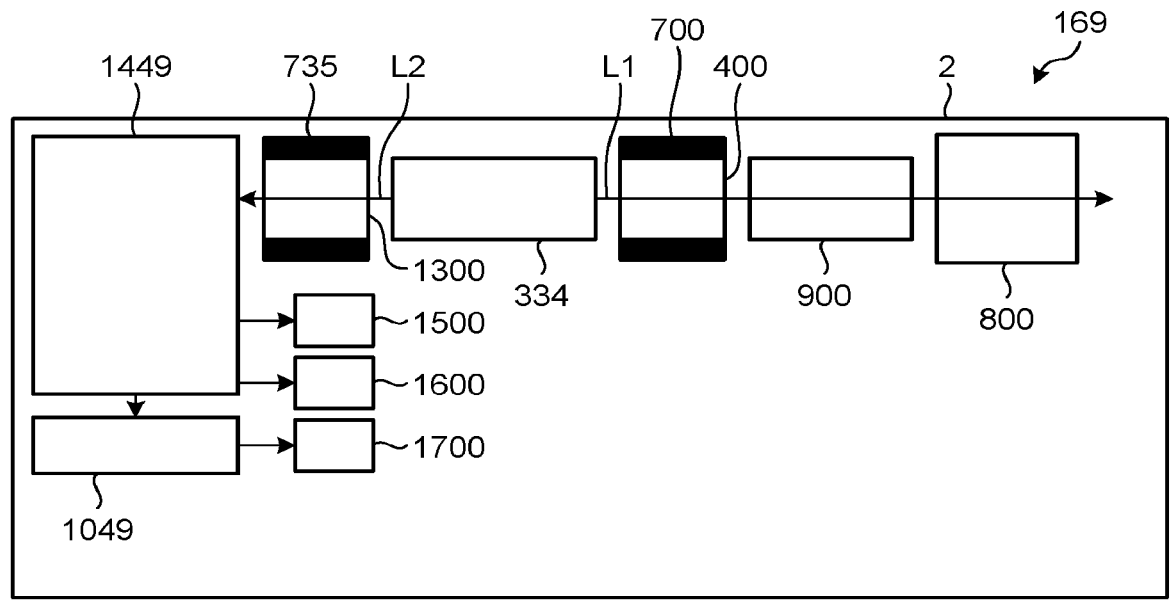
FIG. 69 is a plan view schematically illustrating the configuration of an optical module according to an eighteenth embodiment.

Subsequently, an eighteenth embodiment will be described below. FIG. 69 is a plan view schematically illustrating the configuration of an optical module according to the eighteenth embodiment. This optical module 169 illustrated in FIG. 69 includes a wavelength detecting element 1449 and an etalon filter 1049 in place of the wavelength detecting element 1400 in the third modification of the sixteenth embodiment described above.

According to the eighteenth embodiment described above, it is possible to prevent, with a simple configuration, stray light from being incident on the light receiving element 1500, the light receiving element 1600, and the light receiving element 1700.

First Modification of Eighteenth Embodiment

Figure 70:
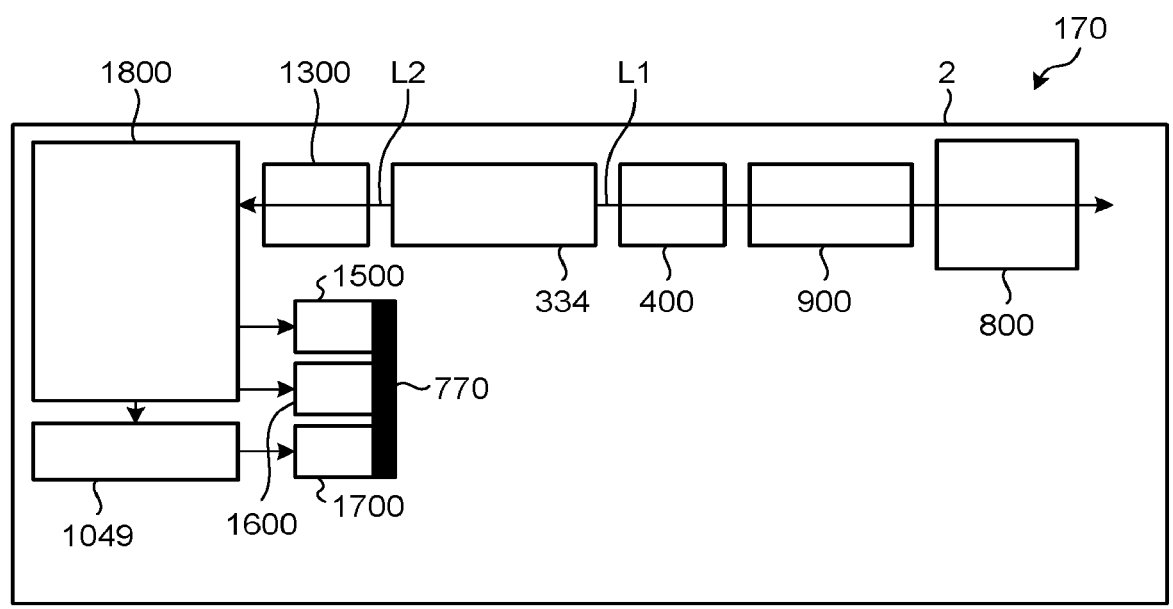
FIG. 70 is a diagram schematically illustrating the configuration of an optical module according to a first modification of the eighteenth embodiment.

Subsequently, a first modification of the eighteenth embodiment will be described below. FIG. 70 is a diagram schematically illustrating the configuration of an optical module according to the first modification of the eighteenth embodiment. This optical module 170 illustrated in FIG. 70 includes the wavelength detecting filter 1800 in place of the wavelength detecting element 1449 in the eighteenth embodiment described above. In addition, the optical module 170 includes a shielding portion 770 in place of the shielding portion 700 and the shielding portion 735 described above.

The shielding portion 770 is disposed by applying resin on a side surface of each of the light receiving element 1500, the light receiving element 1600, and the light receiving element 1700, which is opposite to the light receiving surface thereof.

According to the first modification of the eighteenth embodiment described above, since the shielding portion 770 is disposed by applying resin on a side surface of each of the light receiving element 1500, the light receiving element 1600, and the light receiving element 1700, which is opposite to the light receiving surface thereof, it is possible to prevent, with a simple configuration, stray light from being incident on the light receiving element 1500, the light receiving element 1600, and the light receiving element 1700.

Second Modification of Eighteenth Embodiment

Figure 71:
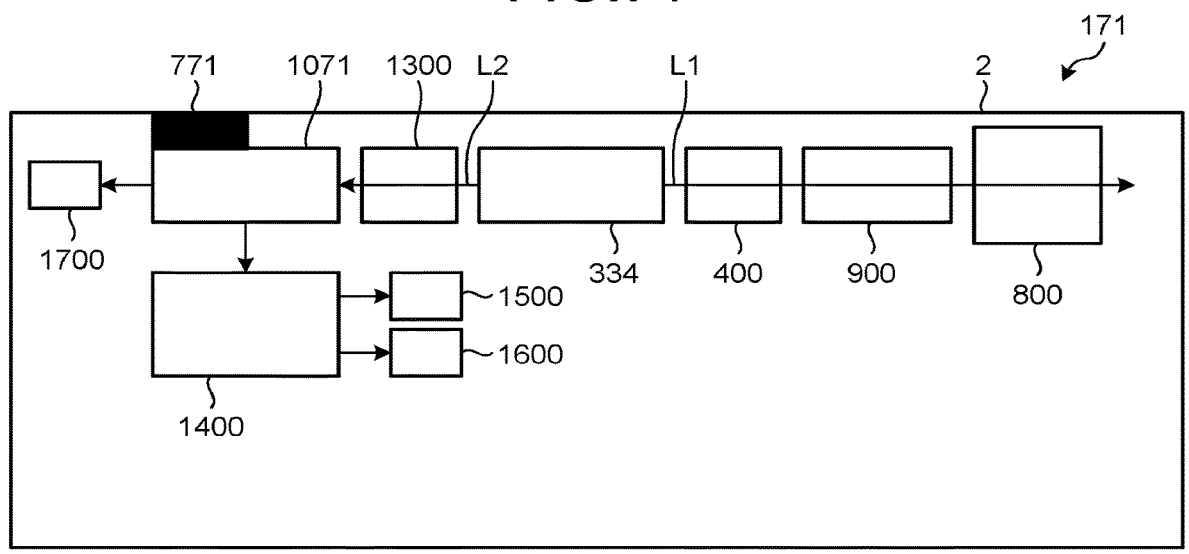
FIG. 71 is a diagram schematically illustrating the configuration of an optical module according to a second modification of the eighteenth embodiment.

Subsequently, a second modification of the eighteenth embodiment will be described below. FIG. 71 is a diagram schematically illustrating the configuration of an optical module according to the second modification of the eighteenth embodiment. This optical module 171 illustrated in FIG. 71 includes a shielding portion 771, an etalon filter 1071, and the wavelength detecting element 1400 in place of the shielding portion 700, the shielding portion 735, the wavelength detecting element 1449, and the etalon filter 1049 in the eighteenth embodiment described above.

The shielding portion 771 prevents stray light generated through reflection or scattering in the base unit 2 from being incident on the light receiving element 600. The shielding portion 771 is formed of any of a light reflecting body that reflects stray light, a light scattering body that scatters stray light, and a light absorbing body that absorbs light. The shielding portion 771 is disposed through application on a sidewall of the etalon filter 1071. The shielding portion 771 is disposed by applying resin on a sidewall of the etalon filter 1071 in the vicinity of the optical path of the laser beam L2.

The etalon filter 1071 transmits, to the light receiving element 1700, the laser beam L2 incident from the coupling lens 1300, and reflects part of the laser beam L2 to the wavelength detecting element 1400.

The wavelength detecting element 1400 causes part of the laser beam L2 to be incident on the light receiving element 1500, and the remaining part of the laser beam L2 to be incident on the light receiving element 1600.

Third Modification of Eighteenth Embodiment

Figure 72A:
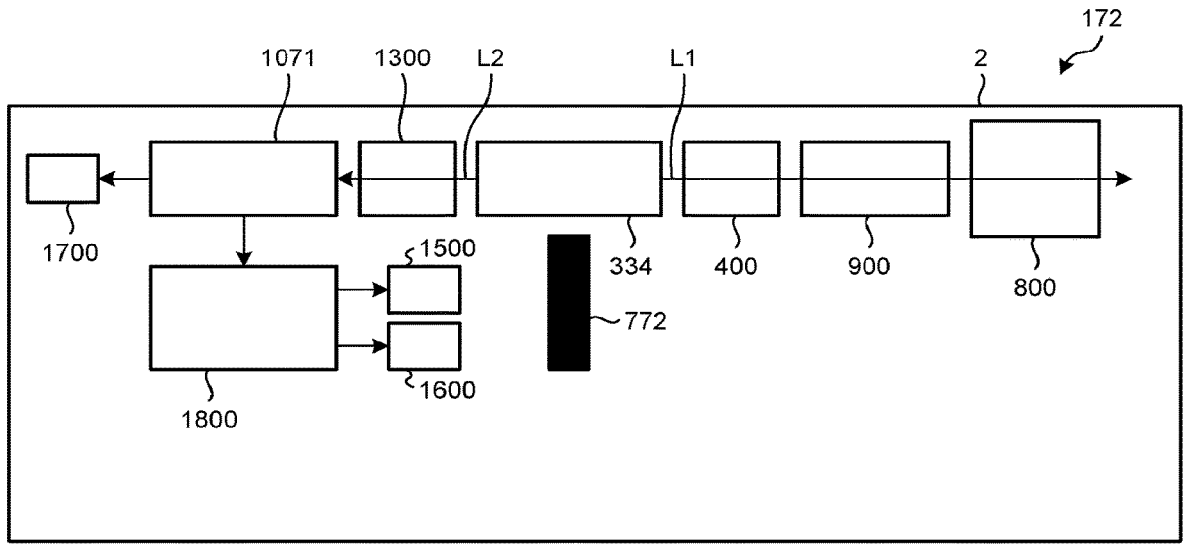
FIG. 72A is a plan view schematically illustrating the configuration of an optical module according to a third modification of the eighteenth embodiment.

Subsequently, a third modification of the eighteenth embodiment will be described below. FIG. 72A is a plan view schematically illustrating the configuration of an optical module according to the third modification of the eighteenth embodiment. This optical module 172 illustrated in FIG. 72A includes a shielding portion 772 and the wavelength detecting filter 1800 in place of the shielding portion 771 and the wavelength detecting element 1400 in the second modification of the eighteenth embodiment described above.

The shielding portion 772 prevents stray light generated through reflection or scattering in the base unit 2 from being incident on the light receiving element 600. The shielding portion 772 is formed of any of a light reflecting body that reflects stray light, a light scattering body that scatters stray light, and a light absorbing body that absorbs light. The shielding portion 772 is disposed through formation into a wall shape by applying and upraising resin at a position on a straight line connecting the lens 400 and each of the light receiving element 1500 and the light receiving element 1600.

According to the third modification of the eighteenth embodiment described above, since the shielding portion 772 is formed into a wall shape by applying and upraising resin at a position on a straight line connecting the lens 400 and each of the light receiving element 1500 and the light receiving element 1600, it is possible to prevent, with a simple configuration, stray light from being incident on the light receiving element 1500 and the light receiving element 1600.

Fourth Modification of Eighteenth Embodiment

Figure 72B:
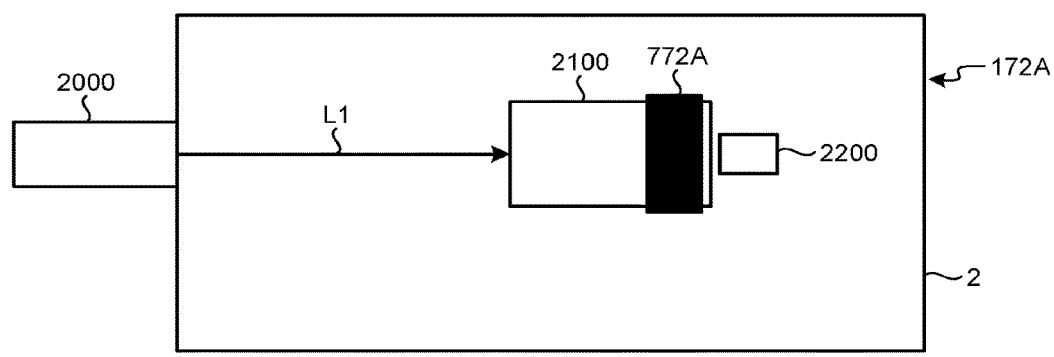
FIG. 72B is a plan view schematically illustrating the configuration of an optical module according to a fourth modification of the eighteenth embodiment.

Subsequently, a fourth modification of the eighteenth embodiment will be described below. FIG. 72B is a plan view schematically illustrating the configuration of an optical module according to the fourth modification of the eighteenth embodiment. This optical module 172A illustrated in FIG. 72B includes a waveguide element 2100, a light receiving element 2200, and a shielding portion 772A.

The shielding portion 772A is formed through application on an upper surface of the waveguide element 2100. Specifically, the shielding portion 772A is disposed by applying resin to the upper surface of the waveguide element 2100 opposite to an incident edge thereof at which a laser beam emitted from an external light source (not illustrated) through a fiber 2000 disposed outside the optical module 172A is incident.

According to the fourth modification of the eighteenth embodiment described above, since the shielding portion 772A is disposed by applying resin on the upper surface of the waveguide element 2100, which is opposite to the incident edge thereof at which a laser beam emitted from an external light source (not illustrated) through the fiber 2000 disposed outside the optical module 172A is incident, it is possible to prevent, with a simple configuration, stray light from being incident on the light receiving element 2200.

Fifth Modification of Eighteenth Embodiment

Figure 72C:
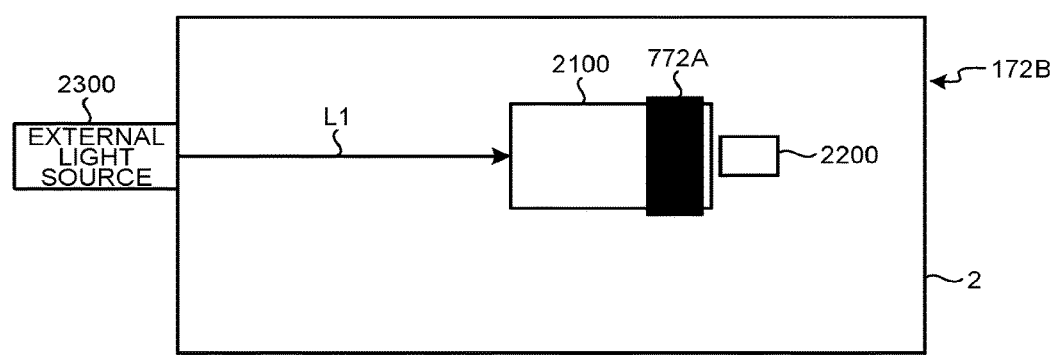
FIG. 72C is a plan view schematically illustrating the configuration of an optical module according to a fifth modification of the eighteenth embodiment.

Subsequently, a fifth modification of the eighteenth embodiment will be described below. FIG. 72C is a plan view schematically illustrating the configuration of an optical module according to the fourth modification of the eighteenth embodiment. This optical module 172B illustrated in FIG. 72C includes the waveguide element 2100, the light receiving element 2200, and the shielding portion 772A.

The shielding portion 772A is formed through application on the upper surface of the waveguide element 2100. Specifically, the shielding portion 772A is disposed by applying resin on the upper surface of the waveguide element 2100, which is opposite to the incident edge thereof at which a laser beam emitted from an external light source (not illustrated) through the fiber 2000 disposed outside the optical module 172B is incident.

According to the fifth modification of the eighteenth embodiment described above, similarly to the fourth modification of the eighteenth embodiment described above, since the shielding portion 772A is disposed by applying resin to the upper surface of the waveguide element 2100, which is opposite to the incident edge thereof at which a laser beam emitted from an external light source 2300 disposed outside the optical module 172B is incident, it is possible to prevent, with a simple configuration, stray light from being incident on the light receiving element 2200.

Nineteenth Embodiment

Figure 73:
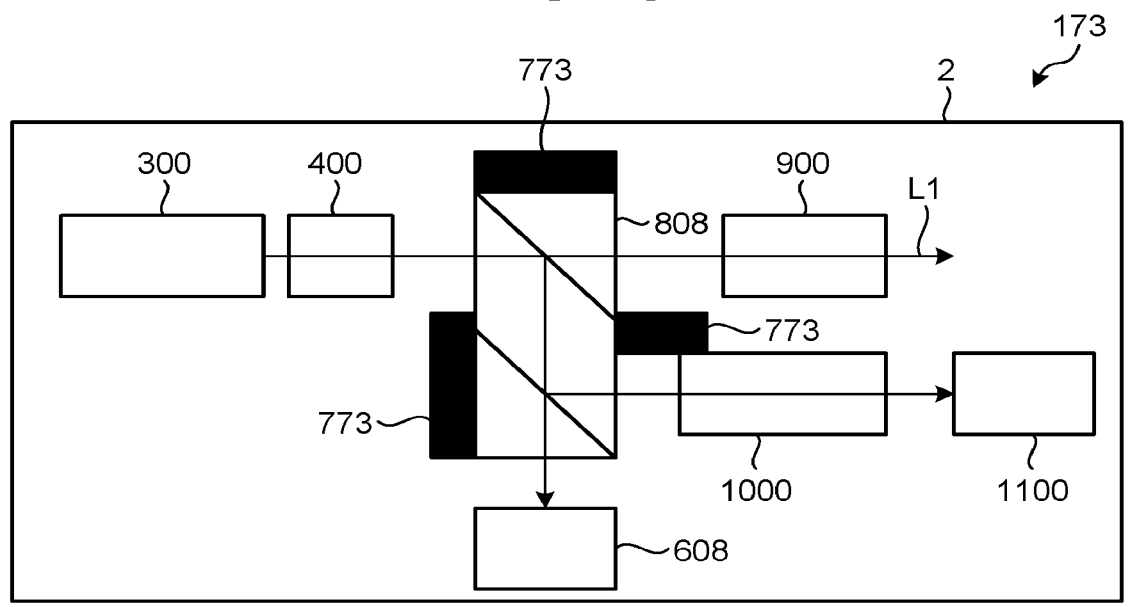
FIG. 73 is a plan view schematically illustrating the configuration of an optical module according to a nineteenth embodiment.

Subsequently, a nineteenth embodiment will be described below. FIG. 73 is a plan view schematically illustrating the configuration of an optical module according to the nineteenth embodiment. This optical module 173 illustrated in FIG. 73 includes a shielding portion 773 in place of the shielding portion 700 of the optical module 108 according to the third embodiment described above.

Figure 74:
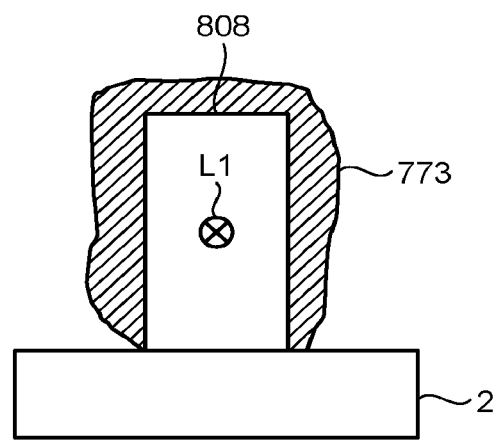
FIG. 74 is a diagram schematically illustrating a cross section of a shielding portion of the optical module according to the nineteenth embodiment.

The shielding portion 773 is formed by applying resin on or dyeing, with black pigment, edges of the beam splitter 808 except for an emission edge of the beam splitter 808, through which the beam splitter 808 emits the laser beam L1, and an incident edge of the beam splitter 808, through which the laser beam L1 is incident from the lens 400. Specifically, as illustrated in FIG. 74, the shielding portion 773 is disposed by applying resin on edges of the beam splitter 808 except for the optical path of the laser beam L1 or is disposed through formation by coating the edges with black pigment or paint. In this case, the shielding portion 773 is formed through black coating by providing electroless nickel-plated processing or raydent processing on edges of the beam splitter 808 except for the emission edge of the beam splitter 808, through which the beam splitter 808 emits the laser beam L1, or the incident edge of the beam splitter 808, through which the laser beam L1 is incident from the lens 400.

According to the nineteenth embodiment described above, since the shielding portion 773 is disposed through resin application except for the optical path of the laser beam L1 or is disposed through formation by coating the edges with black pigment or paint, it is possible to prevent, with a simple configuration, stray light from being incident on the light receiving element 608 and the light receiving element 1100.

First Modification of Nineteenth Embodiment

Figure 75:
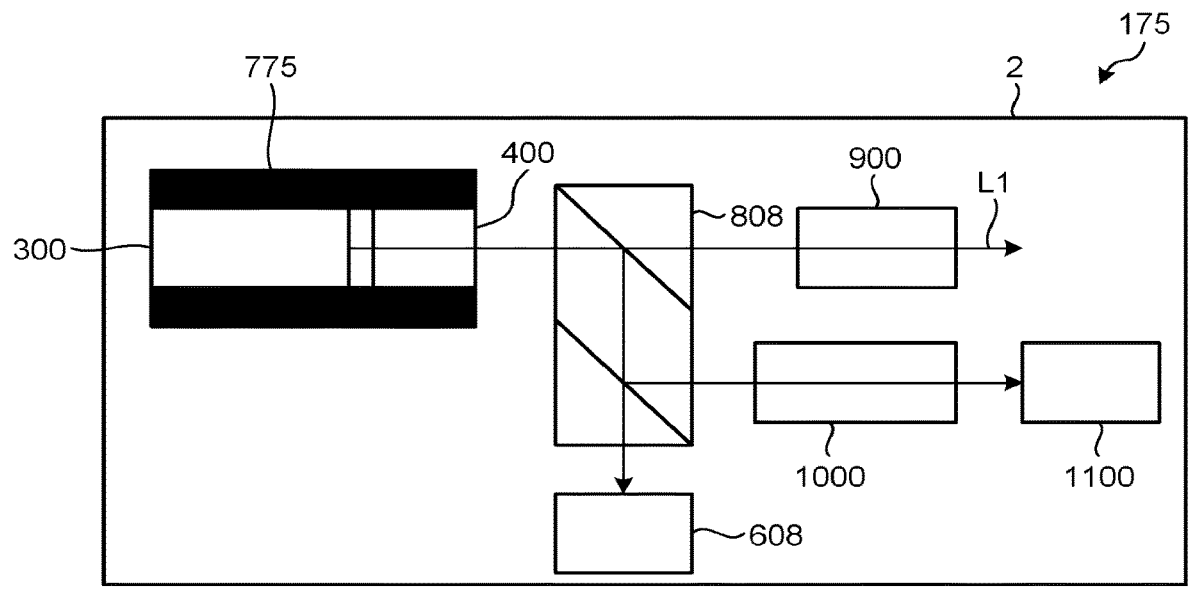
FIG. 75 is a plan view schematically illustrating the configuration of an optical module according to a first modification of the nineteenth embodiment.

Subsequently, a first modification of the nineteenth embodiment will be described below. FIG. 75 is a plan view schematically illustrating the configuration of an optical module according to the first modification of the nineteenth embodiment. This optical module 175 illustrated in FIG. 75 includes a shielding portion 775 in place of the shielding portion 773 in the nineteenth embodiment described above.

The shielding portion 775 is formed through application on a side surface of each of the light emitting element 300 and the lens 400. Specifically, the shielding portion 775 is disposed through application on the light emitting element 300 and the lens 400 except for the optical path of the laser beam L1.

According to the first modification of the nineteenth embodiment described above, since the shielding portion 775 is disposed through application on the light emitting element 300 and the lens 400 except for the optical path of the laser beam L1, it is possible to shield, with a simple configuration, stray light generated at any of the light emitting element 300 and the lens 400.

Twentieth Embodiment

Figure 76:
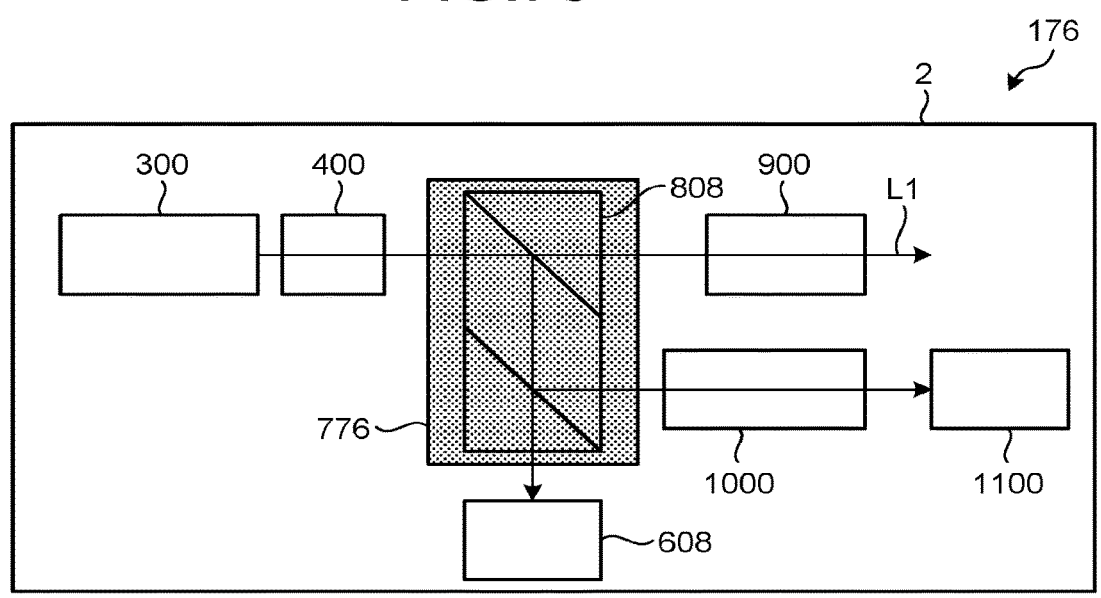
FIG. 76 is a plan view schematically illustrating the configuration of an optical module according to a twentieth embodiment.

Subsequently, a twentieth embodiment will be described below. FIG. 76 is a plan view schematically illustrating the configuration of an optical module according to the twentieth embodiment. This optical module 176 illustrated in FIG. 76 includes a shielding portion 776 in place of the shielding portion 700 of the optical module 108 according to the third embodiment described above.

The shielding portion 776 is formed by covering, with resin, the beam splitter 808 except for the emission edge of the beam splitter 808, through which the beam splitter 808 emits the laser beam L1, or the incident edge of the beam splitter 808, through which the laser beam L1 is incident from the lens 400. Specifically, the shielding portion 776 is disposed through formation by covering, with resin, the beam splitter 808 except for the optical path of the laser beam L1.

According to the twentieth embodiment described above, since the shielding portion 776 is disposed through formation by covering, with resin, the beam splitter 808 except for the emission edge of the beam splitter 808, through which the beam splitter 808 emits the laser beam L1, or the incident edge of the beam splitter 808, through which the laser beam L1 is incident from the lens 400, it is possible to prevent, with a simple configuration, stray light from being incident on the light receiving element 608 and the light receiving element 1100.

First Modification of Twentieth Embodiment

Figure 77:
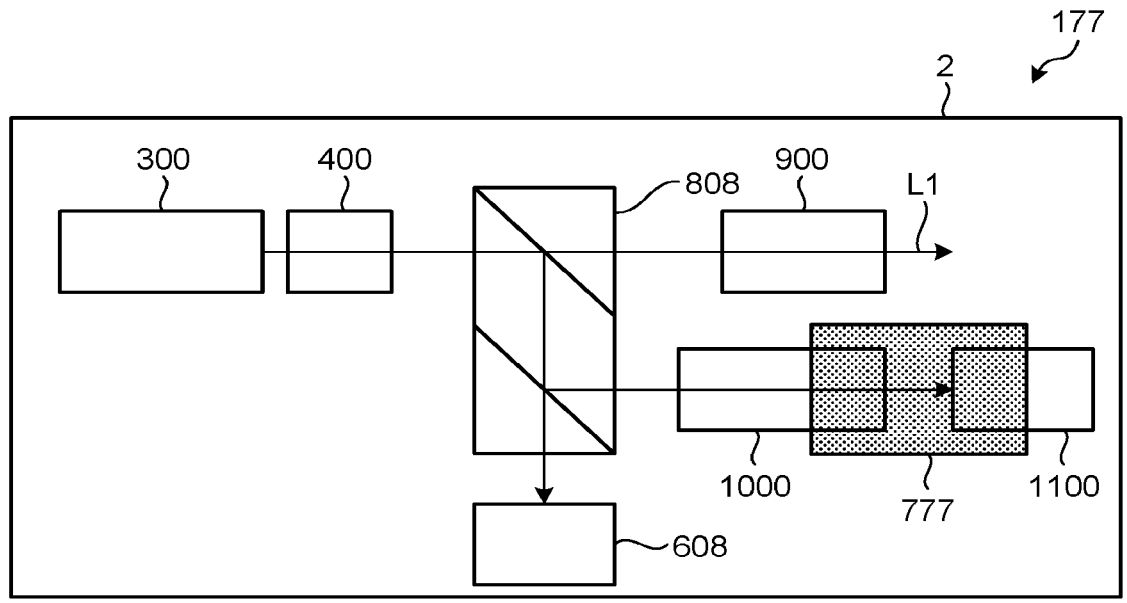
FIG. 77 is a plan view schematically illustrating the configuration of an optical module according to a first modification of the twentieth embodiment.

Subsequently, a first modification of the twentieth embodiment will be described below. FIG. 77 is a plan view schematically illustrating the configuration of an optical module according to the first modification of the twentieth embodiment. This optical module 177 illustrated in FIG. 77 includes a shielding portion 777 in place of the shielding portion 776 in the twentieth embodiment described above.

The shielding portion 777 is disposed by forming a resin shielding component into a cylindrical shape to cover the optical path of the laser beam L1 in the interval between the etalon filter 1000 and the light receiving element 1100.

According to the first modification of the twentieth embodiment described above, since the shielding portion 777 is disposed through formation into a cylindrical shape to cover the optical path of the laser beam L1 in the interval between the etalon filter 1000 and the light receiving element 1100, it is possible to prevent, with a simple configuration, stray light from being incident on the light receiving element 1100.

Second Modification of Twentieth Embodiment

Figure 78:
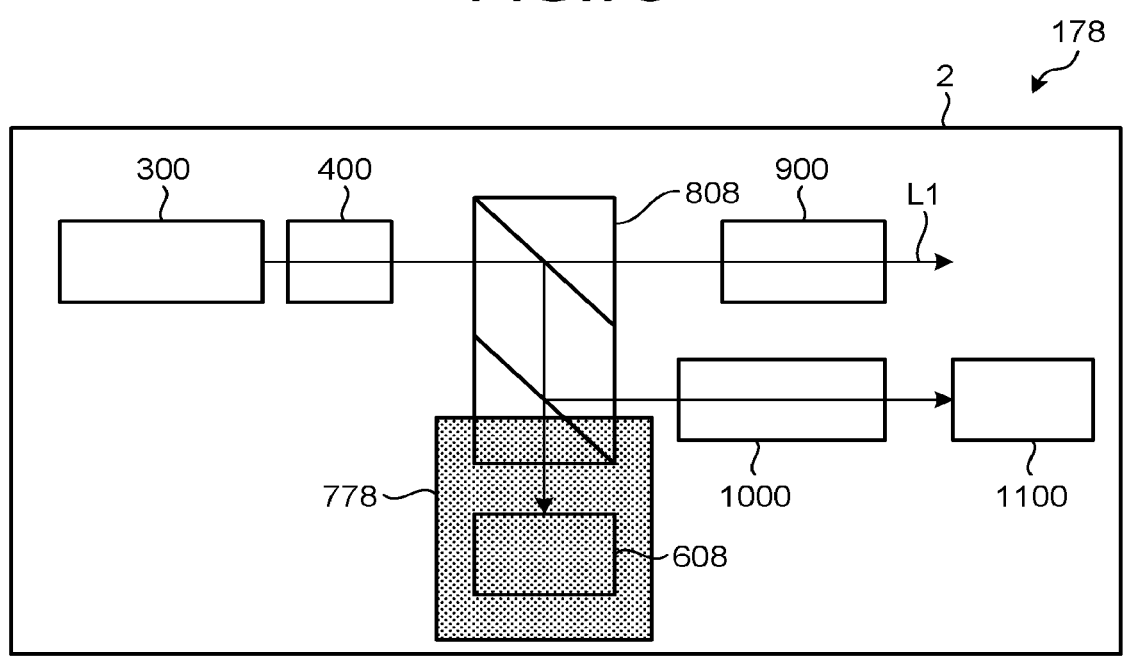
FIG. 78 is a plan view schematically illustrating the configuration of an optical module according to a second modification of the twentieth embodiment.

Subsequently, a second modification of the twentieth embodiment will be described below. FIG. 78 is a plan view schematically illustrating the configuration of an optical module according to the second modification of the twentieth embodiment. This optical module 178 illustrated in FIG. 78 includes a shielding portion 778 in place of the shielding portion 776 in the twentieth embodiment described above.

Figure 79:
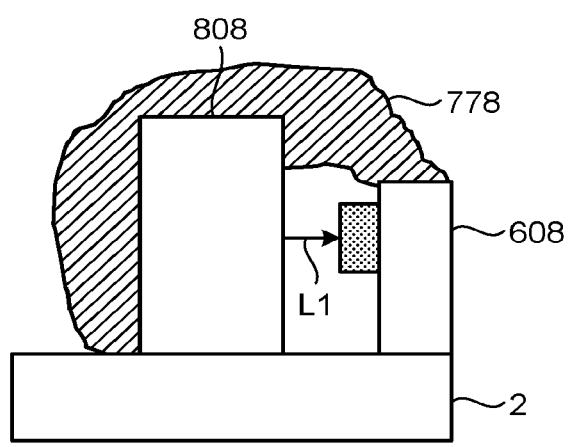
FIG. 79 is a diagram schematically illustrating a cross section of a shielding portion of the optical module according to the second modification of the twentieth embodiment.

The shielding portion 778 is disposed by forming a resin shielding component into a cylindrical shape to cover the optical path of the laser beam L1 in the interval between the laser beam L1 emission edge of the beam splitter 808 and the light receiving surface of the light receiving element 608. Specifically, as illustrated in FIG. 79, the shielding portion 778 is disposed by forming a resin shielding component into a cylindrical shape to cover the optical path of the laser beam L1 in the interval between the laser beam L1 emission edge of the beam splitter 808 and the light receiving surface of the light receiving element 608. Specifically, the shielding portion 778 is disposed through formation into a cylindrical shape to cover the surface of the beam splitter 808 except for the optical path of the laser beam L1.

According to the second modification of the twentieth embodiment described above, since the shielding portion 778 is disposed through formation into a cylindrical shape to cover the optical path of the laser beam L1 in the interval between the laser beam L1 emission edge of the beam splitter 808 and the light receiving surface of the light receiving element 608, it is possible to prevent, with a simple configuration, stray light from being incident on the light receiving element 608.

Third Modification of Twentieth Embodiment

Figure 80A:
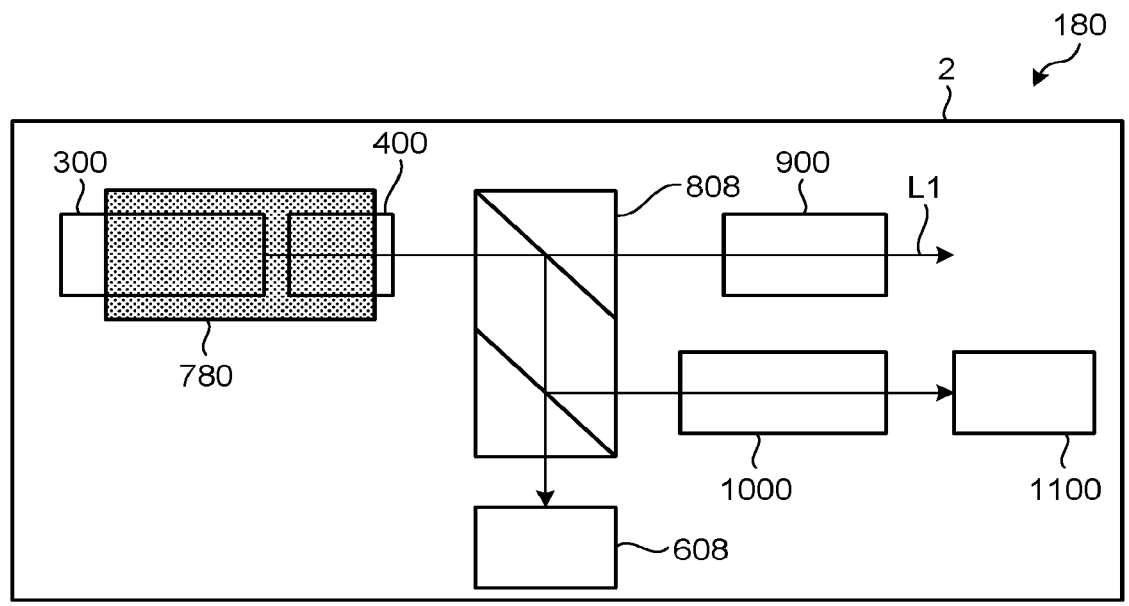
FIG. 80A is a plan view schematically illustrating the configuration of an optical module according to a third modification of the twentieth embodiment.

Subsequently, a third modification of the twentieth embodiment will be described below. FIG. 80A is a plan view schematically illustrating the configuration of an optical module according to the third modification of the twentieth embodiment. This optical module 180 illustrated in FIG. 80A includes a shielding portion 780 in place of the shielding portion 776 in the twentieth embodiment described above.

The shielding portion 780 is disposed by forming a resin shielding component into a cylindrical shape to cover the optical path of the laser beam L1 in the interval between the light emitting element 300 and the lens 400.

According to the third modification of the twentieth embodiment described above, since the shielding portion 780 is disposed through formation into a cylindrical shape to cover the optical path of the laser beam L1 in the interval between the light emitting element 300 and the lens 400, it is possible to prevent, with a simple configuration, stray light emitted from the light emitting element 300 and the lens 400.

Fourth Modification of Twentieth Embodiment

Figure 80B:
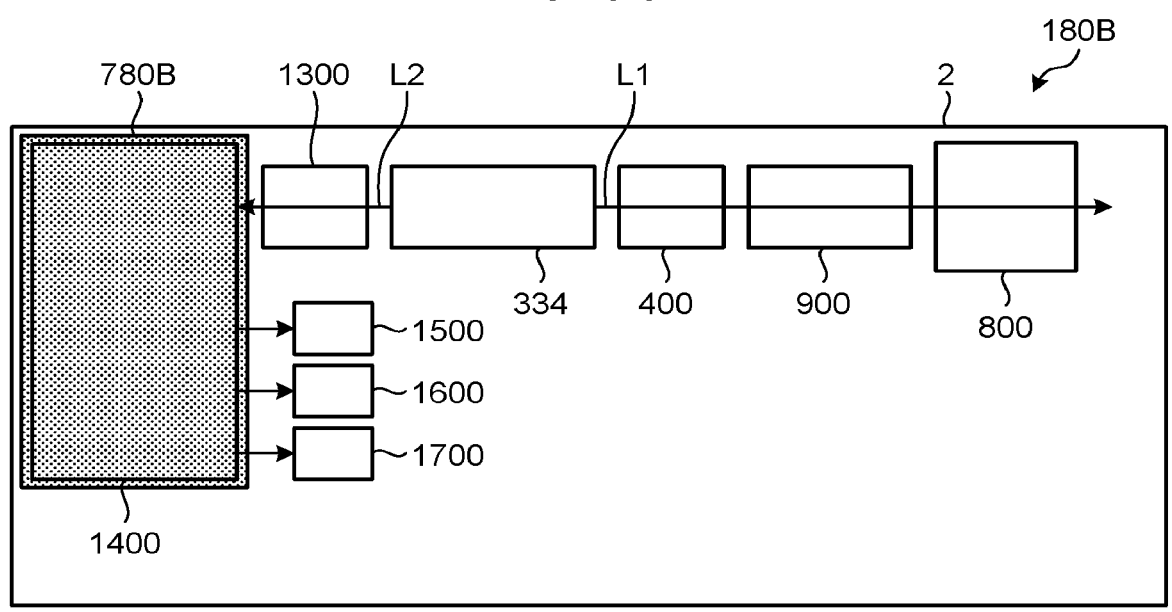
FIG. 80B is a plan view schematically illustrating the configuration of an optical module according to a fourth modification of the twentieth embodiment.

Subsequently, a fourth modification of the twentieth embodiment will be described below. FIG. 80B is a plan view schematically illustrating the configuration of an optical module according to the fourth modification of the twentieth embodiment. In this optical module 180B illustrated in FIG. 80B, the lens 400, the optical isolator 900, and the beam splitter 800 are disposed in the base unit 2 in the stated order in the emission direction in which the light emitting element 334 emits the laser beam L1. In addition, in the optical module 180B, the coupling lens 1300, the wavelength detecting element 1400, and the light receiving elements (the light receiving element 1500, the light receiving element 1600, and the light receiving element 1700) are disposed in the base unit 2 in the emission direction in which the light emitting element 334 emits the laser beam L2. The optical module 180B also includes a shielding portion 780B.

The shielding portion 780B is disposed through formation by covering, with resin, the wavelength detecting element 1400 except for an incident edge of the wavelength detecting element 1400, through which the laser beam L2 from the light emitting element 334 is incident, and an emission edge of the wavelength detecting element 1400, through which the wavelength detecting element 1400 emits the laser beam. Specifically, the shielding portion 780B is disposed through formation by covering, with resin, the wavelength detecting element 1400 except for the optical path of the laser beam L2.

According to the fourth modification of the twentieth embodiment described above, since the shielding portion 780B is disposed through formation by covering, with resin, the wavelength detecting element 1400 except for the incident edge of the wavelength detecting element 1400, at which the laser beam L2 from the light emitting element 334 is incident, and the emission edge of the wavelength detecting element 1400, through which the wavelength detecting element 1400 emits the laser beam, it is possible to prevent, with a simple configuration, stray light from being incident on the light receiving element 1500, the light receiving element 1600, and the light receiving element 1700.

Fifth Modification of Twentieth Embodiment

Figure 80C:
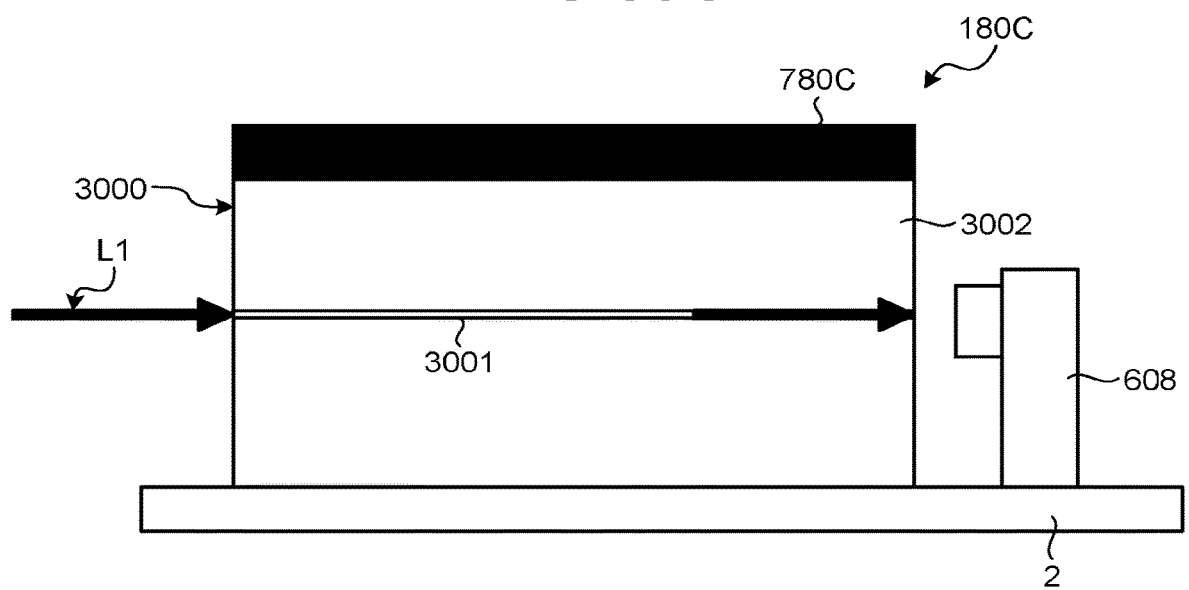
FIG. 80C is a plan view schematically illustrating the configuration of an optical module according to a fifth modification of the twentieth embodiment.

Subsequently, a fifth modification of the twentieth embodiment will be described below. FIG. 80C is a side view schematically illustrating the configuration of an optical module according to the fifth modification of the twentieth embodiment. This optical module 180C illustrated in FIG. 80C includes a waveguide element 3000, the light receiving element 608, and a shielding portion 780C.

The waveguide element 3000 includes a waveguide 3001 and a clad 3002. The waveguide 3001 emits, to the light receiving element 608, incident light from the outside.

The shielding portion 780C is disposed through formation on the entire upper surface of the waveguide element 3000 to cover the entire upper surface of the waveguide element 3000.

Figure 80D:
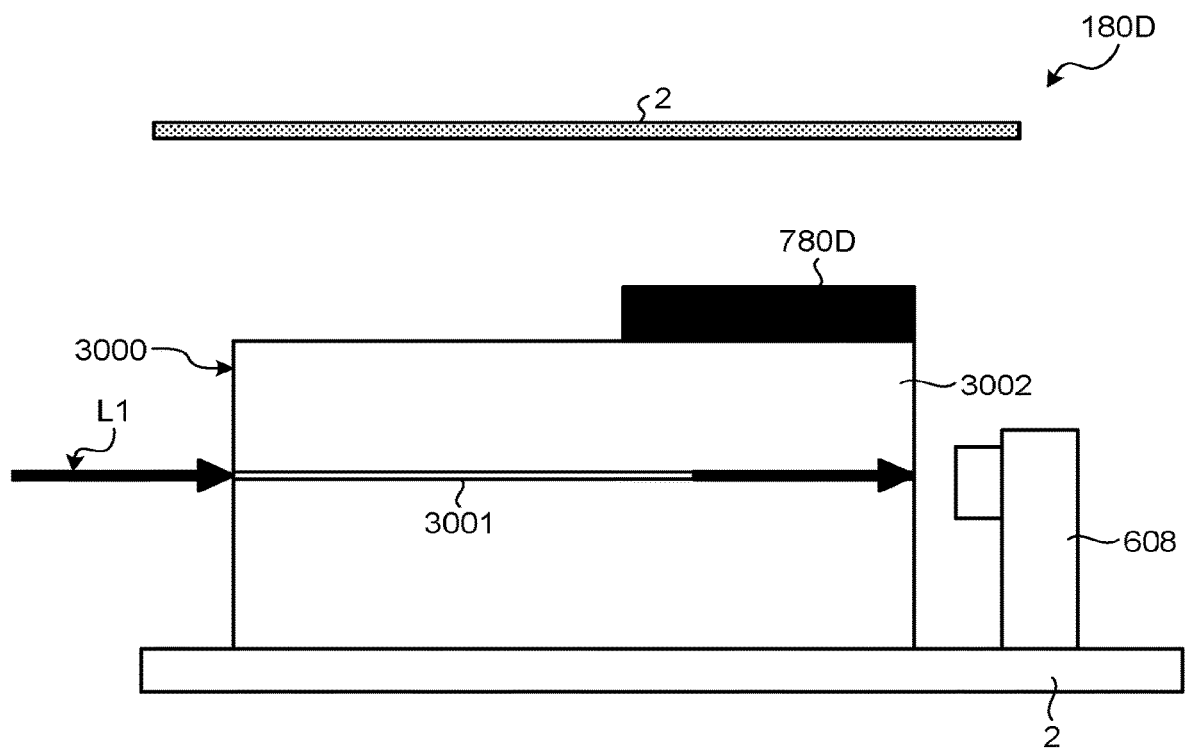
FIG. 80D is a plan view schematically illustrating the configuration of another optical module according to the fifth modification of the twentieth embodiment.

The optical module 180C thus configured can prevent a case where incident light that has not been coupled with the waveguide 3001 travels in the clad 3002 to become stray light, and a case where, for example, light reflected in the optical module 180C enters the waveguide 3001 to become stray light. In addition, light traveling in the clad 3002 is reflected at the interface between the clad 3002 and air and travels without going out of the waveguide element 3000, and thus the light is not reflected but is absorbed by the shielding portion 780C that is absorptive and provided to the waveguide element 3000, or the light scatters and attenuates before reaching the light receiving element 608. Alternatively, a shielding portion 780D may be formed to cover part of the waveguide element 3000 as in an optical module 180D illustrated in FIG. 80D.

According to the fifth modification of the twentieth embodiment described above, since the shielding portion 780C is disposed through formation on the entire upper surface of the waveguide element 3000 to cover the entire upper surface of the waveguide element 3000, it is possible to prevent the case where incident light that has not been coupled with the waveguide 3001 travels in the clad 3002 to become stray light, and prevent, for example, the case where light reflected in the optical module 780C enters the waveguide 3001 to become stray light.

Twenty-First Embodiment

Figure 81:
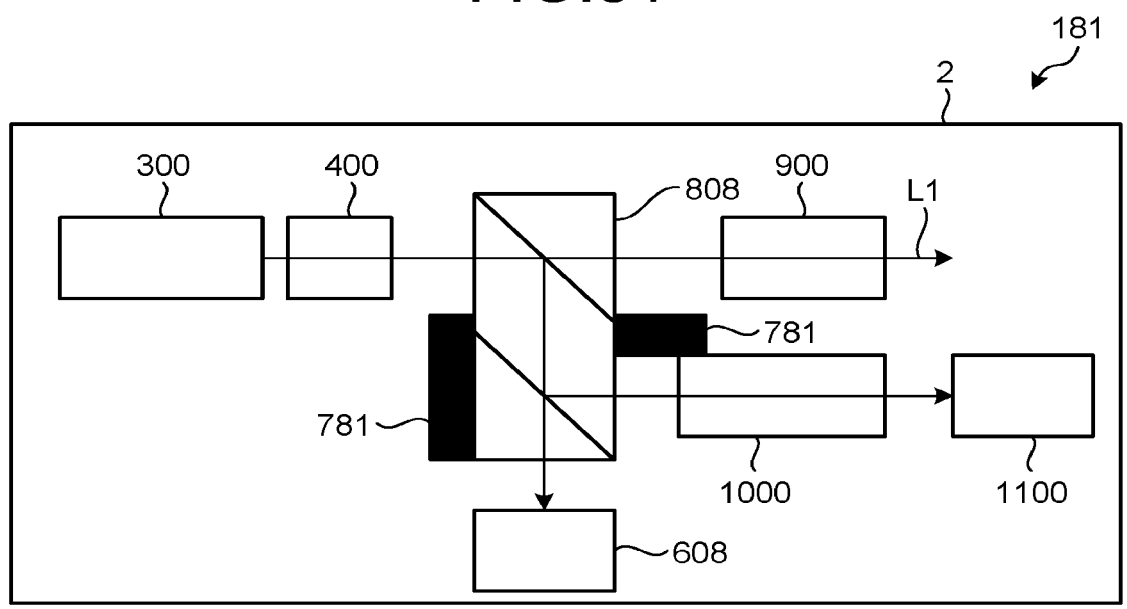
FIG. 81 is a plan view schematically illustrating the configuration of an optical module according to a twenty-first embodiment.

Subsequently, a twenty-first embodiment will be described below. FIG. 81 is a plan view schematically illustrating the configuration of an optical module according to the twenty-first embodiment. This optical module 181 illustrated in FIG. 81 includes a shielding portion 781 in place of the shielding portion 700 of the optical module 108 according to the third embodiment described above.

Figure 82:
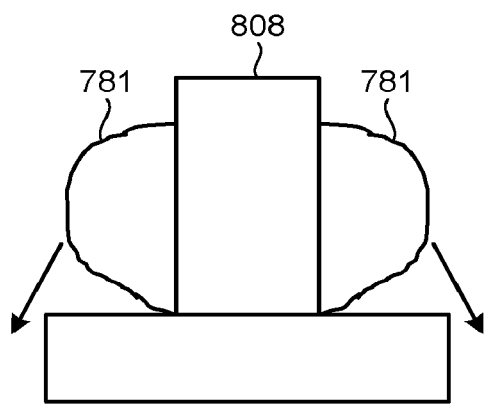
FIG. 82 is a diagram schematically illustrating a cross section of a shielding portion of the optical module according to the twenty-first embodiment.

The shielding portion 781 is formed by applying resin on a side surface of the beam splitter 808 on the path of stray light emitted from the light emitting element 300. In this case, as illustrated in FIG. 82, the shielding portion 781 is disposed through application on both edges of the side surface of the beam splitter 808. Accordingly, it is possible to prevent the beam splitter 808 from becoming unbalanced on one side.

According to the twenty-first embodiment described above, since the shielding portion 781 is disposed by applying resin on a side surface of the beam splitter 808 on the path of stray light emitted from the light emitting element 300, it is possible to prevent, with a simple configuration, stray light from being incident on the light receiving element 608.

First Modification of Twenty-First Embodiment

Figure 83:
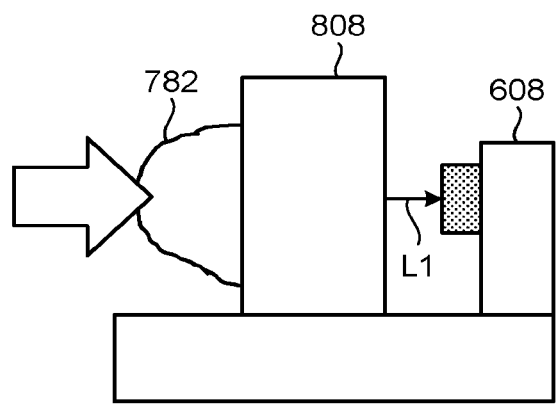
FIG. 83 is a diagram schematically illustrating a cross section of a shielding portion of an optical module according to a first modification of the twenty-first embodiment.

In the twenty-first embodiment, the shielding portion 781 is formed through application in contact with the base unit 2 but may be formed through application on the beam splitter 808 not in contact with the base unit 2 as in a shielding portion 782 illustrated in FIG. 83.

Second Modification of Twenty-First Embodiment

Figure 84:
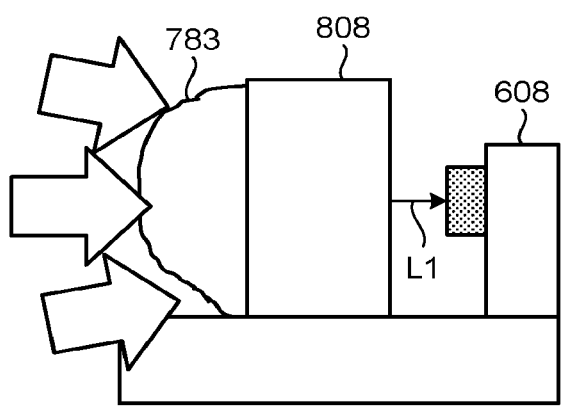
FIG. 84 is a diagram schematically illustrating a cross section of a shielding portion of an optical module according to a second modification of the twenty-first embodiment.

In the twenty-first embodiment, the entire side surface of the beam splitter 808 may be formed through resin application as in a shielding portion 783 illustrated in FIG. 84.

Twenty-Second Embodiment

Figure 85:
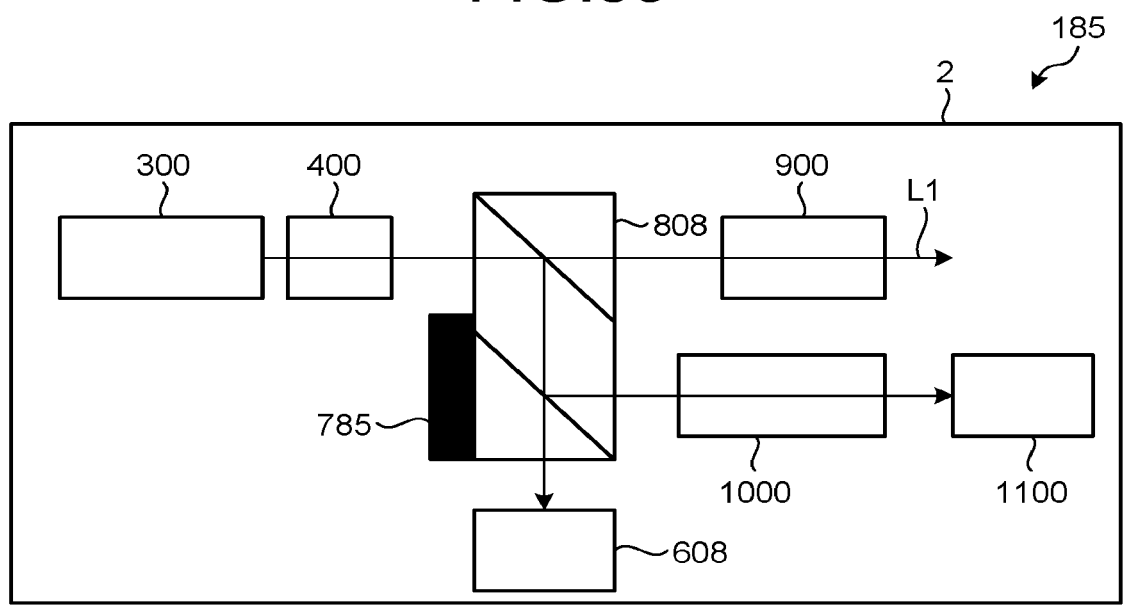
FIG. 85 is a plan view schematically illustrating the configuration of an optical module according to a twenty-second embodiment.

Subsequently, a twenty-second embodiment will be described below. FIG. 85 is a plan view schematically illustrating the configuration of an optical module according to the twenty-second embodiment. This optical module 185 illustrated in FIG. 85 includes a shielding portion 785 in place of the shielding portion 700 of the optical module 108 according to the third embodiment described above.

Figure 86:
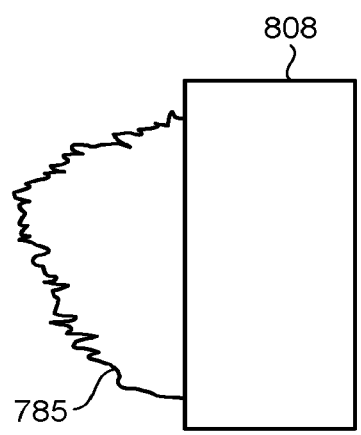
FIG. 86 is a diagram schematically illustrating a cross section of a shielding portion of the optical module according to the twenty-second embodiment.

The shielding portion 785 is disposed by applying resin on a side surface of the beam splitter 808 on the optical path between the light emitting element 300 and the beam splitter 808. The resin preferably contains filler particles. In this case, the size of each filler particle is 0.1 to 500 µm. Accordingly, it is possible to prevent stray light from being incident. Moreover, since the filler particles are added, irregularities are formed on the surface of the shielding portion 785 as illustrated in FIG. 86 in some cases. In this case, scattering at the surface irregularities can further prevent stray light from being incident. The surface irregularities are adjustable with the size of each filler particle.

According to the twenty-second embodiment described above, since the shielding portion 785 is disposed through formation from resin with added filler particles, scattering at irregularities formed on a surface can further prevent stray light from being incident.

The shielding portion 785 is formed of resin in the twenty-second embodiment but is not limited thereto. Stray light may be shielded, for example, by performing metal coating processing of providing a metal coating film on the side surface of the beam splitter 808, or by performing coating processing of providing a dielectric multi-layered film. Naturally, mirrored processing may be performed on the side surface of the beam splitter 808 to form a reflection component. Alternatively, a light shielding seal or a laser protection sheet may be applied on the side surface of the beam splitter 808. Alternatively, AR coating processing or HR coating processing may be performed on the beam splitter 808. Alternatively, polishing processing may be performed on the side surface of the beam splitter 808 to form ground glass. Naturally, in the first to the twenty-first embodiments described above, any one or more of the metal coating processing, the coating processing, the mirrored processing, the application of a light shielding seal or a laser protection sheet, the AR coating processing, the HR coating processing, and the polishing processing described above may be performed on components and optical components positioned on the optical path of stray light.

Other Embodiments

In the first to the twenty-first embodiments described above, when a shielding portion is formed of resin with added filler particles, irregularities are formed on a surface of the shielding portion in some cases like the twenty-second embodiment described above. In such a case, scattering at the surface irregularities can further prevent stray light from being incident. Naturally, the surface irregularities are adjustable with the size of each filler particle.

Moreover, in Embodiments 1 to 22 described above, instead of using a laser beam emitted from a light emitting element in a module, a laser beam emitted from an external light source may be introduced into the module. In this case, the laser beam emitted from the external light source may be introduced into the module through a space or an optical fiber.

According to the present disclosure, such an effect that it is possible to prevent stray light with a simple structure can be exhibited.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An optical module, comprising:
an optical component;
a light receiving element configured to receive a laser beam through the optical component;
a package housing the optical component and the light receiving unit; and
a shielding portion that prevents stray light, which is generated by at least one of the laser beam and the laser beam after being emitted through the optical component and reflected or scattered in the package or at the optical component, from being incident on the light receiving element, wherein
the shielding portion is formed of a light reflecting body, a light scattering body, or a light absorbing body,
the shielding portion is made of resin used as a bonding agent to join the optical component,
the shielding portion is disposed by applying the resin on a side surface of the optical component except for the optical path of the laser beam,
the optical component includes at least one of a lens, a beam splitter, a mirror, an optical isolator, an etalon filter, a wavelength detecting filter, and a waveguide element, and
the side surface of the optical component is a surface that is parallel to a direction in which the laser beam propagates through the optical component.

2. The optical module according to claim 1, further comprising a light emitting element configured to emit the laser beam toward the optical component.

3. The optical module according to claim 1, wherein the laser beam is emitted from an external light source and is incident on the optical module.

4. The optical module according to claim 1, wherein the shielding portion is disposed on the side surface of the optical component.

5. The optical module according to claim 2, wherein
a plurality of the optical components are provided in the package, and
the shielding portion is disposed between the light receiving element and a first optical component disposed at a position closest to the light emitting element on an optical path of the laser beam emitted from the light emitting element among the optical components.

6. The optical module according to claim 5, wherein the first optical component is a lens.

7. The optical module according to claim 5, wherein the shielding portion is additionally disposed between the light receiving element and at least one optical component other than the first optical component among the optical components.

8. The optical module according to claim 1, wherein the shielding portion is formed by applying resin to cover the side surface of the optical component except for an optical path of the laser beam.

9. The optical module according to claim 1, wherein the light reflecting body is a metal coating film.

10. The optical module according to claim 1, wherein the light reflecting body is a dielectric multi-layered film.

11. The optical module according to claim 1, wherein the light reflecting body is a mirrored-processed reflection component.

12. The optical module according to claim 1, wherein the light scattering body or the light absorbing body is a light shielding resin.

13. The optical module according to claim 12, wherein the light shielding resin contains filler particles, and a size of each filler particle is 0.1 µm to 500 µm.

14. The optical module according to claim 1, wherein the optical module has a wavelength bandwidth of 900 nm to 1650 nm.

* * * * *